(12) United States Patent
Yu et al.

(10) Patent No.: US 10,177,078 B2
(45) Date of Patent: Jan. 8, 2019

(54) METHOD FOR FORMING CHIP PACKAGE STRUCTURE

(71) Applicant: Taiwan Semiconductor Manufacturing Co., Ltd., Hsinchu (TW)

(72) Inventors: Chen-Hua Yu, Hsinchu (TW); Kuo-Chung Yee, Taoyuan (TW); Chun-Hui Yu, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 11 days.

(21) Appl. No.: 15/372,918

(22) Filed: Dec. 8, 2016

(65) Prior Publication Data
US 2018/0151477 A1 May 31, 2018

Related U.S. Application Data

(60) Provisional application No. 62/427,061, filed on Nov. 28, 2016.

(51) Int. Cl.
| H01L 21/56 | (2006.01) |
| H01L 23/485 | (2006.01) |
| H01L 25/065 | (2006.01) |
| H01L 23/29 | (2006.01) |
| H01L 23/00 | (2006.01) |
| H01L 21/48 | (2006.01) |

(Continued)

(52) U.S. Cl.
CPC ........ *H01L 23/485* (2013.01); *H01L 21/4857* (2013.01); *H01L 21/56* (2013.01); *H01L 21/561* (2013.01); *H01L 21/6835* (2013.01); *H01L 23/293* (2013.01); *H01L 24/18* (2013.01); *H01L 24/32* (2013.01); *H01L 25/0652* (2013.01); *H01L 25/0657* (2013.01); H01L 21/568 (2013.01); H01L 23/3128 (2013.01); H01L 2221/68359 (2013.01); H01L 2221/68372 (2013.01); H01L 2224/16225 (2013.01); H01L 2224/18 (2013.01); H01L 2224/32145 (2013.01)

(58) Field of Classification Search
CPC ... H01L 21/561; H01L 21/563; H01L 21/568; H01L 24/33; H01L 24/27; H01L 24/97; H01L 2224/97; H01L 2224/32145; H01L 25/0652; H01L 23/485; H01L 23/3128; H01L 23/293; H01L 25/50; H01L 25/0655; H01L 25/0657

See application file for complete search history.

(56) References Cited

U.S. PATENT DOCUMENTS

| 7,084,513 B2 * | 8/2006 | Matsuki | H01L 23/3114 257/685 |
| 7,429,793 B2 * | 9/2008 | Yamagata | H01L 23/5389 257/678 |

(Continued)

*Primary Examiner* — Michael M Trinh
(74) *Attorney, Agent, or Firm* — Birch, Stewart, Kolasch & Birch, LLP

(57) ABSTRACT

Chip package structures and methods for forming the same are provided. The chip package structure includes a first protection layer and a first chip disposed over the first protection layer. The chip package structure further includes a first photosensitive layer surrounding the first chip and covering the first chip and a redistribution layer formed over the first photosensitive layer.

20 Claims, 51 Drawing Sheets

(51) Int. Cl.
*H01L 21/683* (2006.01)
*H01L 23/31* (2006.01)

(56) References Cited

U.S. PATENT DOCUMENTS

| | | | |
|---|---|---|---|
| 7,619,901 B2 * | 11/2009 | Eichelberger | H01L 21/6835 |
| | | | 361/763 |
| 7,737,543 B2 * | 6/2010 | Jobetto | H01L 21/568 |
| | | | 257/686 |
| 8,304,923 B2 * | 11/2012 | Hu | H01L 21/6835 |
| | | | 257/686 |
| 8,354,304 B2 * | 1/2013 | Chow | H01L 21/561 |
| | | | 257/774 |
| 8,361,842 B2 | 1/2013 | Yu et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 2010/0290191 A1 * | 11/2010 | Lin | H01L 23/49816 |
| | | | 361/704 |
| 2011/0291288 A1 | 12/2011 | Wu et al. | |
| 2013/0040423 A1 * | 2/2013 | Tung | H01L 23/3114 |
| | | | 438/107 |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0264684 A1 | 10/2013 | Yu et al. | |
| 2013/0307140 A1 | 11/2013 | Huang et al. | |
| 2014/0061937 A1 | 3/2014 | Hu et al. | |
| 2014/0070403 A1 | 3/2014 | Pan et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0262909 A1 | 9/2015 | Chen | |
| 2016/0307872 A1 * | 10/2016 | Chen | H01L 23/5386 |

* cited by examiner

METHOD FOR FORMING CHIP PACKAGE STRUCTURE

PRIORITY CLAIM AND CROSS-REFERENCE

This Application claims the benefit of U.S. Provisional Application No. 62/427,061, filed on Nov. 28, 2016, and entitled "CHIP PACKAGE STRUCTURE AND METHOD FOR FORMING THE SAME", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

Over the past several decades, the semiconductor integrated circuit industry has experienced rapid growth. Technological advances in semiconductor materials and design have produced increasingly smaller and more complex circuits. These material and design advances have been made possible as the technologies related to processing and manufacturing have also undergone technical advances. As semiconductor chips are becoming increasingly smaller, methods of packaging the semiconductor chips have also improved.

Although existing processes for packaging the semiconductor chips have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
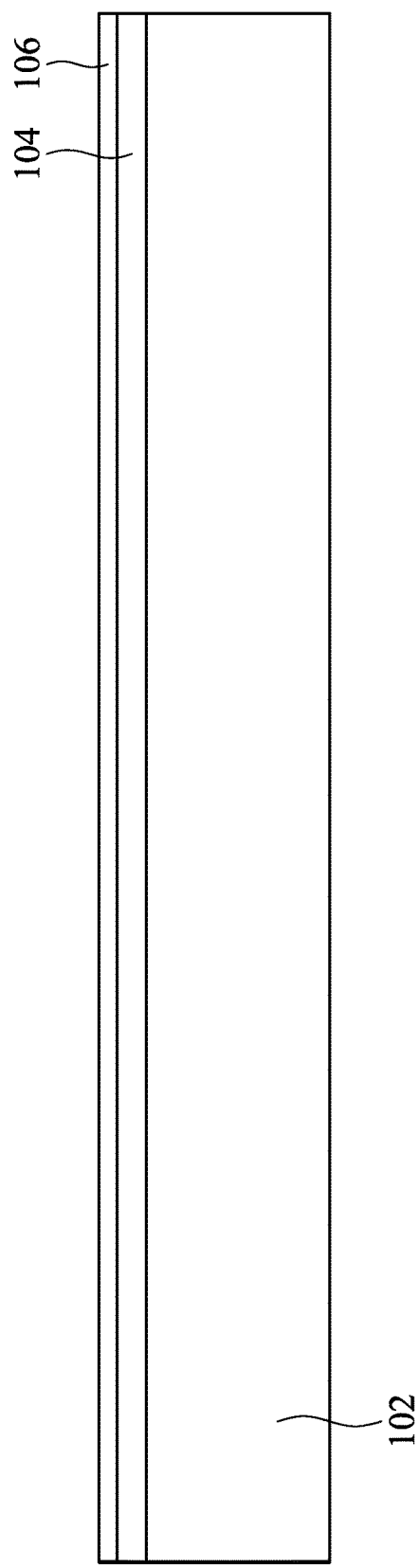
FIGS. 1A to 1K are cross-sectional representations of various stages of forming a chip package structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Embodiments for forming a chip package structure are provided. The chip package structure includes a chip (e.g. a device die) formed over a flexible protection layer and a photosensitive layer covered the chip/die. A redistribution layer and another flexible protection layer are formed over the photosensitive layer. In addition, the chip package described above may be a flexible structure.

FIGS. 1A to 1K are cross-sectional representations of various stages of forming a chip package structure 100a in accordance with some embodiments. Although some embodiments are discussed with operations performed in a particular order, these operations may be performed in another logical order. Additional operations can be provided before, during, and/or after the stages described in FIGS. 1A-1K. Some of the stages that are described can be replaced or eliminated for different embodiments. Additional features can be added to the package structure. Some of the features described below can be replaced or eliminated for different embodiments.

As shown in FIG. 1A, a carrier substrate 102 is received in accordance with some embodiments. In some embodiments, the carrier substrate 102 is used as a temporary substrate. The temporary substrate provides mechanical and structural support during subsequent processing steps, such as those described in more detail later. The carrier substrate 102 is made of a semiconductor material, ceramic material, polymer material, metal material, another suitable material, or a combination thereof. In some embodiments, the carrier substrate 102 is a glass substrate. In some other embodiments, the carrier substrate 102 is a semiconductor substrate, such as a silicon wafer.

A first protection layer 104 is formed over the carrier substrate 102, as shown in FIG. 1A in accordance with some embodiments. In some embodiments, the first protection layer 104 is a flexible layer. In some embodiments, the first protection layer is a flexible layer with an elongation rate greater than about 30%, such that it can be used in a flexible device. In some embodiments, the first protection layer 104 is made of a polymer, such as polyimide. In some embodiments, the first protection layer 104 is formed by performing a spin coating process. In some embodiments, the first protection layer 104 is laminated to the carrier substrate 102 as a dry film.

In some embodiments, the thickness of the first protection layer 104 is in a range from about 5 μm to about 15 μm. The thickness of the first protection layer 104 may be chosen to be large enough so that it can efficiently provide a protection for elements formed over it from, for example, water outside the structure. On the other hand, the thickness of the first protection layer 104 may be chosen not to be too large so it can have the appropriate flexibility.

After the first protection layer 104 is formed, an adhesive layer 106 is formed over the first protection layer 104, as shown in FIG. 1A in accordance with some embodiments. The adhesive layer 106 is configured to attach a chip over the first protection layer 104 and is made of any appropriate adhesive, such as glue. The adhesive layer may be deposited or laminated to the first protection layer 104. In some embodiments, the adhesive layer 106 is a die-attached film (DAF).

Figure 1B:
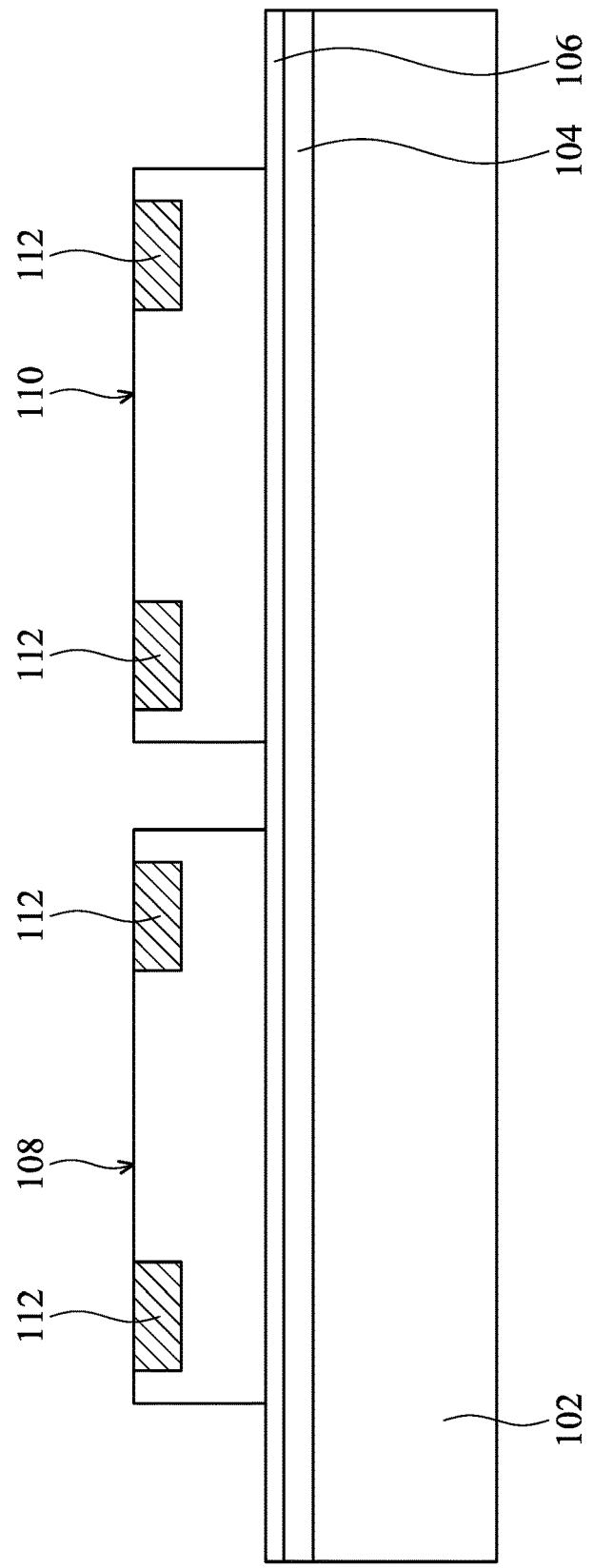

Next, chips 108 and 110 are disposed over the first protection layer 104, as shown in FIG. 1B in accordance with some embodiments. As described previously, the chips 108 and 110 may be attached to the first protection layer 104 by the adhesive layer 106. The chips 108 and 110 may be device dies including transistors, diodes, or any applicable integrated circuit elements. The chips 108 and 110 may also include capacitors, inductors, resistors, integrated circuit elements, or a combination thereof. In some embodiments, the chips 108 and 110 are sensor chips, logic chips, central processing unit (CPU) chips, memory chips, or the like. In some embodiments, chip 108 is different from chip 110. For example, the function of chips 108 and 110 may be different.

In some embodiments, the chips 108 and 110 include conductive pads 112. The conductive pads 112 are electrically connected to device elements formed in the chips 108 and 110. Examples of device elements may include, but are not limited to, transistors, diodes, and other applicable elements. Examples of the transistors may include, but are not limited to, image sensor devices, logic devices, memory devices, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like. Various processes are performed to form the device elements, such as deposition, etching, implantation, photolithography, annealing, and other applicable processes.

In some embodiments, the thicknesses of the chips 108 and 110 are in a range from about 10 μm to about 30 μm. When the semiconductor structure 100 is designed as a flexible device, the thickness of the chips 108 and 110 may be controlled to be thin enough so they can be used in a flexible device without being broken. In some other embodiments, the chips 108 and 110 have different heights.

It should be noted that, although the adhesive layer 106 shown in FIG. 1B is formed to cover the whole first protection layer 104, the adhesive layer 106 may be positioned only under the chips 108 and 110 but not at the portions which are not covered by the chips 108 and 110 in some other embodiments. For example, the adhesive layer 106 may be formed under the chips 108 and 110 and is attached to the first protection layer 104 as the chips 108 and 110 are attached to the first protection layer 104.

Figure 1C:
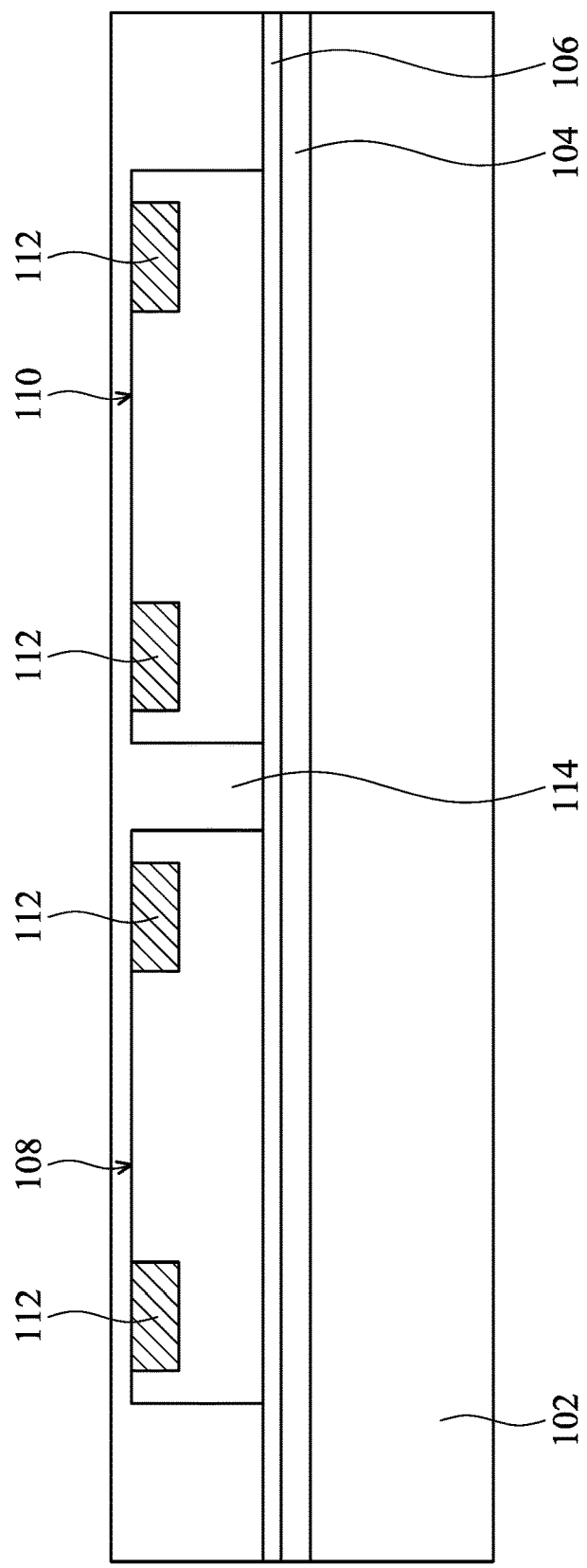

After the chips 108 and 110 are disposed over the first protection layer 104, a photosensitive layer 114 is formed to cover the chips 108 and 110, as shown in FIG. 1C in accordance with some embodiments. As shown in FIG. 1C, the photosensitive layer 114 is formed over the adhesive layer 106 and covers the sidewalls and the top surface of chips 108 and 110.

In some embodiments, the photosensitive layer 114 is made of a photoresist material, so that it can be easily patterned in subsequent processes (Details will be described later). In some embodiments, the thickness of photosensitive layer 114 is in a range of about 20 μm to about 40 μm. The photosensitive layer 114 should be thick enough to cover the chips 108 and 110 formed over the carrier substrate 102. On the other hand, the photosensitive layer 114 may not be too thick when it is used in a flexible device to ensure better flexibility. In some embodiments where the chips 108 and 110 have different heights, the photosensitive layer 114 formed over the chips 108 and 110 may have different local thickness, so that the photosensitive layer 114 can still have a flat top surface.

Figure 1D:
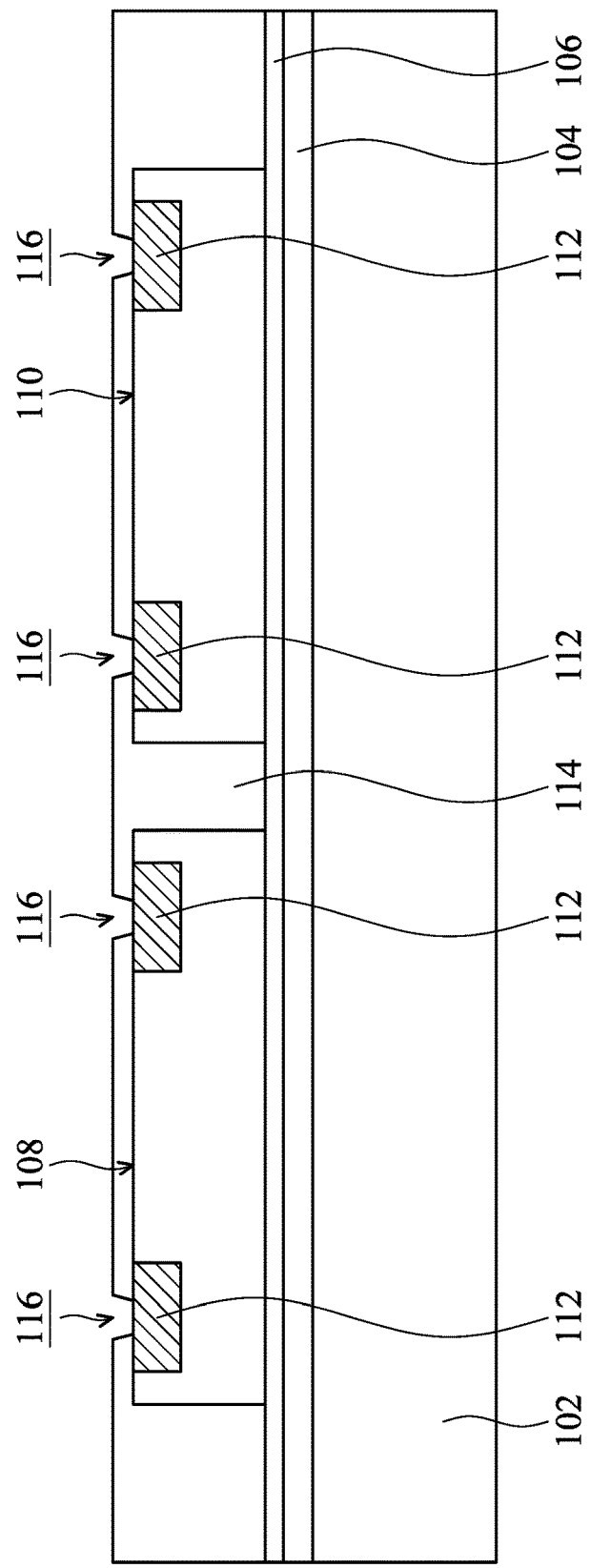

After the photosensitive layer 114 is formed, openings 116 are formed in the photosensitive layer 114 to expose the conductive pads 112 in the chips 108 and 110, as shown in FIG. 1D in accordance with some embodiments. As described previously, the photosensitive layer 114 is made of a photosensitive material, such as a photoresist material, so that it can be patterned easily. In some embodiments, the openings 116 are formed by performing an exposure process and a development process. Since the photosensitive layer 114 is made of a photosensitive material instead of a molding compound, the photosensitive layer 114 does not include fillers, which a molding compound usually includes, so that the photosensitive layer 114 can be patterned by performing an exposure process and a development process.

Figure 1E:
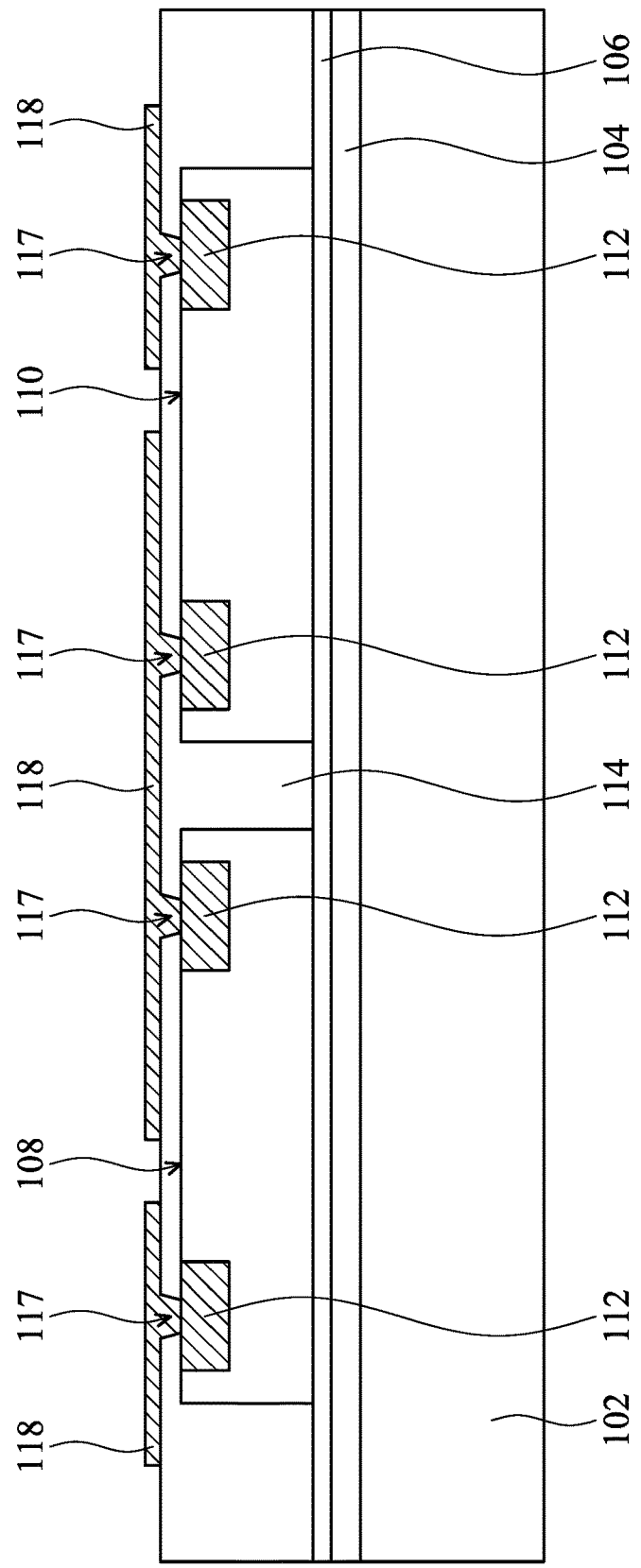

Next, microvias 117 are formed in the openings 116 to connect with the conductive pads 112 in the chips 108 and 110, and a redistribution layer 118 is formed over the photosensitive layer 114 and is connect with the microvias 117, as shown in FIG. 1E in accordance with some embodiments.

Figure 1F:
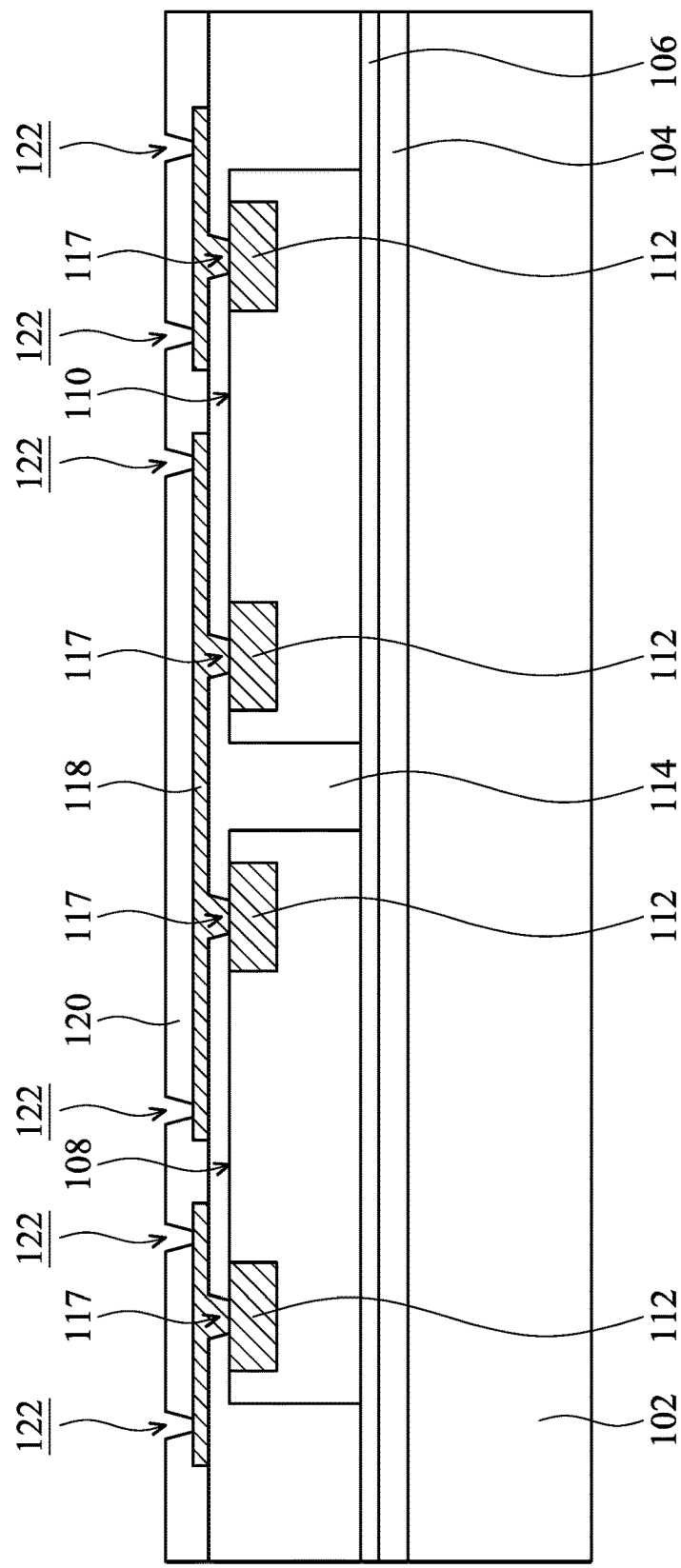

After the redistribution layer 118 is formed, a dielectric layer 120 is formed over the photosensitive layer 114 and covers the redistribution layer 118, as shown in FIG. 1F in accordance with some embodiments. In addition, openings 122 are formed in the dielectric layer 120. Afterwards, a redistribution layer 124 is formed over the dielectric layer 120 and in the openings 122 of the dielectric layer 120, as shown in FIG. 1G in accordance with some embodiments.

In some embodiments, the redistribution layers 118 and 124 are made of metal, such as Cu, Cu alloy, Al, Al alloy, W, W alloy, Ti, Ti alloy, Ta, Ta alloy, or a combination thereof. In some embodiments, the redistribution layers 118 and 124 are formed by an electroplating process, an electroless plating process, a sputtering process, a CVD process, or another applicable process.

In some embodiments, the dielectric layer 120 is made of PBO, BCB, silicone, acrylates, siloxane, another suitable material, or a combination thereof. In some other embodiments, the dielectric layer 120 is made of non-organic materials. The non-organic materials includes silicon oxide, un-doped silicate glass, silicon oxynitride, SR, silicon nitride, silicon carbide, HMDS, another suitable material, or a combination thereof.

Figure 1G:
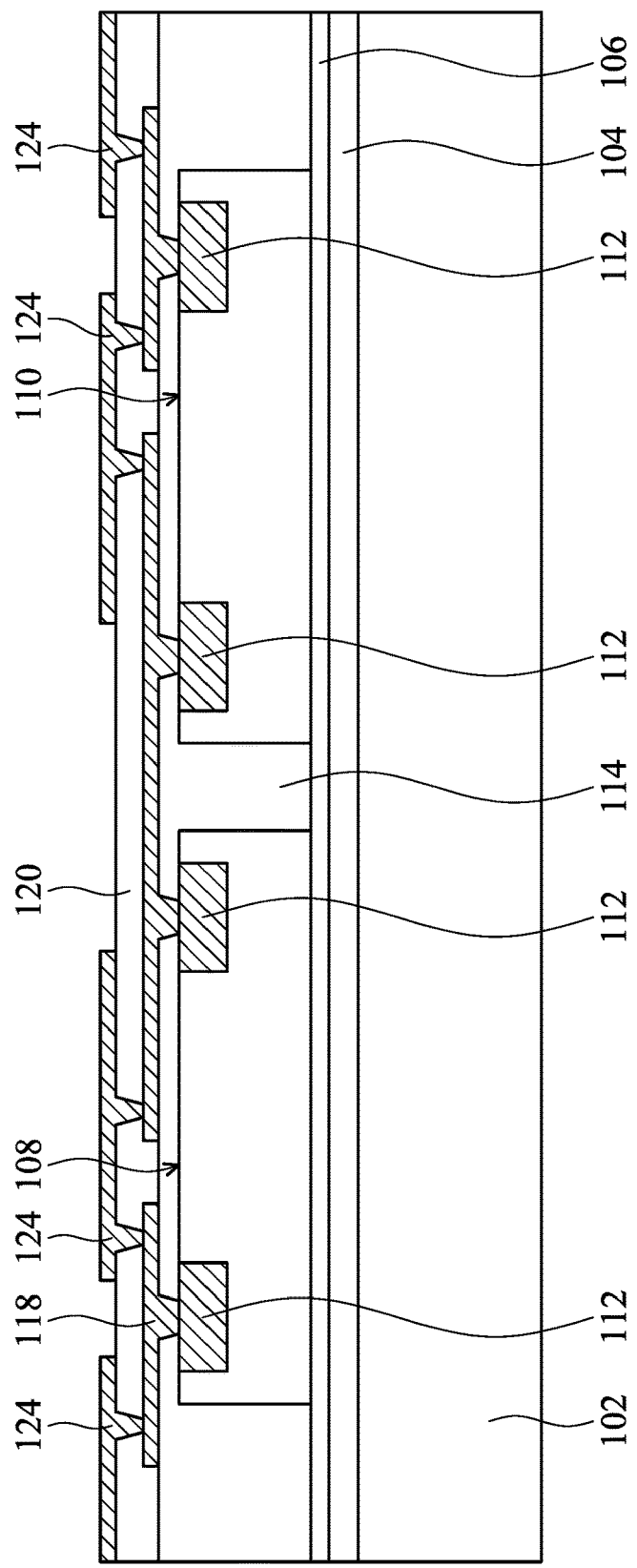

Is should be noted that, although FIG. 1G shows the conductive structure 118 and 124 and the dielectric layer 120, the scope of the disclosure is not intended to be limiting. For example, additional redistribution layers and dielectric layers may be formed. Multiple deposition, coating, and/or etching processes may be used to form the redistribution layer.

Figure 1H:
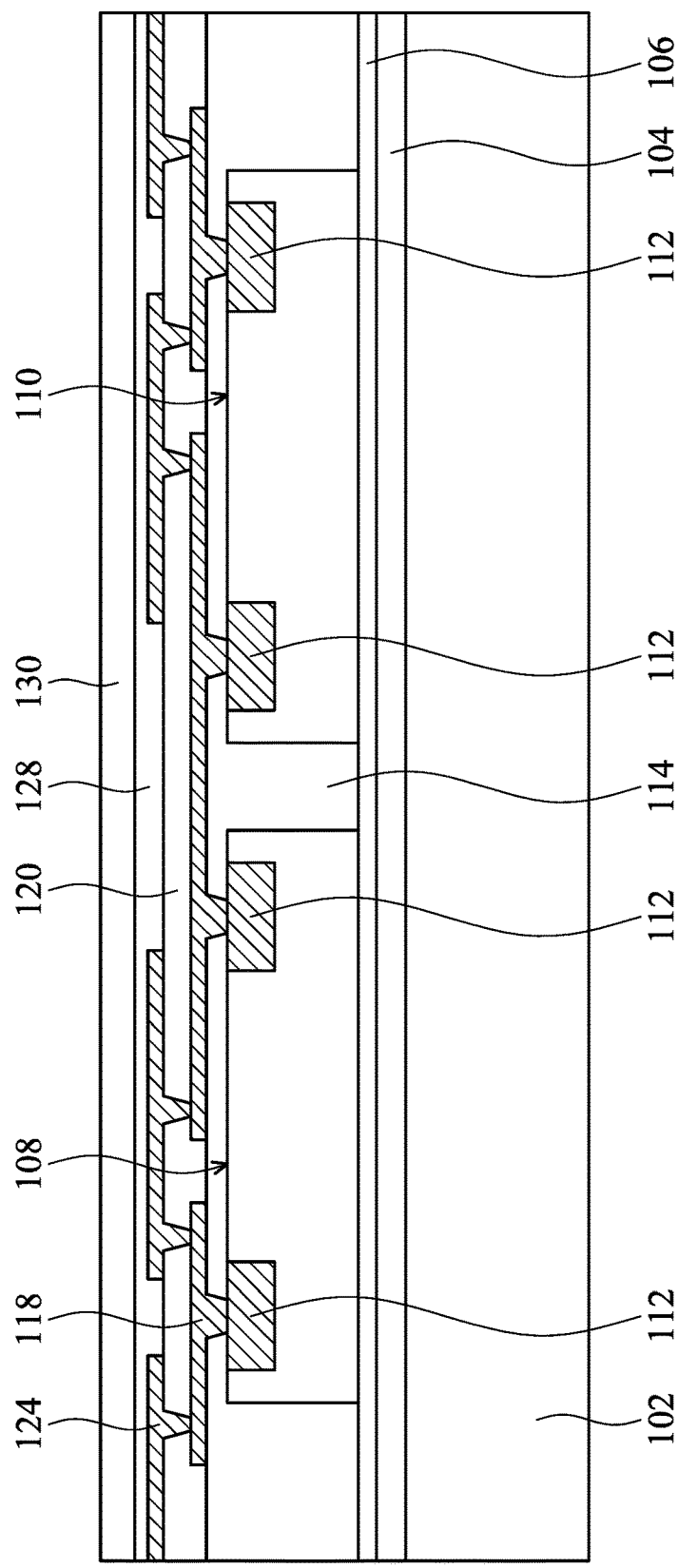

After the redistribution layer 124 is formed, a material layer is laminated to the redistribution layer 124, as shown in FIG. 1H in accordance with some embodiments. In some embodiments, the material layer includes an adhesive layer 128 and a second protection layer 130. The adhesive layer 128 is used to attach the second protection layer 130 to the redistribution layer 124 and may be made of any applicable adhesives. In addition, the adhesive layer 128 is in direction contact with the redistribution layer 124.

In some embodiments, the second protection layer 130 and the first protection layer 104 are made of the same material. In some other embodiments, the first protection layer 104 and the second protection layer 130 are made of different materials. The first protection layer 104 and second protection layer 130 may be configured to protect the chips 108 and 110 formed therebetween from the environment outside, such as water.

In some embodiments, the second protection layer 130 is a flexible layer. In some embodiments, the second protection layer 130 is a flexible layer with an elongation rate greater than about 30%, such that it can be used in a flexible device. In some embodiments, the second protection layer 130 is made of a polymer, such as polyimide.

Figure 1I:
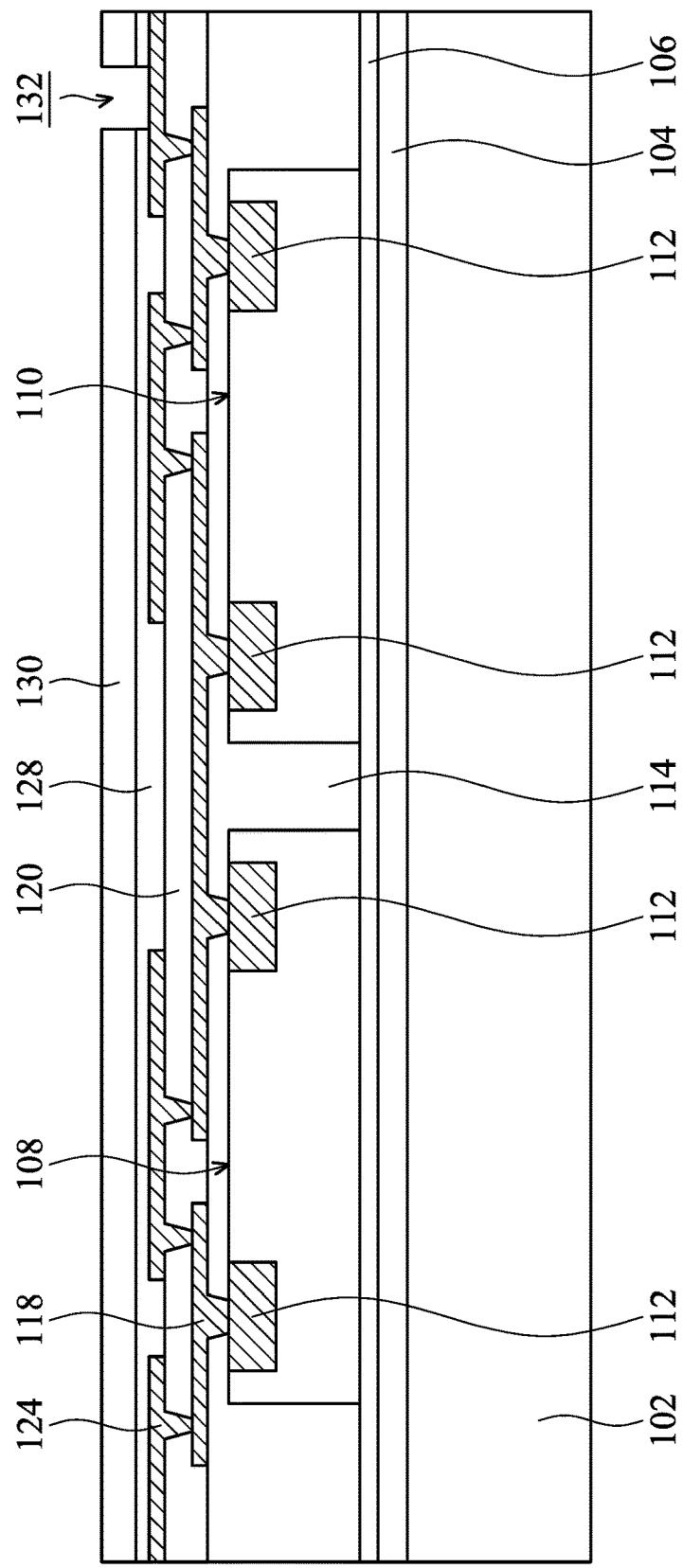

After the adhesive layer 128 and the second protection layer 130 are laminated, an opening 132 is formed through the material layer 126, as shown in FIG. 1I in accordance with some embodiments. As shown in FIG. 1I, the redistribution layer 124 is exposed by the opening 132. In some embodiments, the opening 132 is formed at a side over the carrier substrate 102 and dose not overlap with the chips 108 and 110 formed over the carrier substrate 102.

Figure 1J:
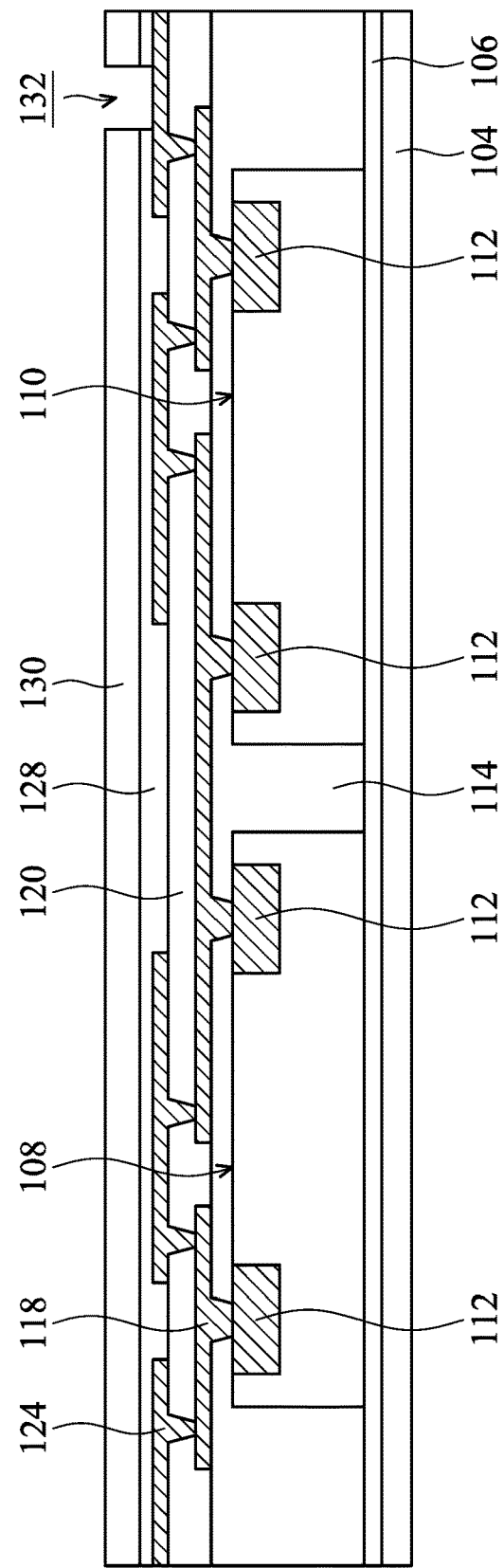

After the opening 132 is made, the carrier substrate 102 is removed from the first protection layer 104, as shown in FIG. 1J in accordance with some embodiments. The carrier substrate 102 may be removed by performing a de-bonding process. The de-bonding process may include performing a thermal process.

Figure 1K:
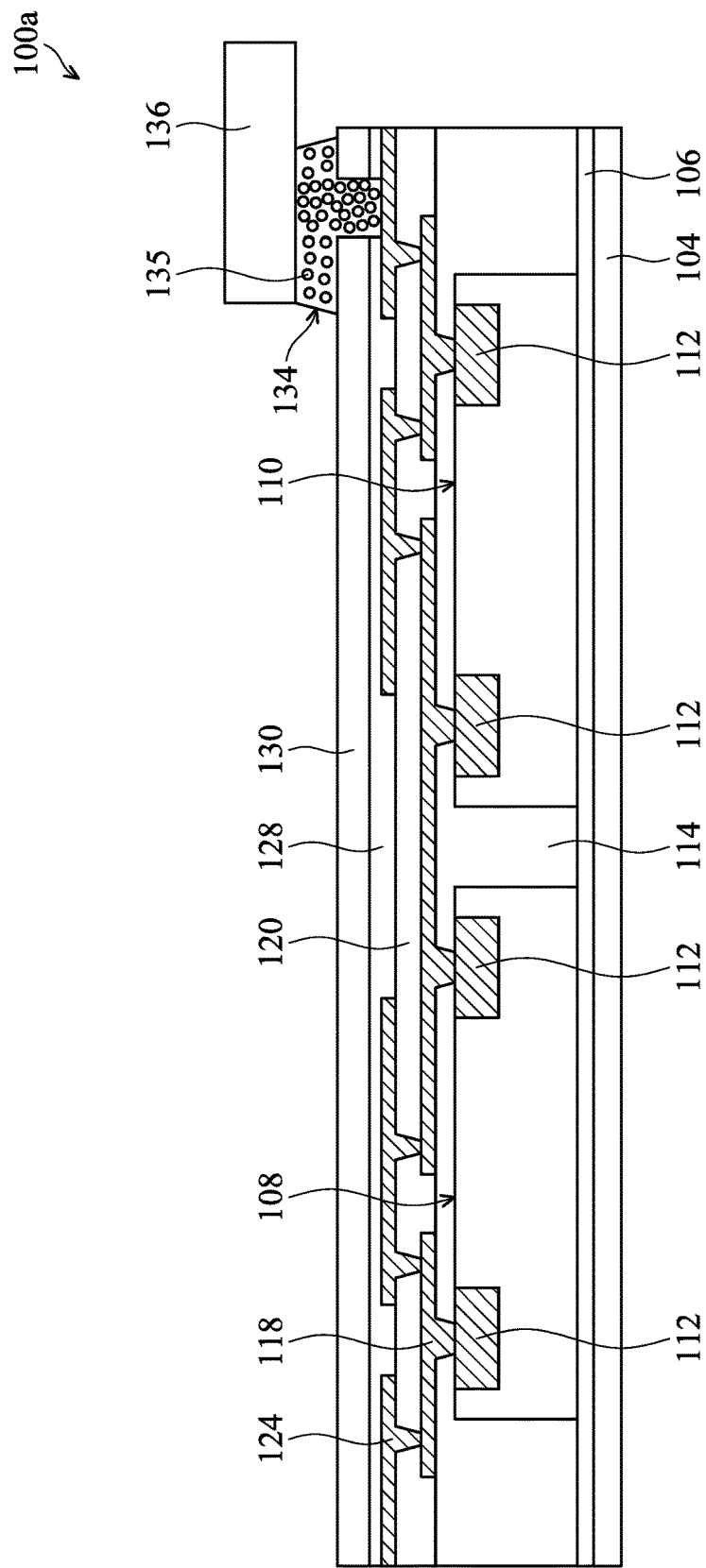

Next, an anisotropic conductive paste 134 is provided in the opening 132 and over the second protection layer 130 near the opening 132, and a printed circuit board 136 is disposed over the anisotropic conductive paste 134, as shown in FIG. 1K in accordance with some embodiments. As shown in FIG. 1K, the printed circuit board 136 is disposed at a side of the second protection layer 130, and is arranged with minimal projective/vertical overlap with the chips 108 and 110 so that the resulting chip package structure 100a can have a better flexibility in accordance with some embodiments. In some embodiments, the circuit board 136 is arranged with no projective overlap with the chips 108/110.

In some embodiments, the anisotropic conductive paste 134 includes conductive particles 135 substantially uniformly distributed in a non-conductive adhesive film. After the printed circuit board 136 is disposed, the printed circuit board 136 is pressed toward the redistribution layer 124, so that the conductive particles 135 in the anisotropic conductive paste 134 are electrically connected with the printed circuit board 136 and the redistribution layer 124.

As shown in FIG. 1K, the chip package structure 100a includes the chips 108 and 110 disposed over the first protection layer 104 and embedded in the photosensitive layer 114. In addition, the redistribution layer 124 is formed over the photosensitive layer 114 and the second protection layer 130 is laminated over the redistribution layer 124. In some embodiments, the distance between the top surface of the second protection layer 130 and the bottom surface of the first protection layer 104 is smaller than about 100 µm. Since the distance described above is relatively thin and the printed circuit board 136 bonded over it may be a flexible printed circuit board, the chip package structure 100a may be used as a flexible device. In addition, when the printed circuit board 136 is bonded to the redistribution layer 112 through the anisotropic conductive paste 134, the flexibility of the chip package structure 100a may further improve, compared to that bonded through structures such as ball grid array (BGA).

Figure 2:
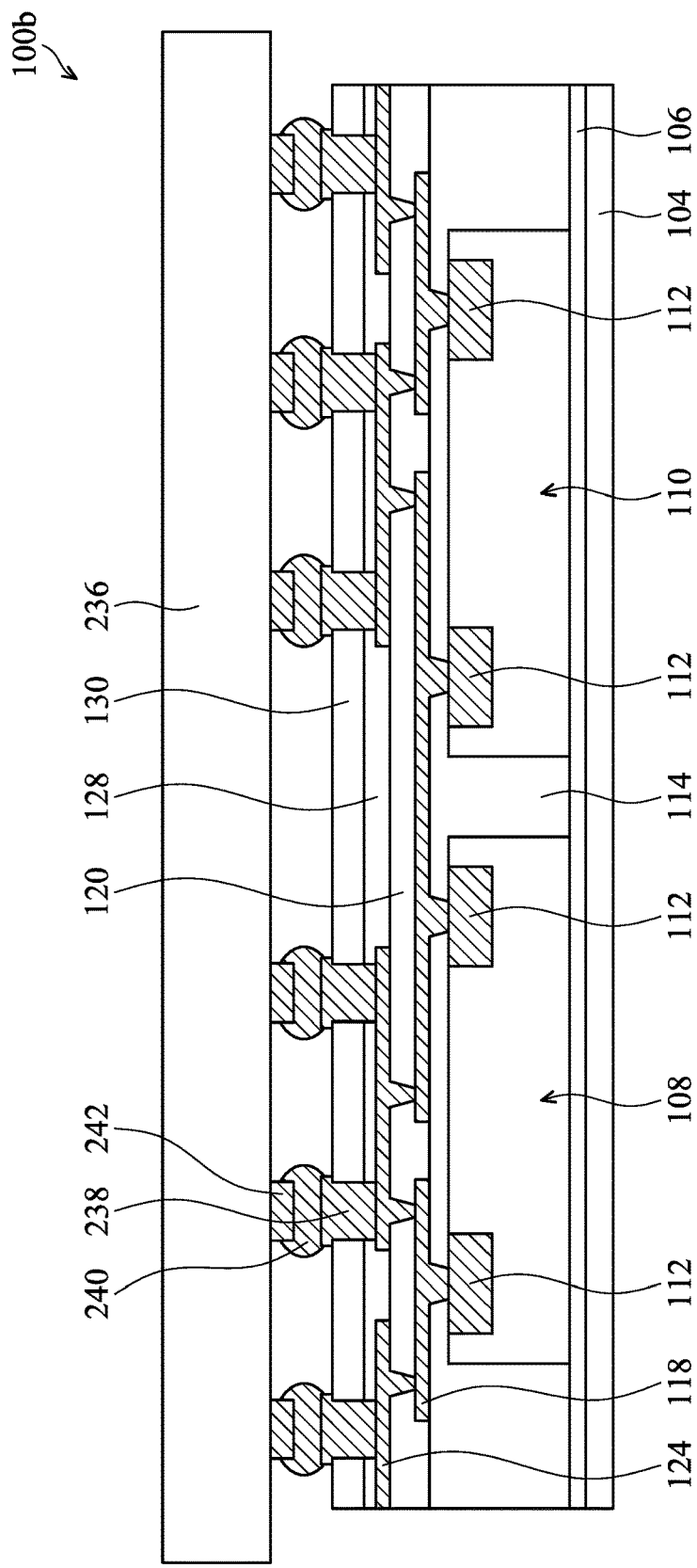
FIG. 2 is a cross-sectional representation of a chip package structure in accordance with some embodiments.

FIG. 2 is a cross-sectional representation of a chip package structure 100b in accordance with some embodiments. The chip package structure 100b is similar to, or the same as, the chip package structure 100a described previously, except a printed circuit board 236 is bonded over the chips 108 and 110. Some processes and materials used to form the chip package structure 100b are similar to, or the same as, those used to form the chip package structure 100a shown in FIGS. 1A to 1J and may not be repeated herein.

Similar to the chip package structure 100a, the chip package structure 100b includes the chips 108 and 110 attached onto the first protection layer 104 through the adhesive layer 106, and the chips 108 and 110 are covered (e.g. encapsulated) by the photosensitive layer 114. The redistribution layers 118 and 124 are formed over the photosensitive layer 114, and the adhesive layer 128 and the second protection layer 130 are laminated to the redistribution layer 124.

Afterwards, the printed circuit board 236 is disposed over the second protection layer 130 and is electrically connected with the redistribution layer 124, as shown in FIG. 2 in accordance with some embodiments. More specifically, under bump metal (UBM) 238 are formed through the adhesive layer 128 and the second protection layer 130 to connect with the redistribution layer 124, and solder balls 240 are used to bond the UBMs 238 and the conductive pads 242 over the printed circuit board 236. In some embodiments, the printed circuit board 236 is a flexible printed circuit board, and therefore the chip package structure 100b may be used as a flexible device.

FIGS. 3A to 3E are cross-sectional representations of various stages of forming a chip package structure 100c in accordance with some embodiments. The chip package structure 100c may be similar to, or the same as, the chip package structure 100a, except a supporting structure is formed. Some processes and materials used to form the chip package structure 100c are similar to, or the same as, those used to form the chip package structure 100a shown in FIGS. 1A to 1K and may not be repeated herein.

Figure 3A:
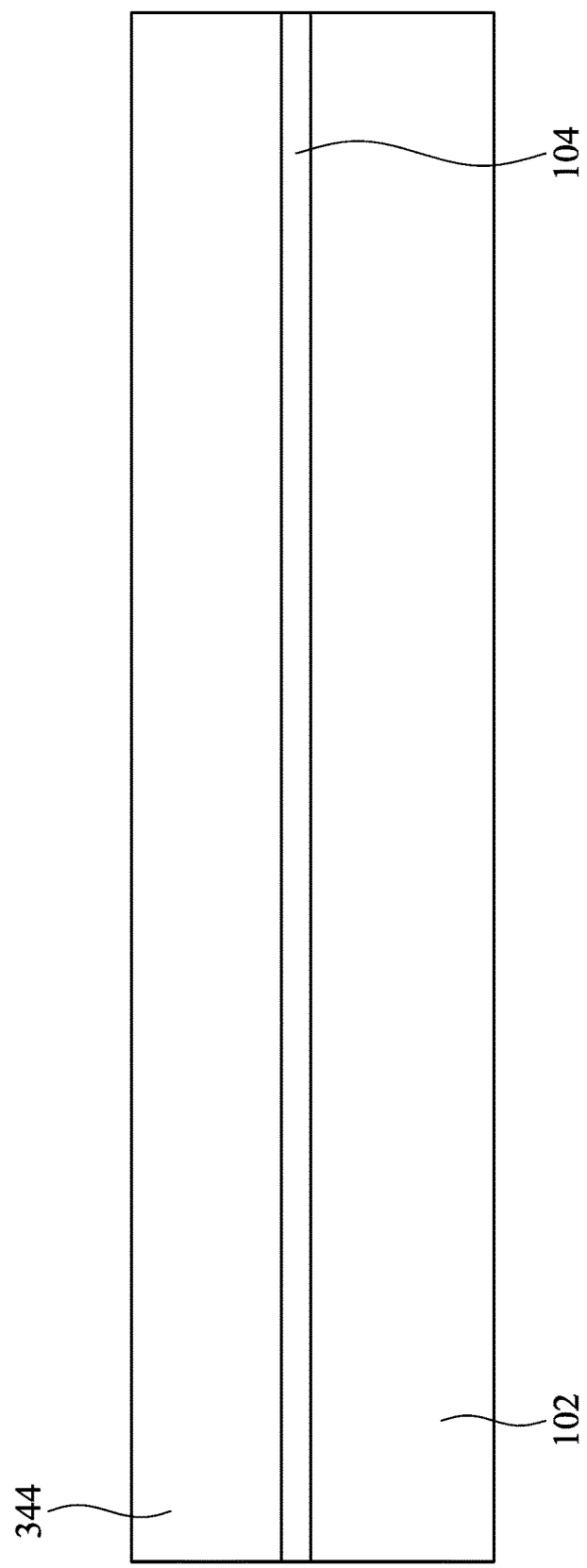
FIGS. 3A to 3E are cross-sectional representations of various stages of forming a chip package structure in accordance with some embodiments.

Similar to the chip package structure 100a, the first protection layer 104 is formed over the carrier substrate 102, as shown in FIG. 3A in accordance with some embodiments. After the first protection layer 104 is formed, a supporting layer 344 is formed over the first protection layer 104, as shown in FIG. 3A in accordance with some embodiments. In some embodiments, the supporting layer 344 is made of a flexible material, so that the resulting structure may be flexible. In some embodiments, the supporting layer 344 is made of a photosensitive material, such as a photoresist material, so that it can be easily patterned as designed.

Figure 3B:
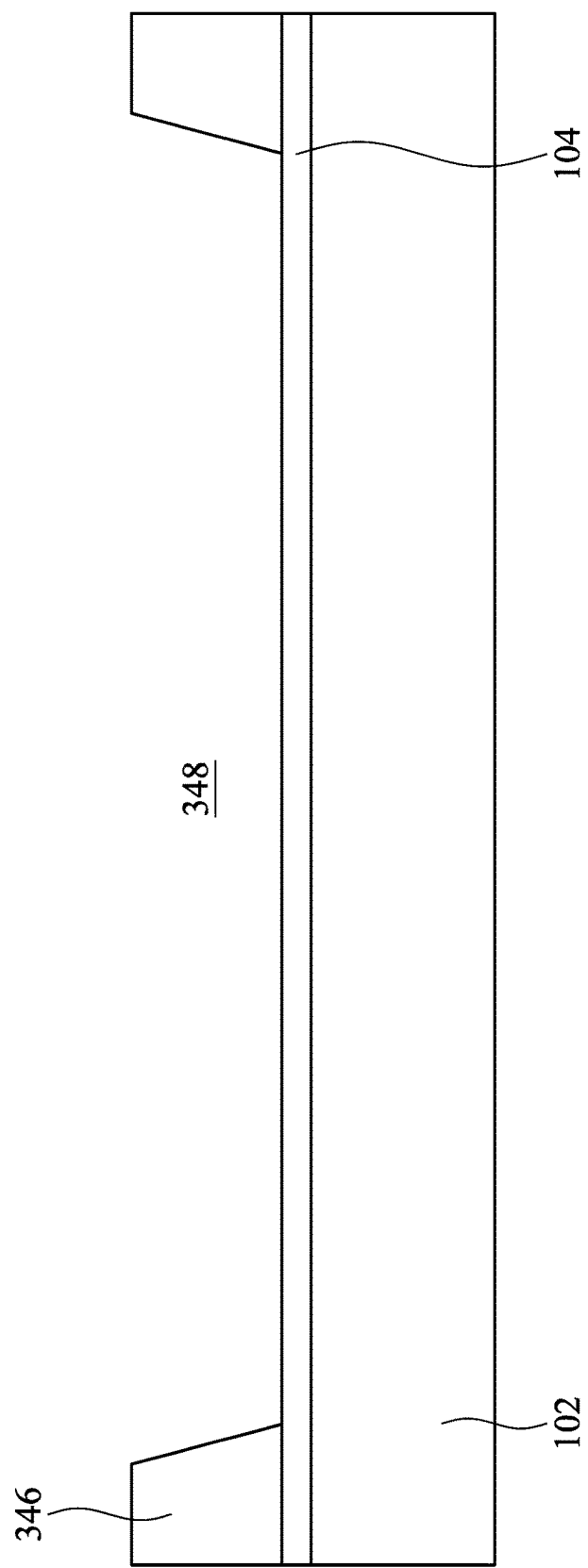

Next, the supporting layer 344 is patterned to form a supporting structure 346, as shown in FIG. 3B in accordance with some embodiments. As described above, the supporting layer 344 may be made of a photoresist material, and therefore it can be patterned by performing an exposure process and a development process. As show in FIG. 3B, the supporting structure 346 has an opening 348, and a portion of the first protection layer 104 is exposed by the opening 348. In some embodiments, the thickness of the supporting structure 346 is in a range from about 10 μm to about 30 μm. The supporting structure 346 may be level with or higher than the chips disposed afterward to provide a support at the portion where the chips are not designed to be disposed.

Figure 3C:
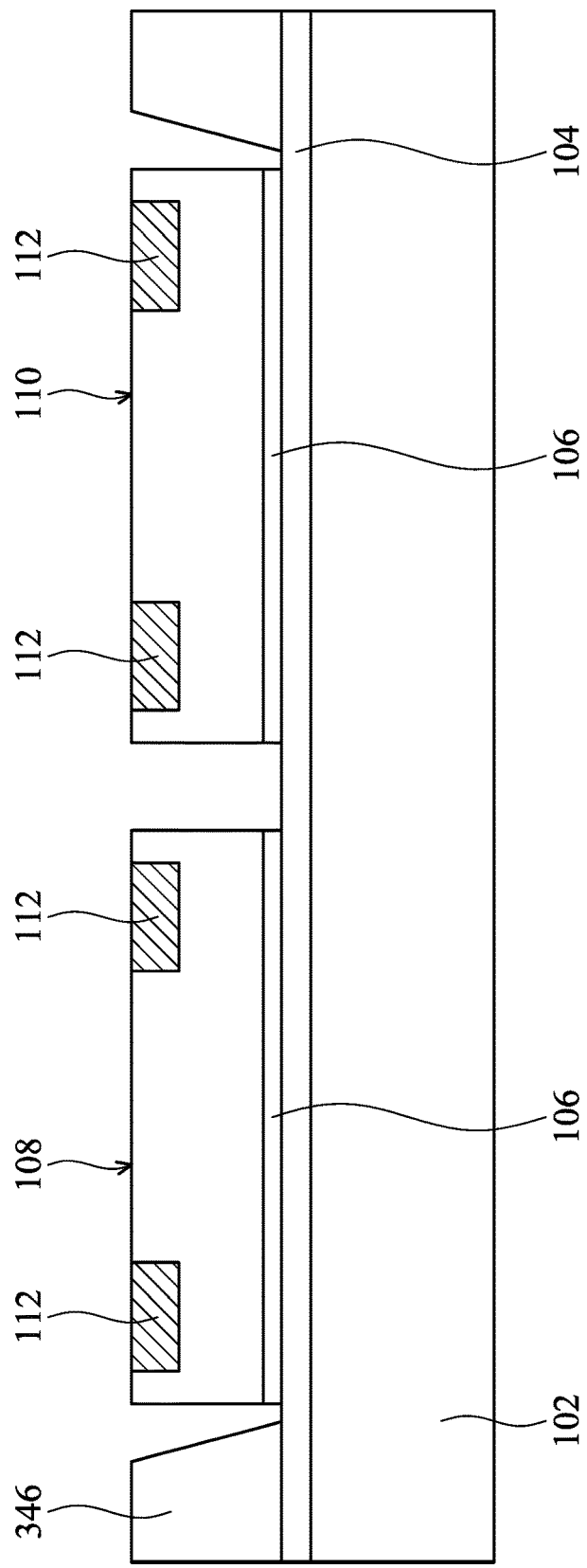

After the supporting structure 346 is formed, the chips 108 and 110 with an adhesive layer 106 attached underneath are disposed in the opening 348 of the supporting structure 346 over the carrier substrate 102, as shown in FIG. 3C in accordance with some embodiments. The conductive pads 112 are formed in the chips 108 and 110. As shown in FIG. 3C, the top surfaces of chips 108 and 110 and the top surface of supporting structure 346 are substantially level.

Figure 3D:
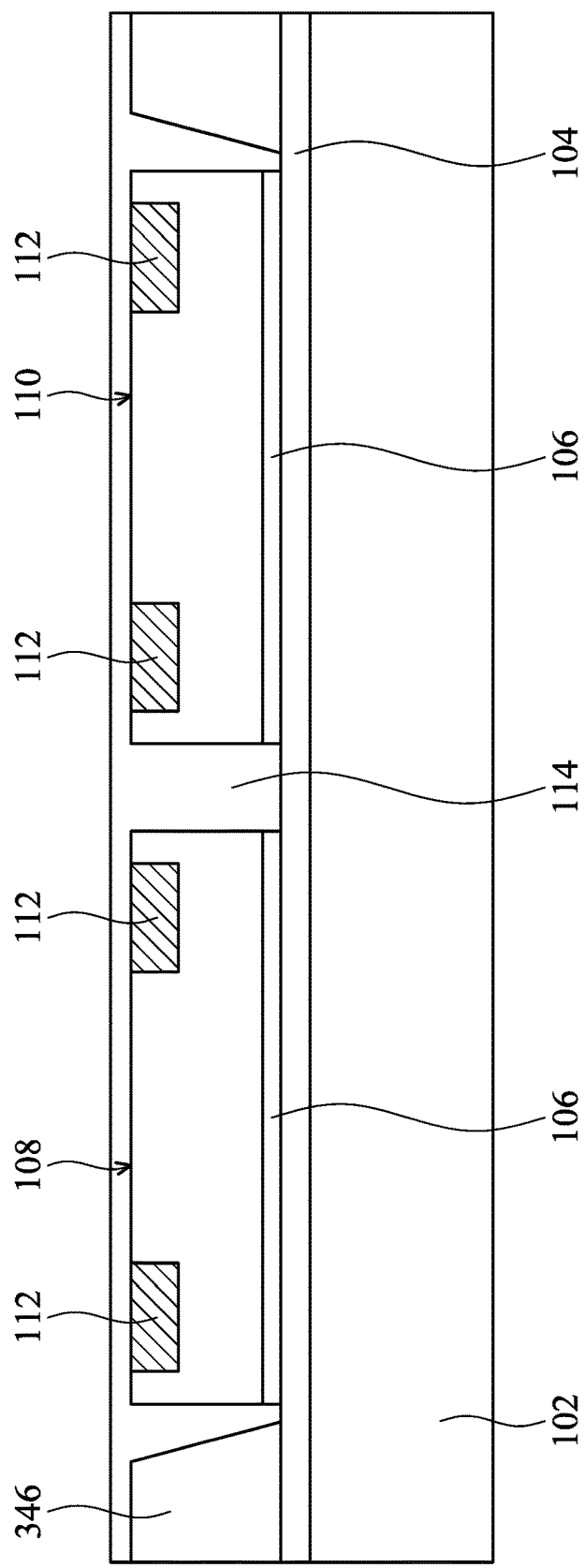

After the chips 108 and 110 are disposed in the opening 348 of the supporting structure 346, the photosensitive layer 114 is formed over the supporting structure 346 and the chips 108 and 110, as shown in FIG. 3D in accordance with some embodiments. More specifically, the photosensitive layer 114 is formed on the top surface and sidewalls of supporting structure 346 and the top surfaces and sidewalls of chips 108 and 110, so that the chips 108 and 110 are encapsulated by the photosensitive layer 114. In some other embodiments, the top surfaces of supporting structure 346 and the top surfaces of chips 108 and 110 are not level, and thicknesses of the photosensitive layer 114 formed over the supporting structure 346 and the chips 108 and 110 are also different, so that the photosensitive layer 114 may still have a flat top surface.

In some embodiments, the photosensitive layer 114 and the supporting structure 346 are made of different photoresist materials. In some embodiments, the material used to form the supporting structure 346 has a greater rigidity than the material used to form the photosensitive layer 114, so that the supporting structure 346 can be a support at the location where the chips are disposed.

Figure 3E:
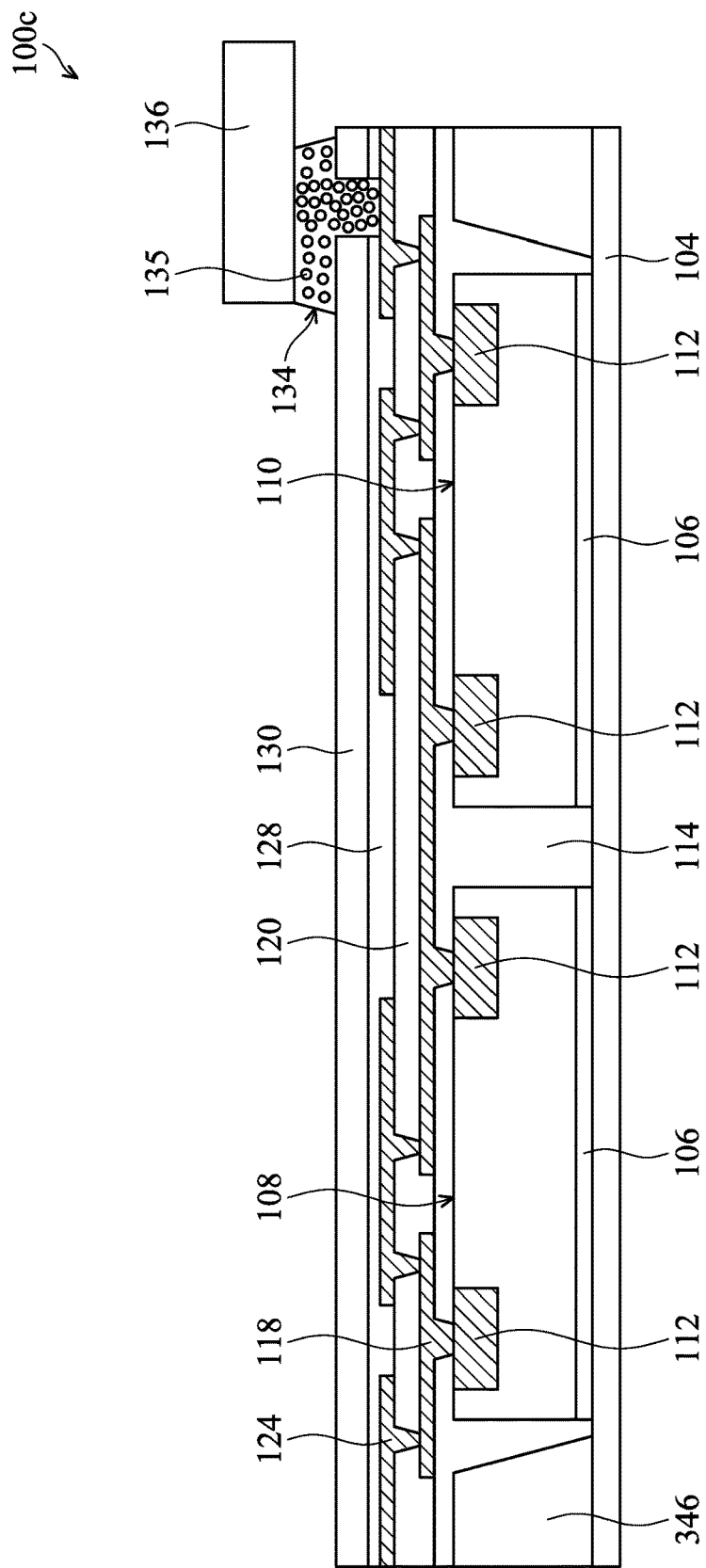

After the photosensitive layer 114 is formed, processes similar to, or the same as, those shown in FIGS. 1D to 1K may be performed to form the chip package structure 100c, as shown in FIG. 3E in accordance with some embodiments. As shown in FIG. 3E, the chip package structure 100c includes the redistribution layers 118 and 124 formed over the photosensitive layer 114, and the adhesive layer 128 and the second protection layer 130 formed over the redistribution layer 124. In addition, the printed circuit board 136 is bonded to the redistribution layer 124 through the anisotropic conductive paste 134.

As described previously, the supporting structure 346 is formed over the first protection layer 104 in the chip package structure 100c, and the supporting structure 346 may be made of a material having a relatively large rigidity. Therefore, the supporting structure 346 may provide an addition support for the chip package structure 100c at the location that the chips 108 and 110 are not disposed. In addition, the supporting structure 346 may further prevent the chip package structure 100c from delaminated or distorted from its edges.

Figure 4:
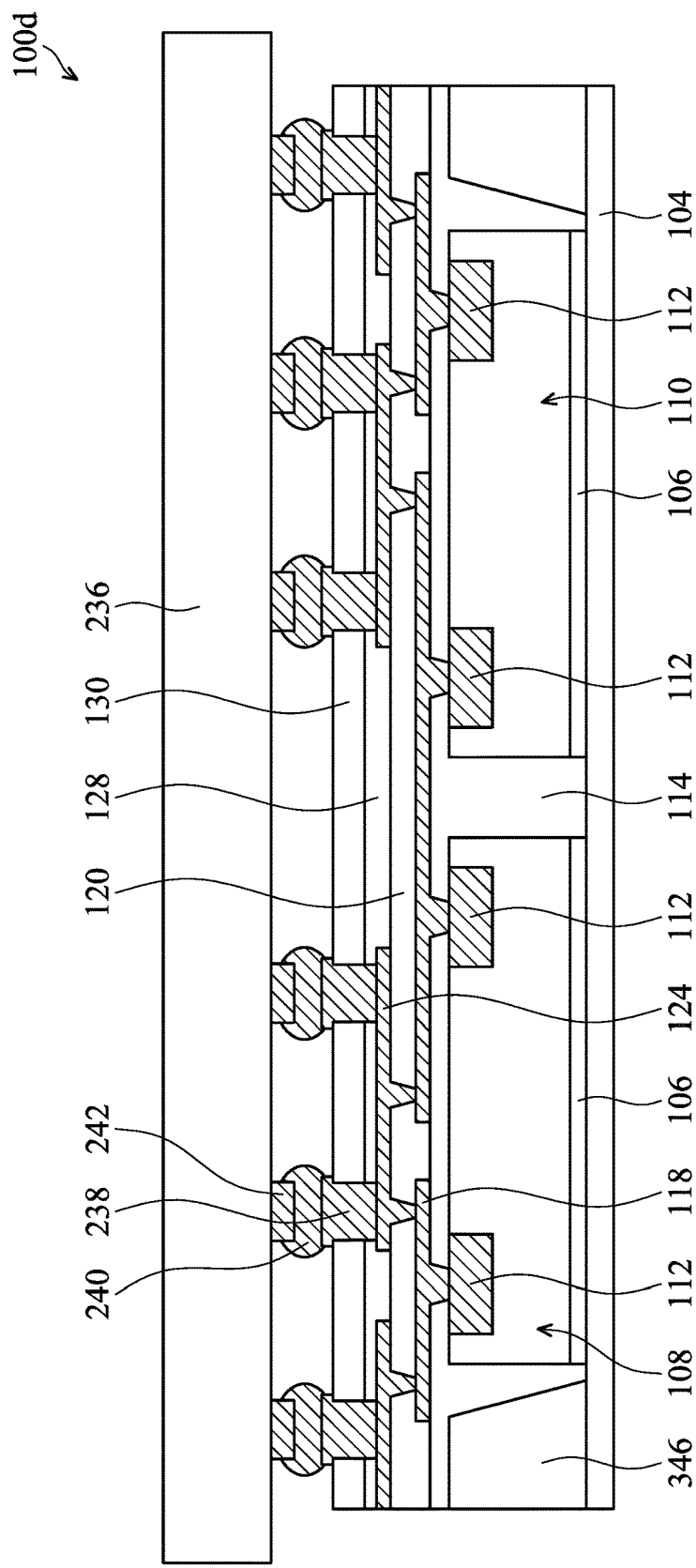
FIG. 4 is a cross-sectional representation of a chip package structure in accordance with some embodiments.

FIG. 4 is a cross-sectional representation of a chip package structure 100d in accordance with some embodiments. The chip package structure 100d is similar to, or the same as, the chip package structure 100c described previously, except a printed circuit board 236 is bonded over the chips 108 and 110. Some processes and materials used to form the chip package structure 100d are similar to, or the same as, those used to form the chip package structure 100c shown in FIGS. 3A to 3E and may not be repeated herein.

Similar to the chip package structure 100c, the chip package structure 100d includes the supporting structure 346 formed over the first protection layer 104 and the chips 108 and 110 formed in the opening of the supporting structure 346 and attached onto the first protection layer 104 through the adhesive layer 106. In addition, the supporting structure 346 and the chips 108 and 110 are covered (e.g. encapsulated) by the photosensitive layer 114. The redistribution layers 118 and 124 are formed over the photosensitive layer 114, and the adhesive layer 128 and the second protection layer 130 are laminated to the redistribution layer 124.

Furthermore, the UBMs 238 are formed through the adhesive layer 128 and the second protection layer 130 to connect with the redistribution layer 124, and the solder balls 240 are used to bond the UBMs 238 and the conductive pads 242 over the printed circuit board 236.

FIGS. 5A to 5G are cross-sectional representations of various stages of forming a chip package structure 100e in accordance with some embodiments. Some processes and materials used to form the chip package structure 100e are similar to, or the same as, those used to form the chip package structure 100a shown in FIGS. 1A to 1K and may not be repeated herein.

Figure 5A:
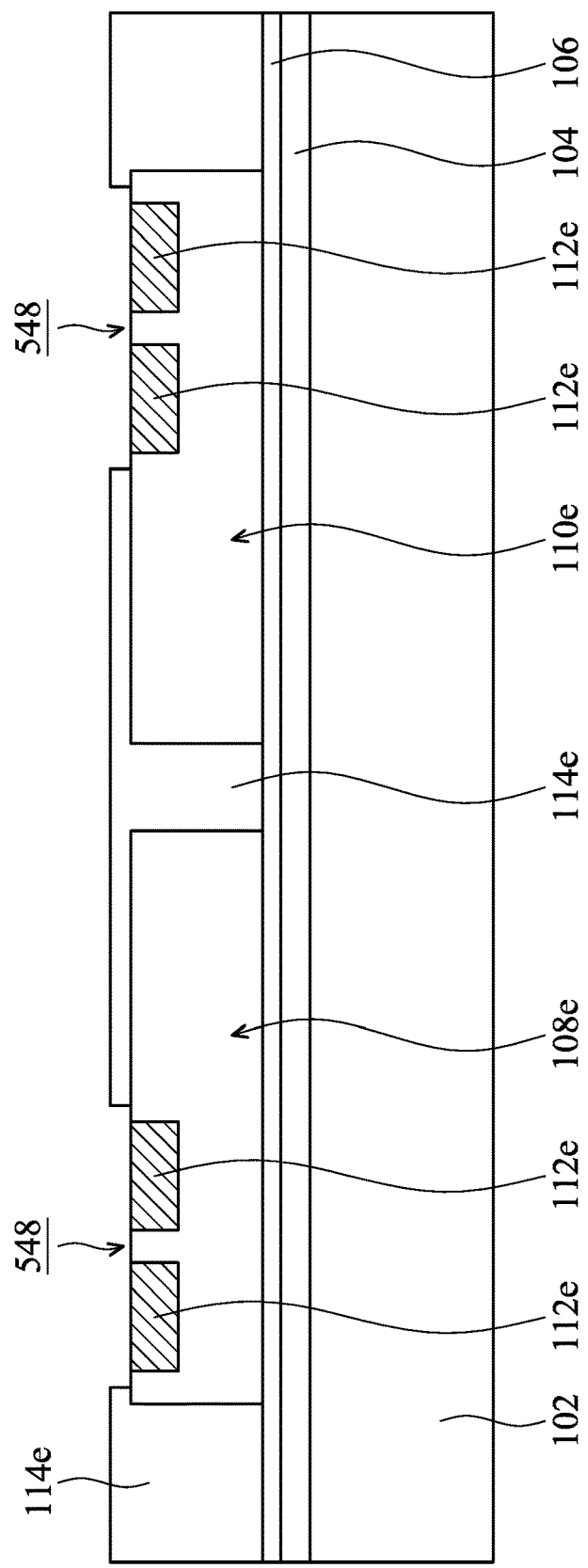
FIGS. 5A to 5G are cross-sectional representations of various stages of forming a chip package structure in accordance with some embodiments.

More specifically, processes similar to those shown in FIGS. 1A to 1C may be performed. As shown in FIG. 5A, the first protection layer 104 and the adhesive layer 106 are formed over the carrier substrate 102, and the chips 108e and 110e are disposed over the carrier substrate 102. The chips 108e and 110e may be disposed beside each other and may be similar to the chips 108 and 110 described previously, except the conductive pads 112e are formed at the sides away from the side close to the other chip, as shown in FIG. 5A in accordance with some embodiments.

After the chips 108e and 110e are disposed, the photosensitive layer 114e is formed to encapsulate the chips 108e and 110e, as shown in FIG. 5A in accordance with some embodiments. The photosensitive layer 114e may be similar to, or the same as, the photosensitive layer 114e, and similar processes described previously are not repeated herein.

After the photosensitive layer 114e is formed, openings 548 are formed in the photosensitive layer 114e to expose the conductive pads 112e in the chips 108e and 110e, as shown in FIG. 5A in accordance with some embodiments.

Similar to the photosensitive layer 114, the photosensitive layer 114e may be patterned by performing an exposure process and a development process.

Figure 5B:
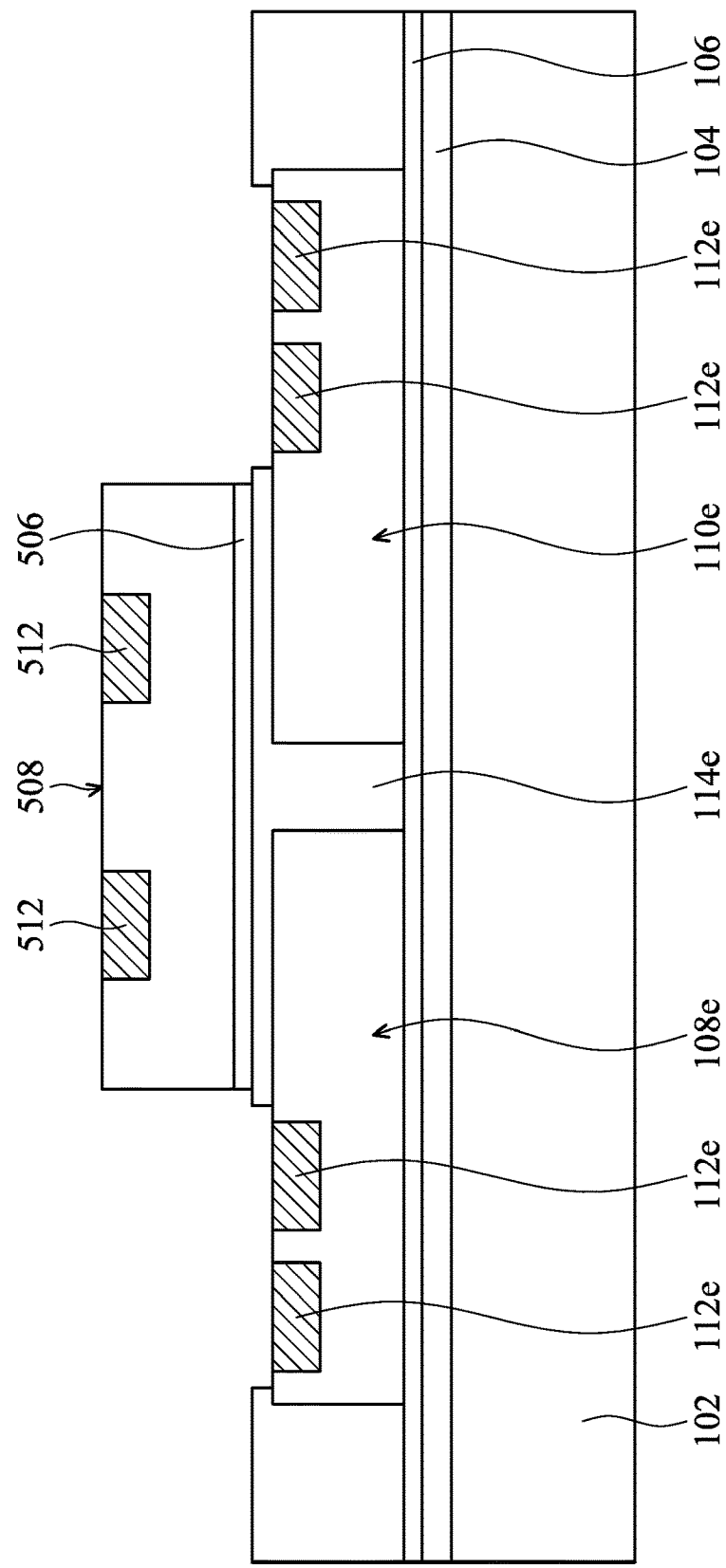

Next, a chip 508 is disposed over the photosensitive layer 114e, as shown in FIG. 5B in accordance with some embodiments. As shown in FIG. 5B, the chip 508 is formed over the photosensitive layer 114e and overlaps with some portions of the chips 108e and 110e. However, the chip 508 does not cover the openings 548, and therefore the conductive pads 112e are still exposed through the openings 548.

As shown in FIG. 5B, a portion of the photosensitive layer 114e is located between the chips 508 and the chips 108e and 110e. That is, the photosensitive layer 114e formed over the chips 108e and 110e does not have to be removed and can be used as a buffer layer between the chips in different layers, so that the chip 508 can be disposed over a relatively flat top surface of the photosensitive layer 114e.

In some embodiments, the third chip 508 is attached to the photosensitive layer 114e through an adhesive layer 506. In some embodiments, the adhesive layer 506 is made of a material the same with that made of the adhesive layer 106. As shown in FIG. 5B, the chip 508 includes conductive pads 512 formed therein.

The chip 508 may be a device die including transistors, diodes, or any applicable integrated circuit elements, similar to, or the same as, the chips 108e and 110e. In some embodiments, the chips 508, 108, and 110 are different form one another. For example, the function of chips 508, 108, and 110 may be different.

Figure 5C:
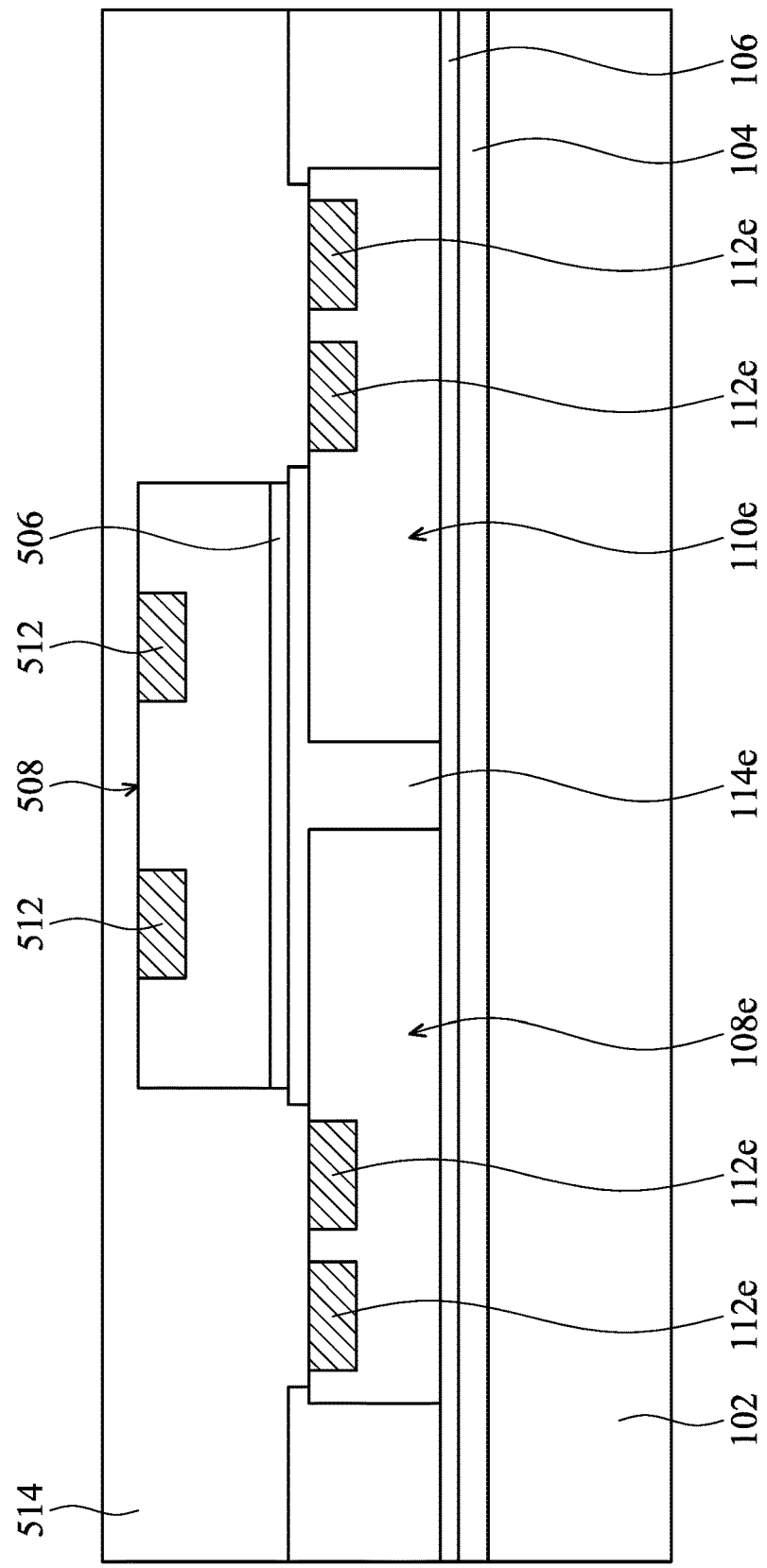

After the chips 508 is disposed over the photosensitive layer 114e, a photosensitive layer 514 is formed to cover the chip 508, as shown in FIG. 5C in accordance with some embodiments. As shown in FIG. 5C, the photosensitive layer 514 is formed over the photosensitive layer 114e and covers the sidewalls and the top surface of chip 508.

In some embodiments, the photosensitive layer 514 is made of a photoresist material, so that it can be easily patterned in subsequent processes. In some embodiments, the photosensitive layers 514 and 114e are made of different materials. In some embodiments, the thickness of photosensitive layer 514 is in a range of about 20 μm to about 40 μm. The photosensitive layer 514 should be thick enough to cover the chip 508. On the other hand, the photosensitive layer 514 may not be too thick when it is used in a flexible device to have a better flexibility.

Figure 5D:
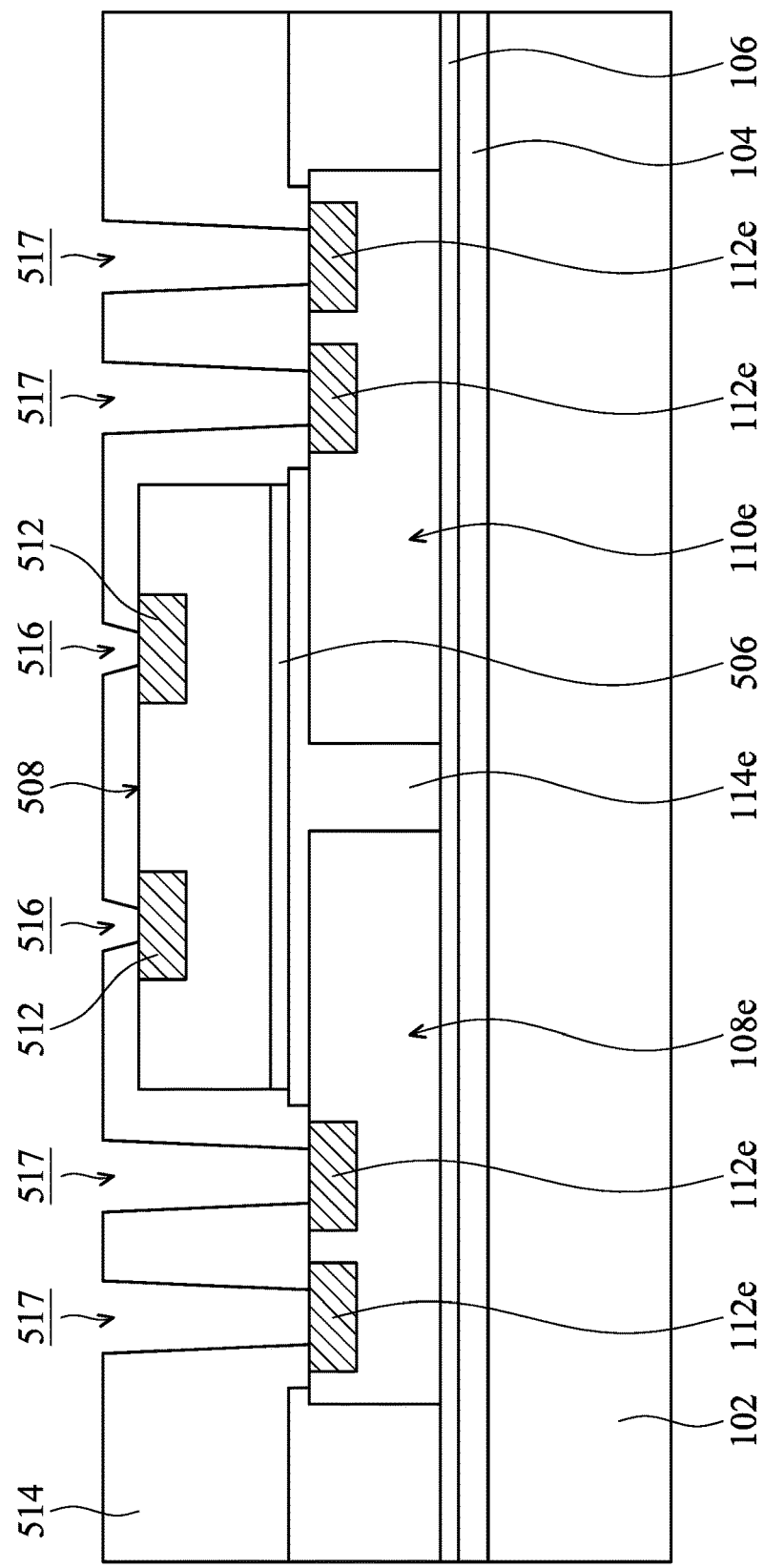

After the photosensitive layer 514 is formed, openings 516 and trenches 517 are formed in the photosensitive layer 114, as shown in FIG. 5D in accordance with some embodiments. The openings 516 expose the conductive pads 512 in the chip 508e and the trenches 517 expose the conductive pads 112e in the chips 108e and 110e in accordance with some embodiments.

As described previously, the photosensitive layer 514 may be made of a photosensitive material, such as a photoresist material, so that it can be patterned easily. Since the photosensitive layer 514 is made of a photosensitive material instead of a molding compound, the photosensitive layer 514 does not include fillers, which a molding compound usually includes. Thus, the photosensitive layer 514 can be patterned by performing an exposure process and a development process. In some embodiments, the photosensitive layers 114e and 514 are made of different photoresist materials.

Figure 5E:
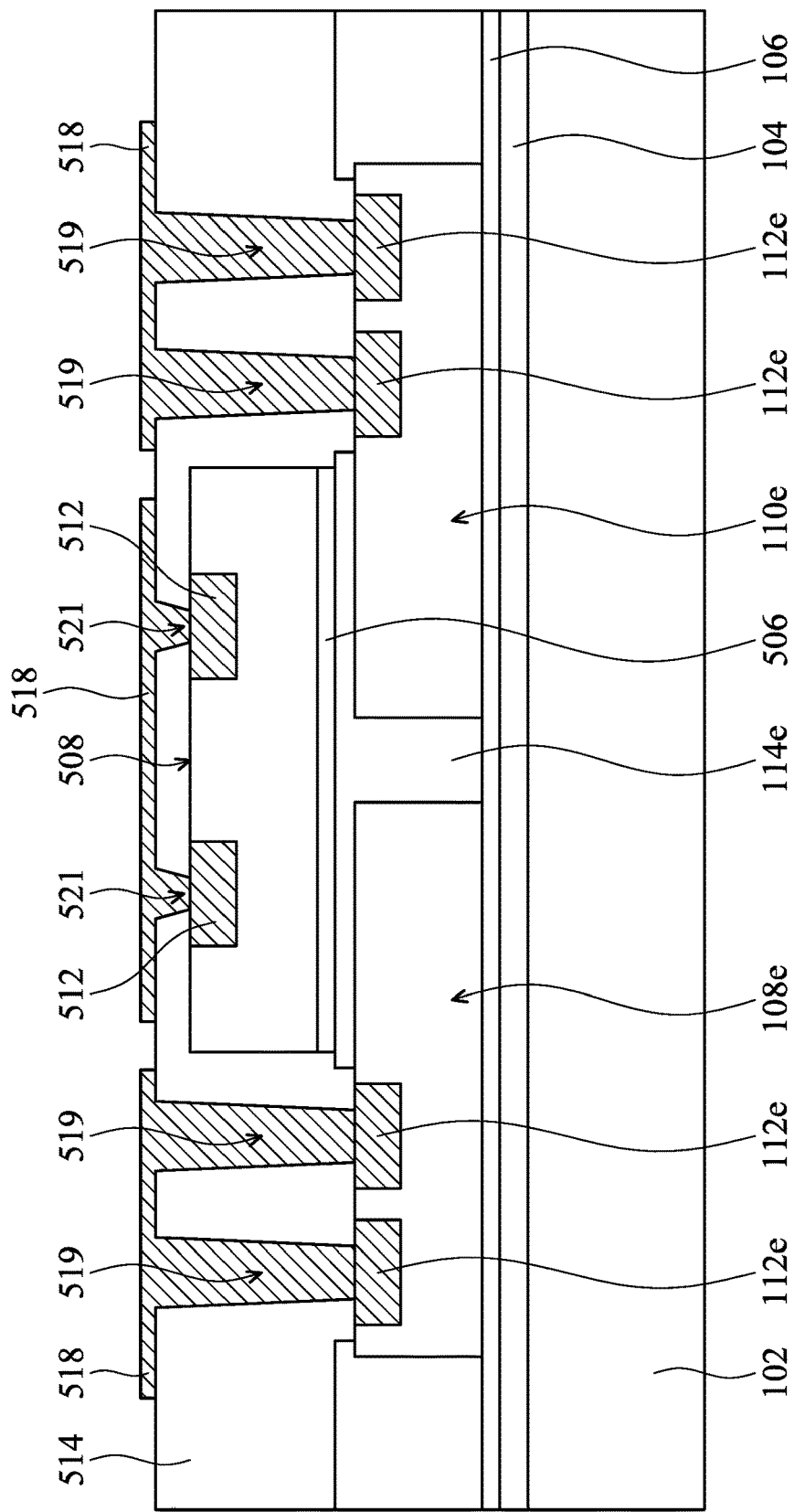

Next, conductive pillars 519, microvias 521, and redistribution layer 518 are formed, as shown in FIG. 5E in accordance with some embodiments. As shown in FIG. 5E, the trenches 517 are completely filled with a conductive material to form conductive pillars 519. In addition, the openings 516 are completely filled with a conductive material to form microvias 521. The redistribution layer 518 is formed over the photosensitive layer 514 and is connected with the conductive pillars 519 and microvias 521. As shown in FIG. 5E, the microvias 521 are electrically connected to the conductive pads 512 in the chip 508, and the conductive pillars 519 are electrically connected to the conductive pads 112e in the chips 108e and 110e.

Figure 5F:
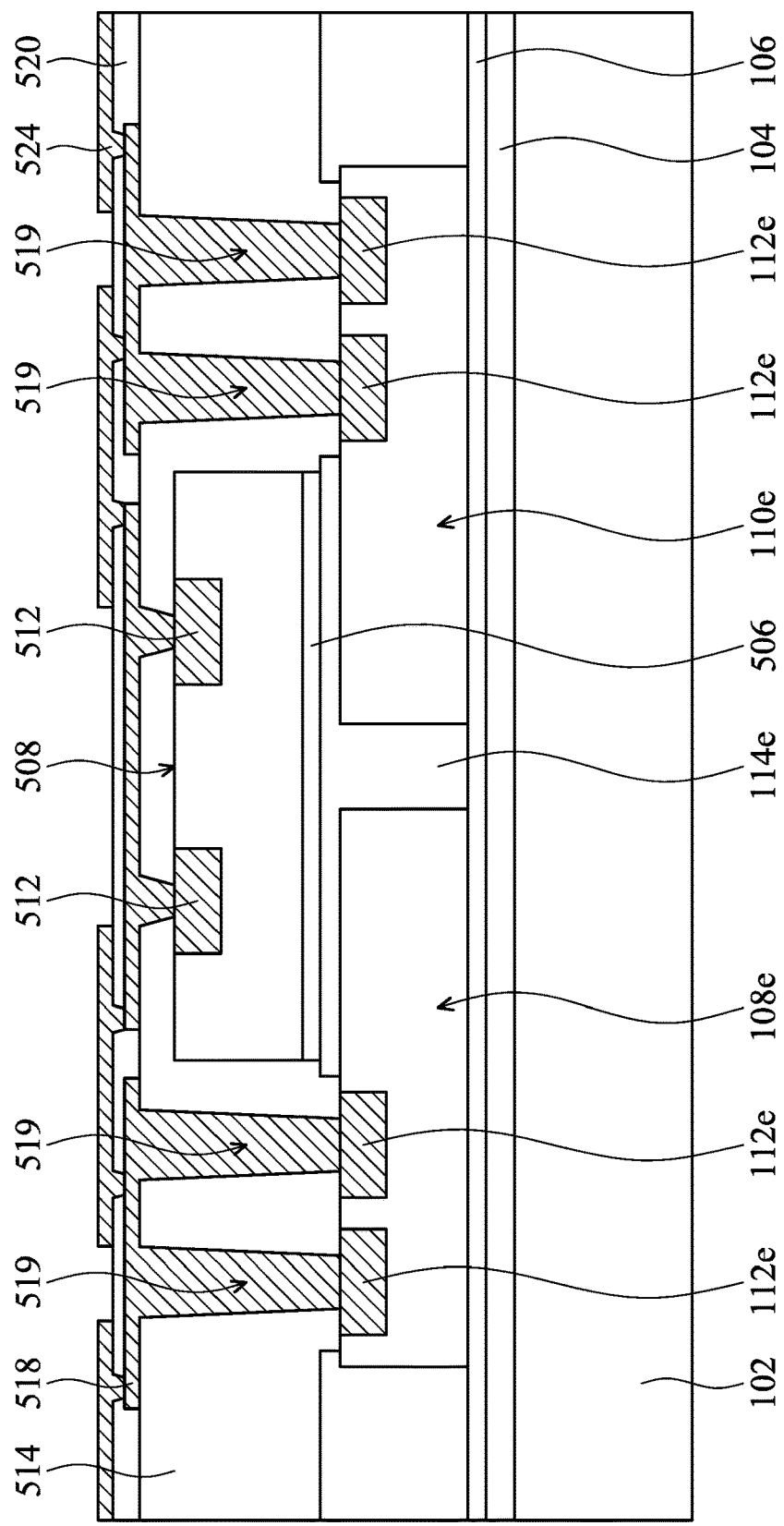

After the redistribution layer 518 is formed, a dielectric layer 520 is formed over the photosensitive layer 514 and covers the redistribution layer 518, and structure redistribution layer 524 is formed over the dielectric layer 520, as shown in FIG. 5F in accordance with some embodiments. In addition, the redistribution layer 524 is electrically connected with the redistribution layer 518.

In some embodiments, the conductive pillars 519, the microvias 521, and the redistribution layers 518 and 524 are made of metal, such as Cu, Cu alloy, Al, Al alloy, W, W alloy, Ti, Ti alloy, Ta, Ta alloy, or a combination thereof. In some embodiments, the dielectric layer 520 is made of PBO, BCB, silicone, acrylates, siloxane, another suitable material, or a combination thereof. In some other embodiments, the dielectric layer 520 is made of non-organic materials. The non-organic materials includes silicon oxide, un-doped silicate glass, silicon oxynitride, SR, silicon nitride, silicon carbide, HMDS, another suitable material, or a combination thereof.

It should be noted that, although the redistribution layers 518 and 524 are shown in FIG. 5F, the scope of the disclosure is not intended to be limiting. For example, additional redistribution layers may be formed. Multiple deposition, coating, and/or etching processes may be used to form the redistribution layer.

Figure 5G:
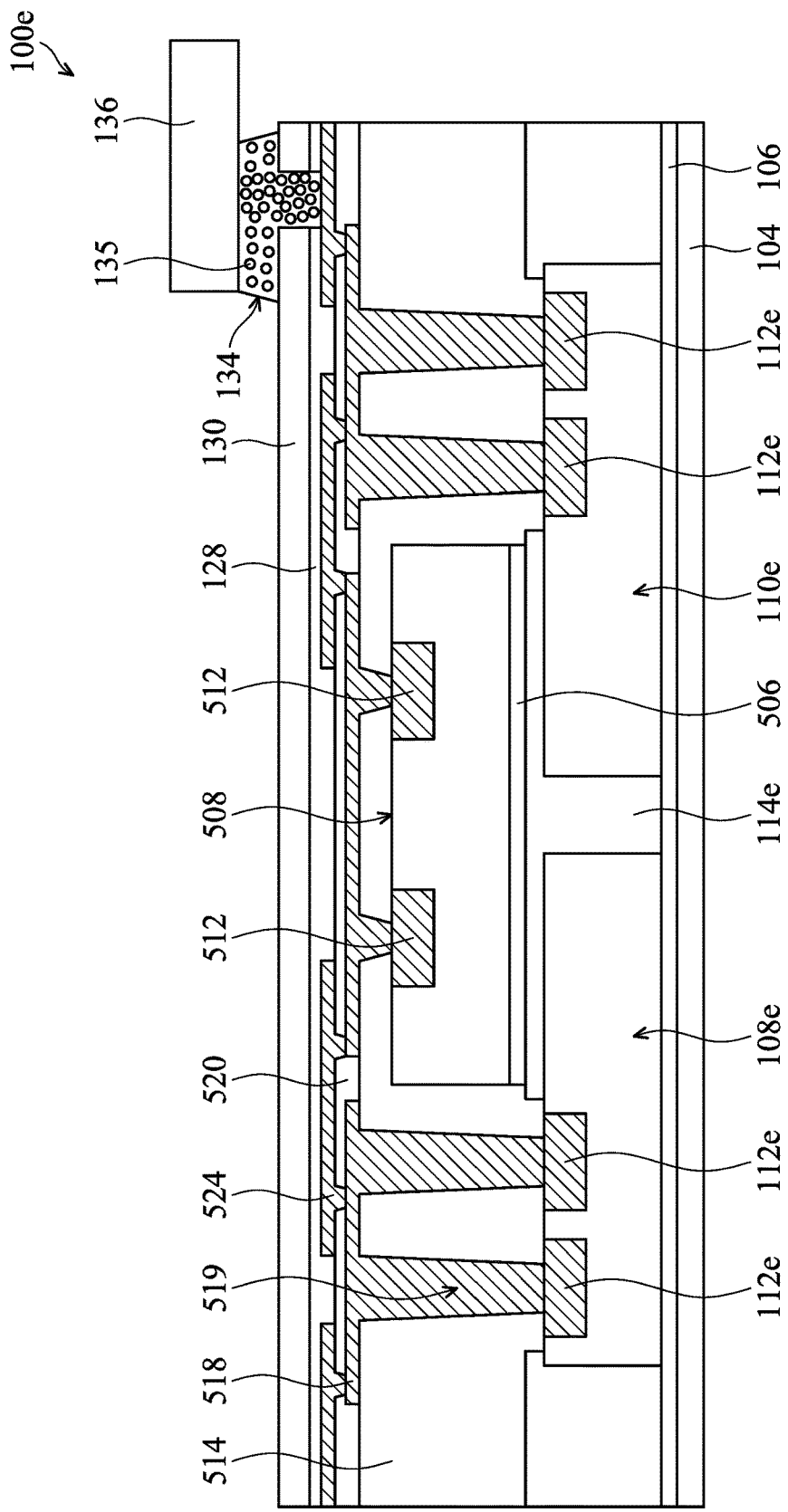

After the redistribution layer 524 is formed, processes similar to, or the same as, those shown in FIGS. 1H to 1K may be performed to form the chip package structure 100e. As shown in FIG. 5G, the adhesive layer 128 and the second protection layer 130 formed over the redistribution layer 524. In addition, the printed circuit board 136 is bonded to the redistribution layer 524 through the anisotropic conductive paste 134.

FIGS. 6A to 6D are cross-sectional representations of various stages of forming a chip package structure 100f in accordance with some embodiments. The chip package structure 100f may be similar to, or the same as, the chip package structure 100e, except the structure of the conductive pillar are different. Some processes and materials used to form the chip package structure 100f are similar to, or the same as, those used to form the chip package structure 100e shown in FIGS. 5A to 5G and may not be repeated herein.

Figure 6A:
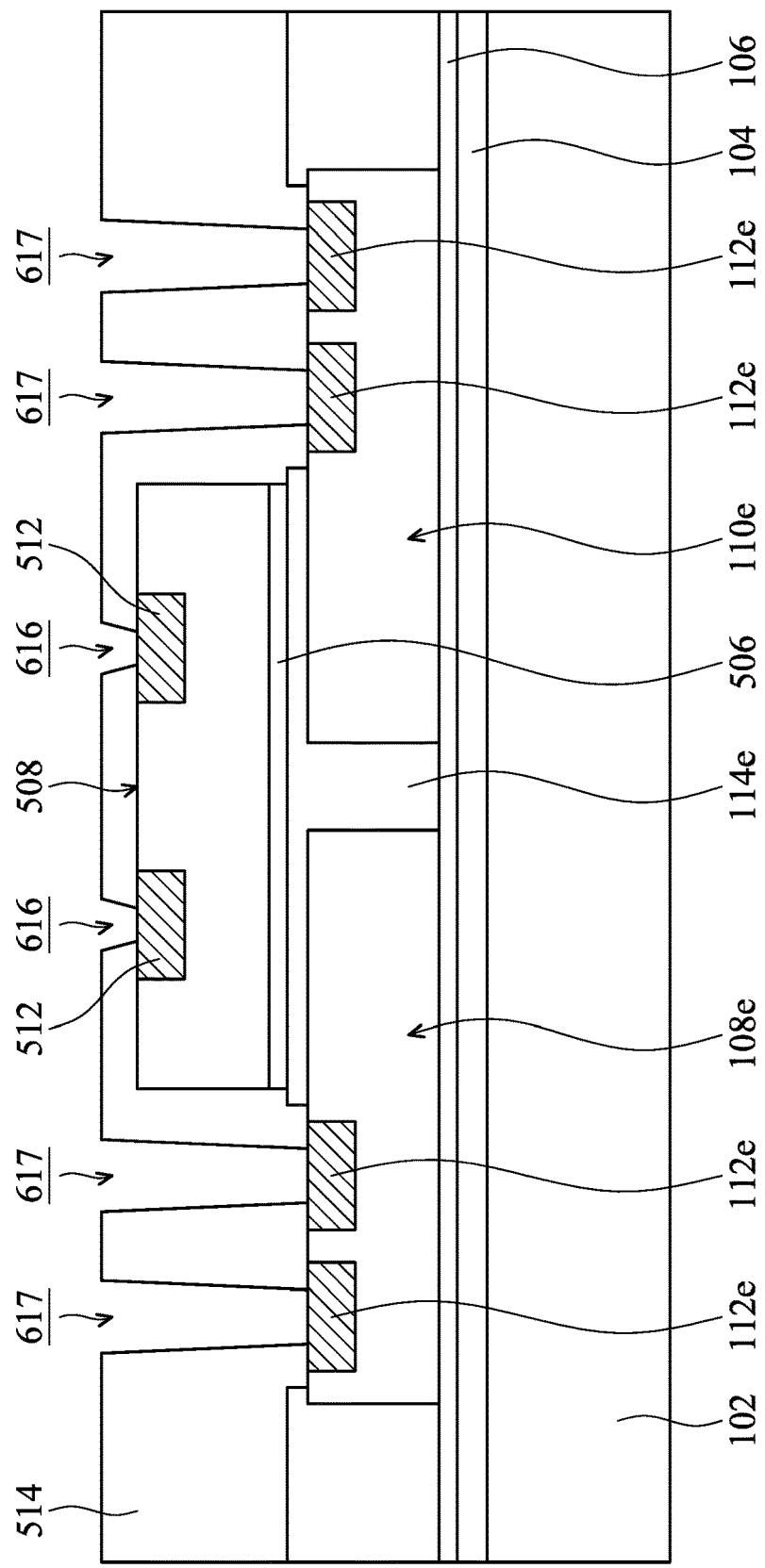
FIGS. 6A to 6D are cross-sectional representations of various stages of forming a chip package structure in accordance with some embodiments.

More specifically, processes shown in FIGS. 5A to 5D may be performed to form the first protection layer 104 and the adhesive layer 106 over the carrier substrate 102 and to dispose the chips 108e and 110e over the first protection layer 104. In addition, the photosensitive layer 114e is formed to encapsulate the chips 108e and 110e, and the chip 506 is disposed over the photosensitive layer 114e and is encapsulated by the photosensitive layer 514. Afterwards, openings 616 and trenches 617 are formed in the photosensitive layer 514. As shown in FIG. 6A, the conductive pads 512 in the chip 508 are exposed by the openings 616, and the conductive pads 112e in the chips 108e and 110e are exposed by the trenches 617 in accordance with some embodiments.

Figure 6B:
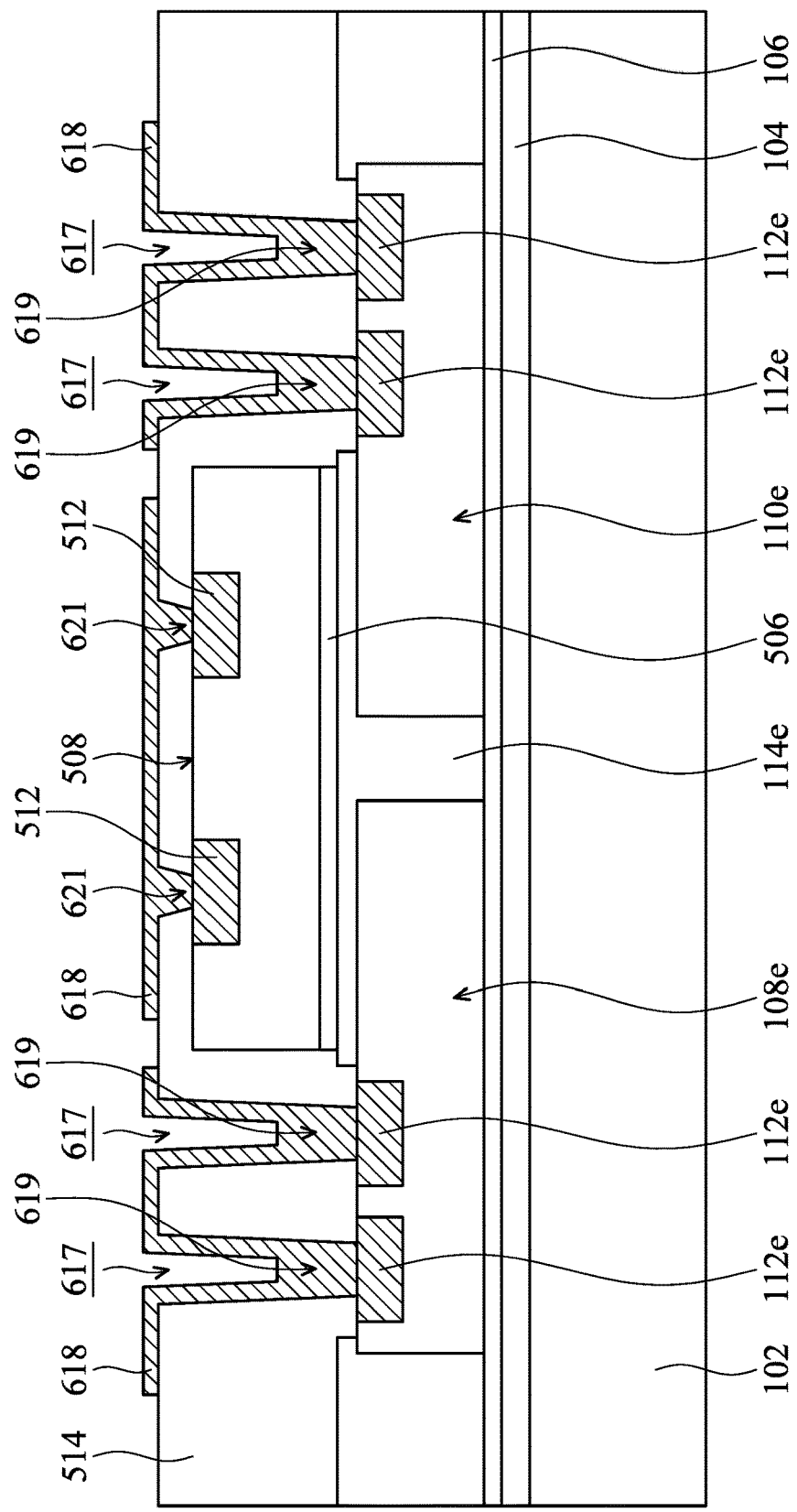

After the openings 616 and the trenches 617 are formed, microvias 621 and bottom conductive portions 619 are formed respectively therein, as shown in FIG. 6B in accordance with some embodiments. More specifically, the microvias 621 are formed in the openings 616, while the bottom conductive portions 619 are formed at the bottom portion of trenches 617. In addition, a redistribution layer 618 is formed over the photosensitive layer 514 and is connected with the microvias 621 and the bottom conductive portions 619.

In some embodiments, the openings 616 are fully filled with a conductive material to form microvias 621. However, the trenches 617 are not fully filled with conductive material. As shown in FIG. 6B, the bottom conductive portions 619 substantially conformally covers the bottom portion of the trenches 617 and the sidewalls of the top portions of the trenches 617, thereby forming a hollow pillar structure that enables electrical connection to the conductive pad(s) 112e.

Figure 6C:
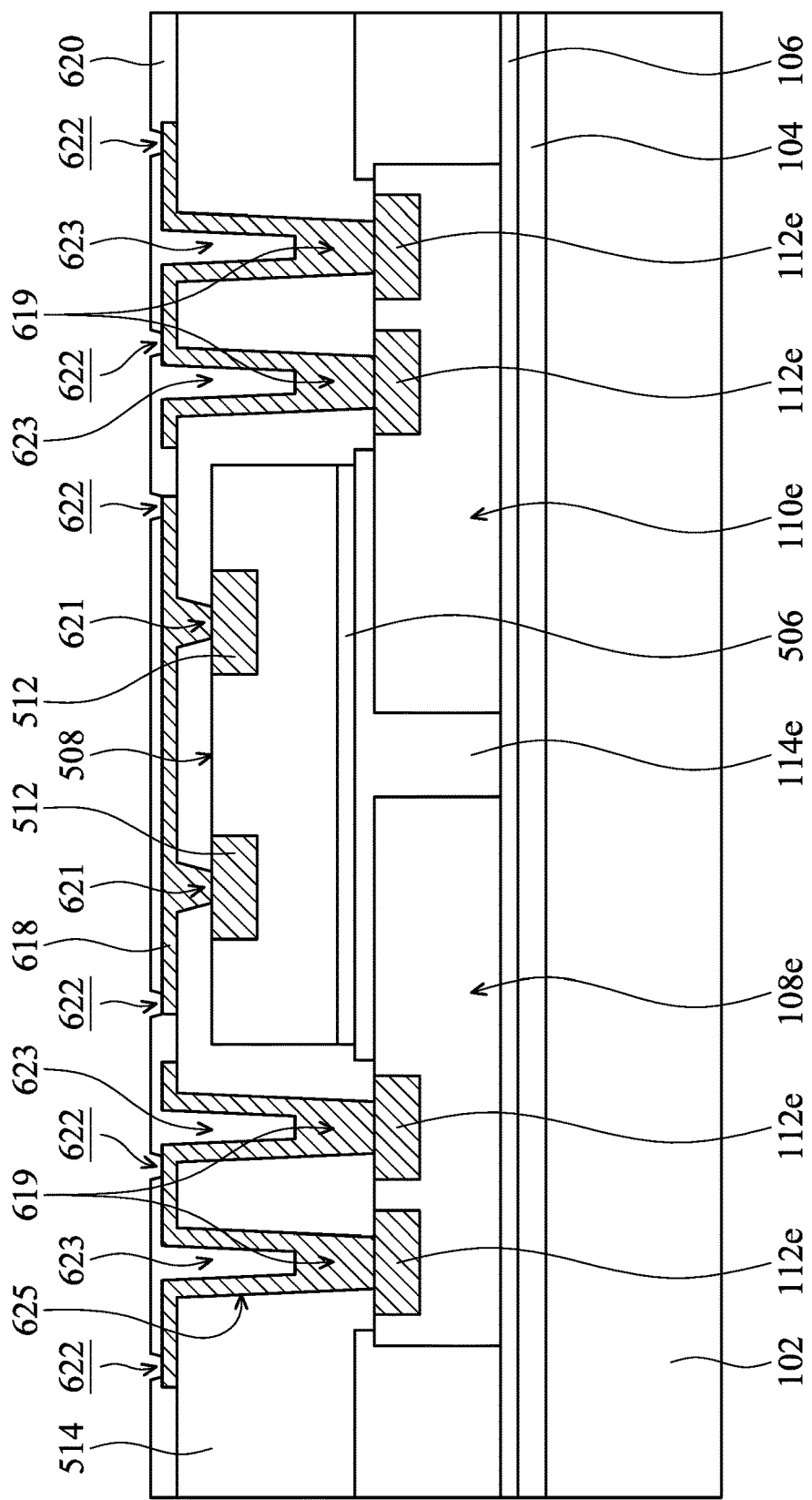

After the redistribution layer 618 is formed, a dielectric layer 620 is formed over the redistribution layer 618, as shown in FIG. 6C in accordance with some embodiments. In addition, dielectric portions 623 are disposed in the trenches 617 in accordance with some embodiments. As shown in FIG. 6C, each of the composite pillar 625 includes the bottom conductive portion 619 at its bottom portion and the dielectric portion 623 at its top portion. For example, the bottom conductive portion 619 includes extending portions extending up to the sidewalls of the dielectric portion 623, such that the dielectric portion 623 is surrounding by the bottom conductive portion 619. The composite pillar 625 may further increase flexibility and ensure reliability of the chip package structure.

As shown in FIG. 6C, the microvias 621 are connected with the conductive pads 512 of the chips 508, and the composite pillars 625 are connected with the conductive pads 112e of the chips 108e and 110e in accordance with some embodiments. In addition, openings 622 are formed in the dielectric layer 620 to expose some portions of the redistribution layer 618, as shown in FIG. 6C in accordance with some embodiments.

Figure 6D:
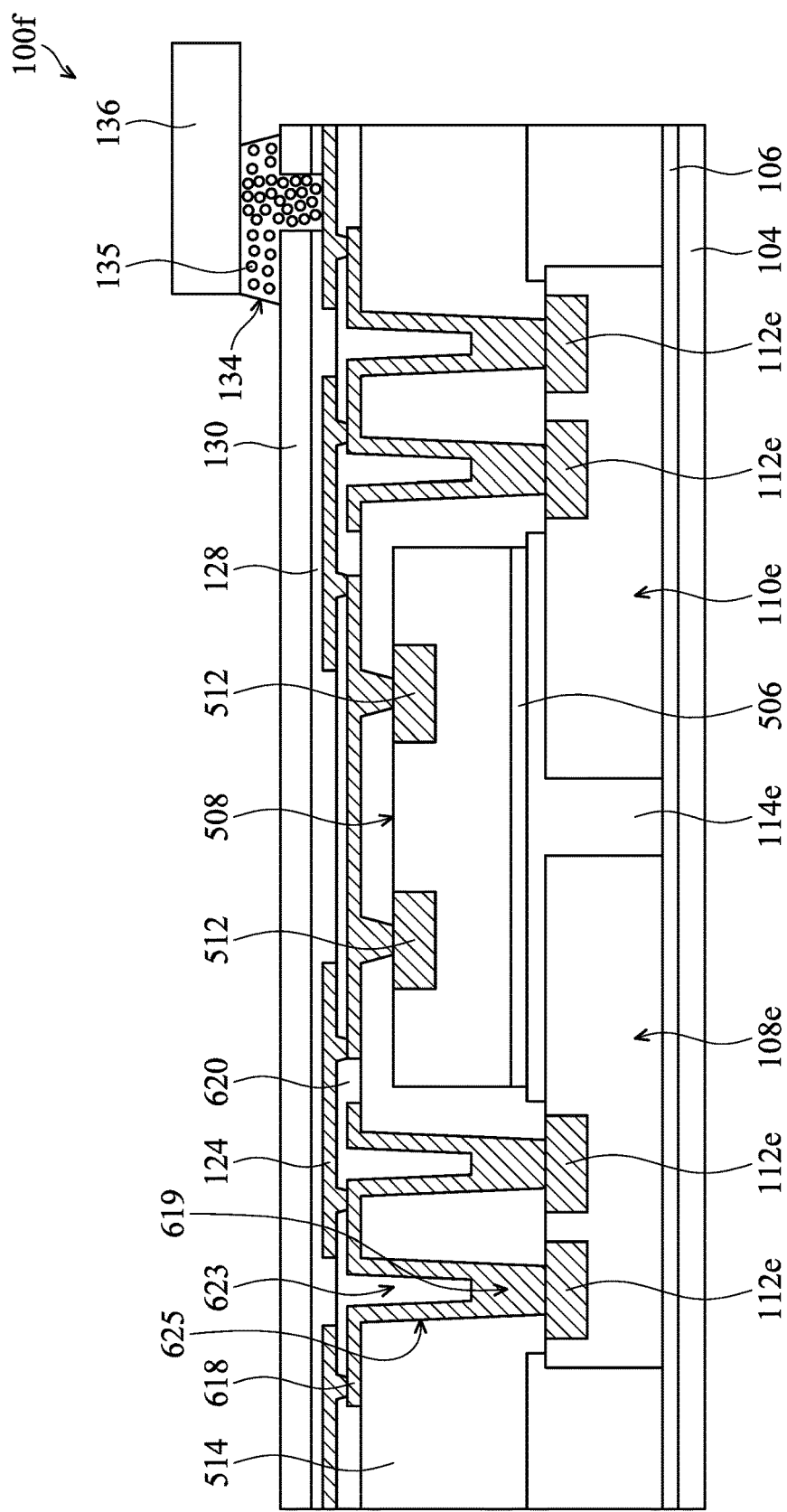

After the dielectric layer 620 is formed, processes shown in FIGS. 1G to 1K may be performed to form the chip package structure 100f. As shown in FIG. 6D, the redistribution layer 124, the adhesive layer 128, and the second protection layer 130 are formed. In addition, the printed circuit board 136 is bonded to the redistribution layer 124 through the anisotropic conductive paste 134.

As shown in FIG. 6D, the composite pillar 625 includes the bottom conductive portion 619 at its bottom portion and the dielectric portion 623 at its top portion. In addition, the bottom conductive portion 619 includes extending portions extending upwardly and located at the sidewalls of the dielectric portion 623. The formation of the composite pillar 625 may be cheaper and faster than that of the one fully filled with a conductive material. Therefore, the cost of forming the chip package structure 100f may be reduced. In addition, the stress induced by the conductive pillar 629 having the dielectric layer 620 surrounded by a bottom conductive portion 619 may be lower than that induced by the one fully filled with a conductive material.

Figure 7A:
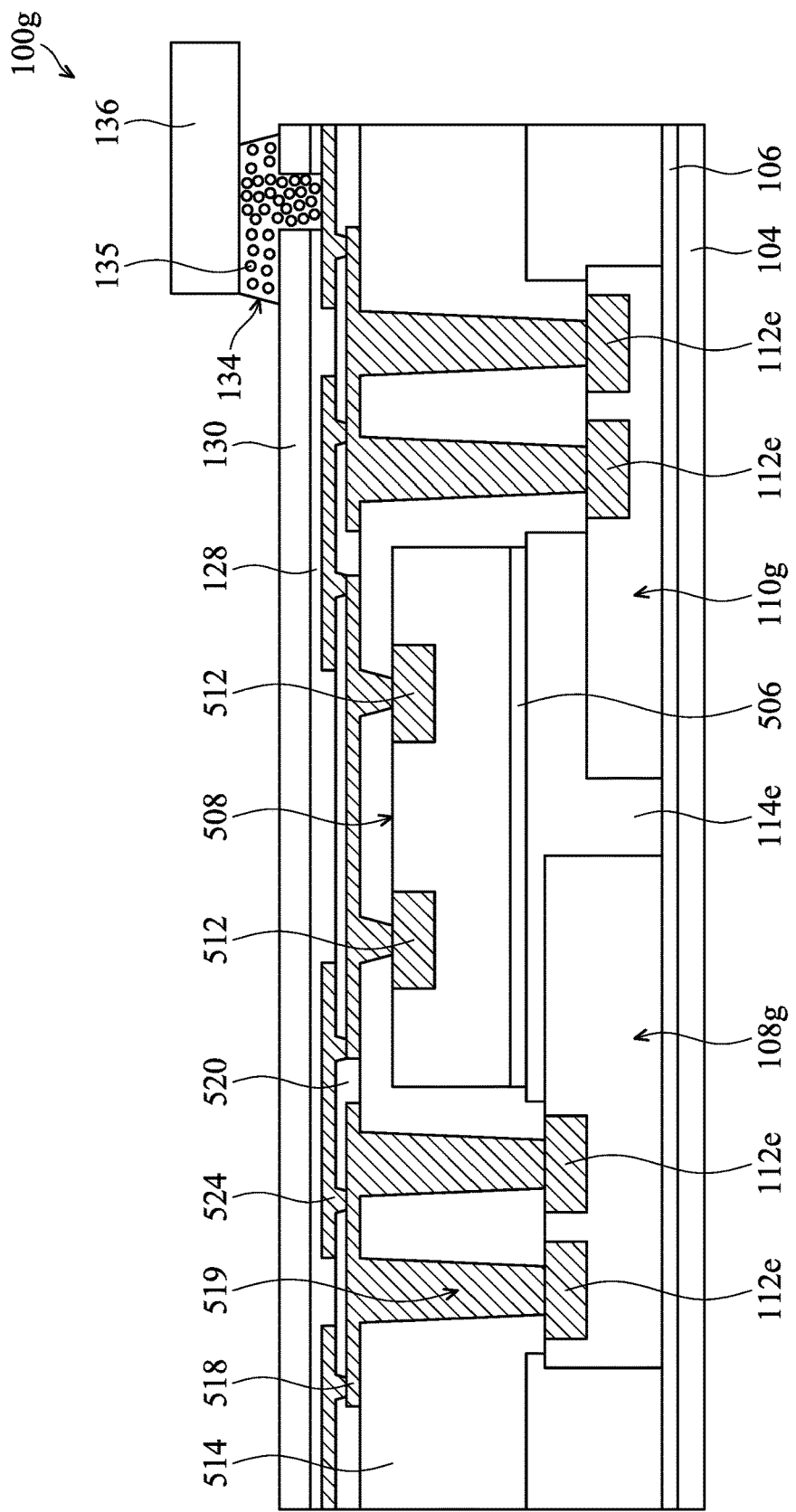
FIGS. 7A to 7B are cross-sectional representations of chip package structures in accordance with some embodiments.

FIG. 7A is a cross-sectional representation of a chip package structure 100g in accordance with some embodiments. The chip package structure 100g is similar to, or the same as, the chip package structure 100e described previously, except chips 108g and 110g in FIG. 7A have different heights. Some processes and materials used to form the chip package structure 100g are similar to, or the same as, those used to form the chip package structure 100e shown in FIGS. 5A to 5G and are not repeated herein.

Similar to the chip package structure 100e, the chip package structure 100g includes the first protection layer 104 and the adhesive layer 106. The chips 108g and 110g are disposed over the first protection layer 104. The chips 108g and 110g are similar to the chips 108 and 110 described previously, except the heights of chips 108g and 110g are different. After the chips 108g and 110g are disposed, processes shown in FIGS. 5A to 5G may be performed to form the chip package structure 100g.

As shown in FIG. 7A, the chips 108g and 110g are covered by the photosensitive layer 114, and the thicknesses of the photosensitive layer 114 formed over the chips 108g and 110g are different. Accordingly, although the chips 108g and 110g have different heights, the photosensitive layer 114 can still have a flat top surface, and the chip 508 can be disposed over the flat top surface of the photosensitive layer 114.

Figure 7B:
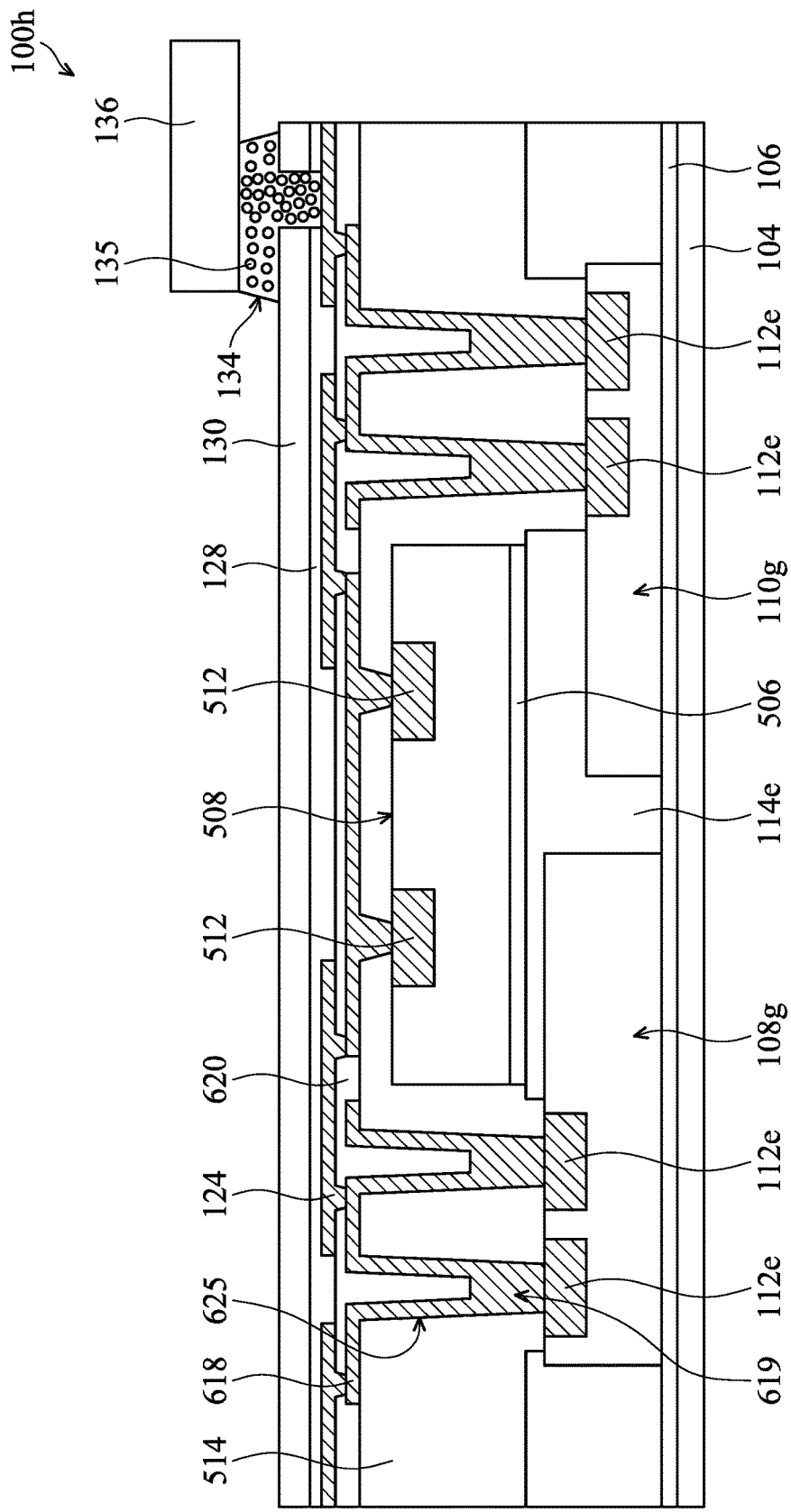

FIG. 7B is a cross-sectional representation of a chip package structure 100h in accordance with some embodiments. The chip package structure 100h is similar to, or the same as, the chip package structure 100f described previously, except the chips 108g and 110g in FIG. 7B have different heights (similar to those shown in FIG. 7A). Some processes and materials used to form the chip package structure 100h are similar to, or the same as, those used to form the chip package structure 100f shown in FIGS. 6A to 6D and are not repeated herein.

Similar to the chip package structure 100f, the chip package structure 100h includes the first protection layer 104 and the adhesive layer 106. The chips 108g and 110g are disposed over the first protection layer 104. The chips 108g and 110g are similar to the chips 108 and 110 described previously, except the heights of the chips 108g and 110g are different. After the chips 108g and 110g are disposed, processes shown in FIGS. 6A to 6D may be performed to form the chip package structure 100h.

As described previously, the chips 108g and 110g are covered by the photosensitive layer 114, and the thicknesses of the photosensitive layer 114 formed over the chips 108g and 110g are different. Accordingly, although the chips 108g and 110g have different heights, the photosensitive layer 114 can still have a flat top surface, and the chip 508 can be disposed over the flat top surface of the photosensitive layer 114.

Figure 8A:
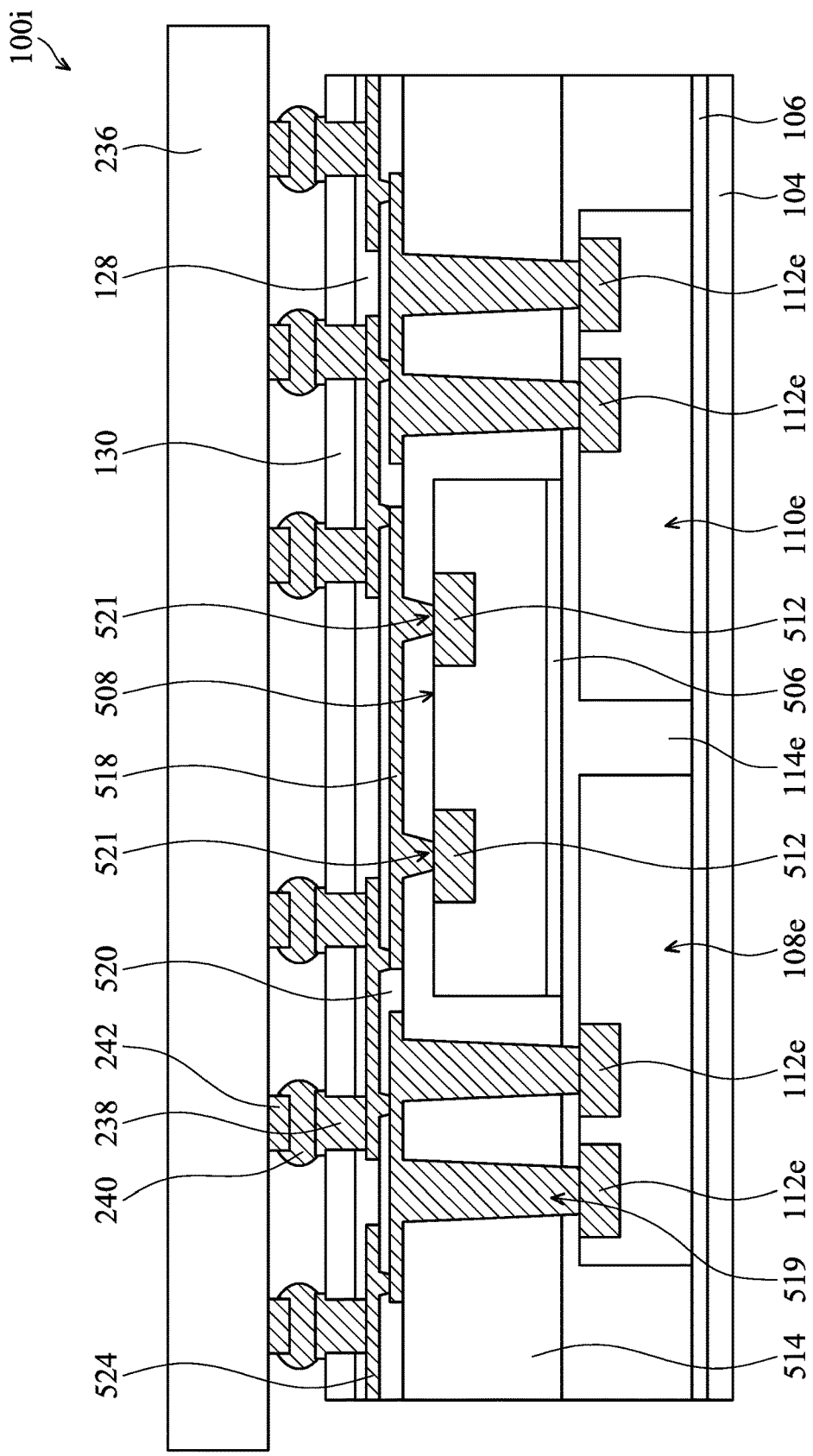
FIGS. 8A to 8B are cross-sectional representations of chip package structures in accordance with some embodiments.

FIG. 8A is a cross-sectional representation of a chip package structure 100i in accordance with some embodiments. The chip package structure 100i is similar to, or the same as, the chip package structure 100e described previously, except the printed circuit board 236 is bonded over the second protection layer 130 (similar to that shown in FIG. 2). Some processes and materials used to form the chip package structure 100i are similar to, or the same as, those used to form the chip package structures 100e shown in FIGS. 5A to 5G and are not repeated herein.

Similar to the chip package structure 100e, the chip package structure 100i includes the first protection layer 104 and the adhesive layer 106. The chips 108e and 110e are disposed over the first protection layer 104. The chips 108e and 110e are disposed over the first protection layer 104 and are covered by the photosensitive layer 114. The chip 508 is disposed over the photosensitive layer 114 and is covered by the photosensitive layer 514. The conductive pillars 519, the microvias 521, and redistribution layers 518 and 524 are formed to electrically connect to the conductive pads 112e in the chips 108e and 110e and the conductive pads 512 in the chip 508. The adhesive layer 128 and the second protection layer 130 are laminated to the redistribution layer 524.

Furthermore, the printed circuit board 236 is disposed over the second protection layer 130 and is electrically connected with the redistribution layer 524 through the UBMs 238, the solder balls 240, and the conductive pads 242.

Figure 8B:
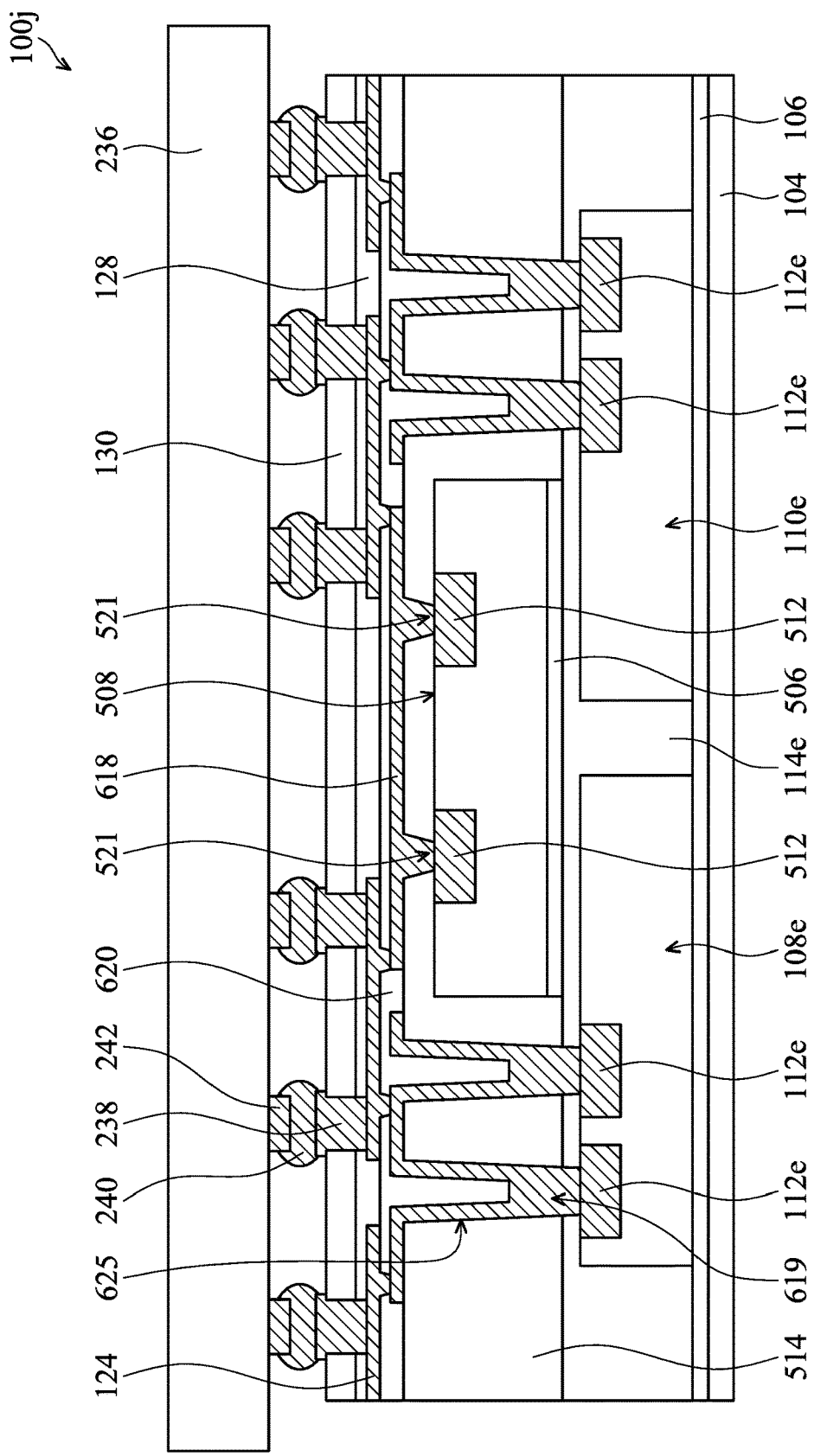

FIG. 8B is a cross-sectional representation of a chip package structure 100*j* in accordance with some embodiments. The chip package structure 100*j* is similar to, or the same as, the chip package structure 100*h* described previously, except the printed circuit board 236 is used. Some processes and materials used to form the chip package structure 100*j* are similar to, or the same as, those used to form the chip package structures 100*h* shown in FIGS. 6A to 6D and are not repeated herein.

As shown in FIG. 8B, the difference between the chip package structure 100*j* and the chip package structure 100*h* includes that the printed circuit board 236 is bonded over the second protection layer 130. The feature is similar to, or the same as, that shown in FIG. 8A described previously and is not repeated herein.

Figure 9:
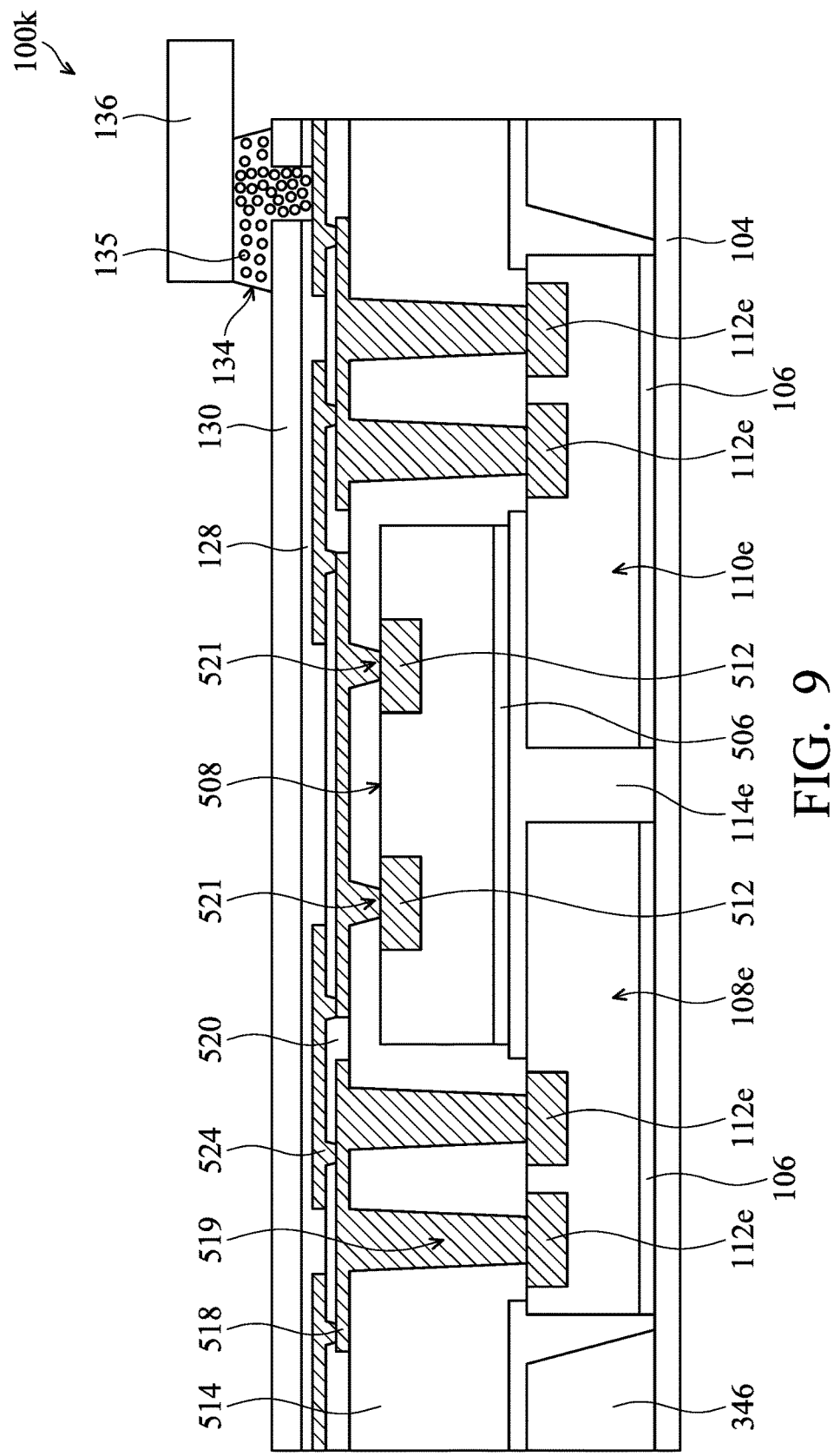
FIG. 9 is a cross-sectional representation of a chip package structure in accordance with some embodiments.

FIG. 9 is a cross-sectional representation of a chip package structure 100*k* in accordance with some embodiments. The chip package structure 100*k* is similar to, or the same as, the chip package structure 100*e* described previously, except the supporting structure 346 is formed. Some processes and materials used to form the chip package structure 100*k* are similar to, or the same as, those used to form the chip package structures 100*e* shown in FIGS. 5A to 5G and are not repeated herein.

As shown in FIG. 9, the difference between the chip package structure 100*k* and the chip package structure 100*e* includes that the supporting structure 346 is formed before the chips 108*e* and 110*e* are disposed. The feature is similar to, or the same as, that shown in FIGS. 3A to 3E described previously and is not repeated herein.

It should be noted that, although the chip package structure 100*e* shown in FIG. 9 only illustrates the supporting structure 346 formed over the first protection layer 106, additional protection structure may additionally or alternatively formed. For example, another protection structure may be formed over the photosensitive layer 114*e* and the chip 508 may be disposed in an opening of the supporting structure.

FIGS. 10A to 10I are cross-sectional representations of various stages of forming a chip package structure 100*l* in accordance with some embodiments. Some processes and materials used to form the chip package structure 100*l* are similar to, or the same as, those used to form the chip package structure 100*a* shown in FIGS. 1A to 1K and are not repeated herein.

Figure 10A:
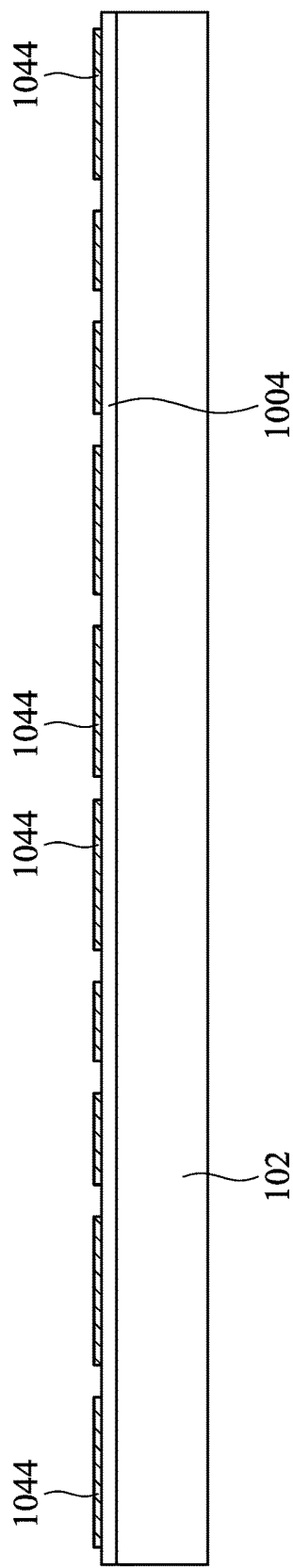
FIGS. 10A to 10I are cross-sectional representations of various stages of forming a chip package structure in accordance with some embodiments.

As shown in FIG. 10A, a first protection layer 1004 is formed over the carrier substrate 102, and a redistribution layer 1044 is formed over the first protection layer 1004, as shown in FIG. 10A in accordance with some embodiments. The first protection layer 1004 may be similar to, or the same as, the first protection layer 104 described previously.

Figure 10B:
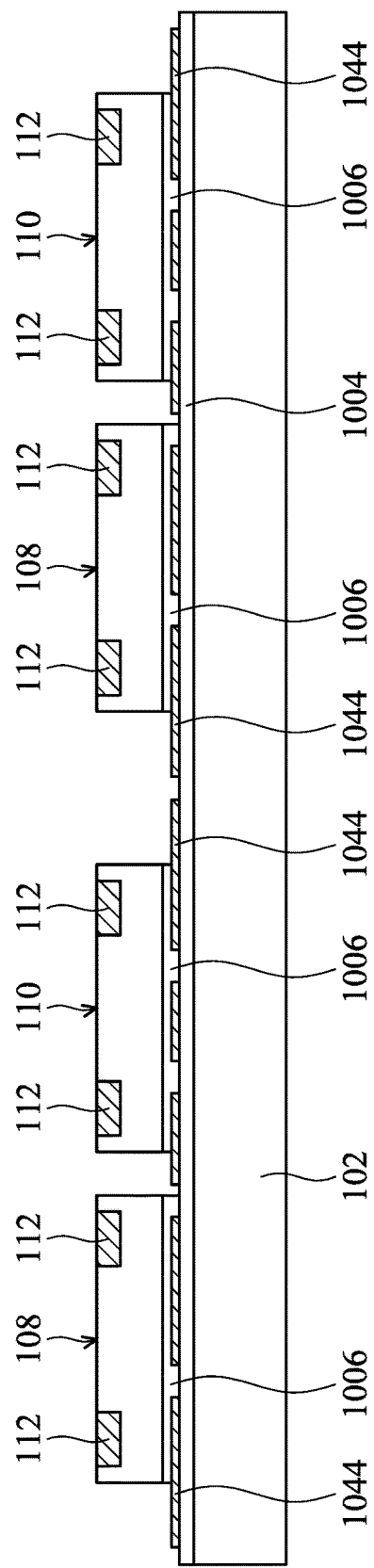

Next, the chips 108 and 110 are disposed over the redistribution layer 1044 and over the first protection layer 1004 through an adhesive layer 1006, as shown in FIG. 10B in accordance with some embodiments. The adhesive layer 1006 may be similar to, or the same as, the adhesive layer 106 described previously. In some embodiments, the chips 108 and 110 include conductive pads 112 formed at the top portion of the chips 108 and 110.

Figure 10C:
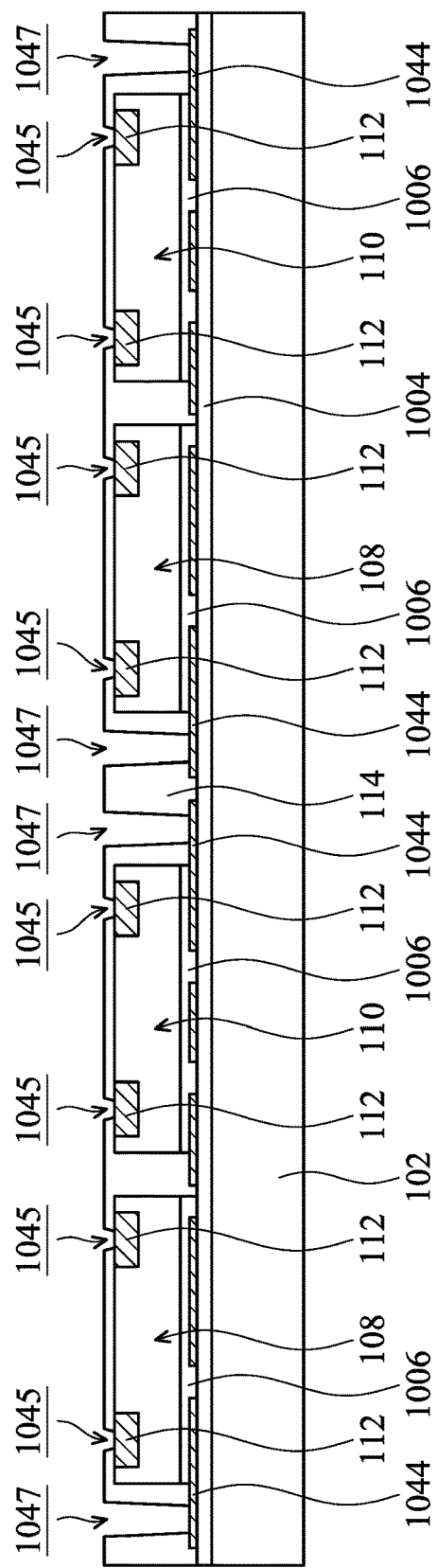

After the chips 108 and 110 are disposed, the photosensitive layer 114 is formed to cover the chips 108 and 110, as shown in FIG. 10C in accordance with some embodiments. As shown in FIG. 10C, the photosensitive layer 114 is formed over the redistribution layer 1044 and covers the sidewalls and the top surface of chips 108 and 110.

After the photosensitive layer 114 is formed, openings 1045 and trenches 1047 are formed in the photosensitive layer 114, as shown in FIG. 10C in accordance with some embodiments. The openings 1045 expose some portions of the conductive pads 112 in the chips 108 and 110, and the trenches 1047 expose some portions of the redistribution layer 1044.

Figure 10D:
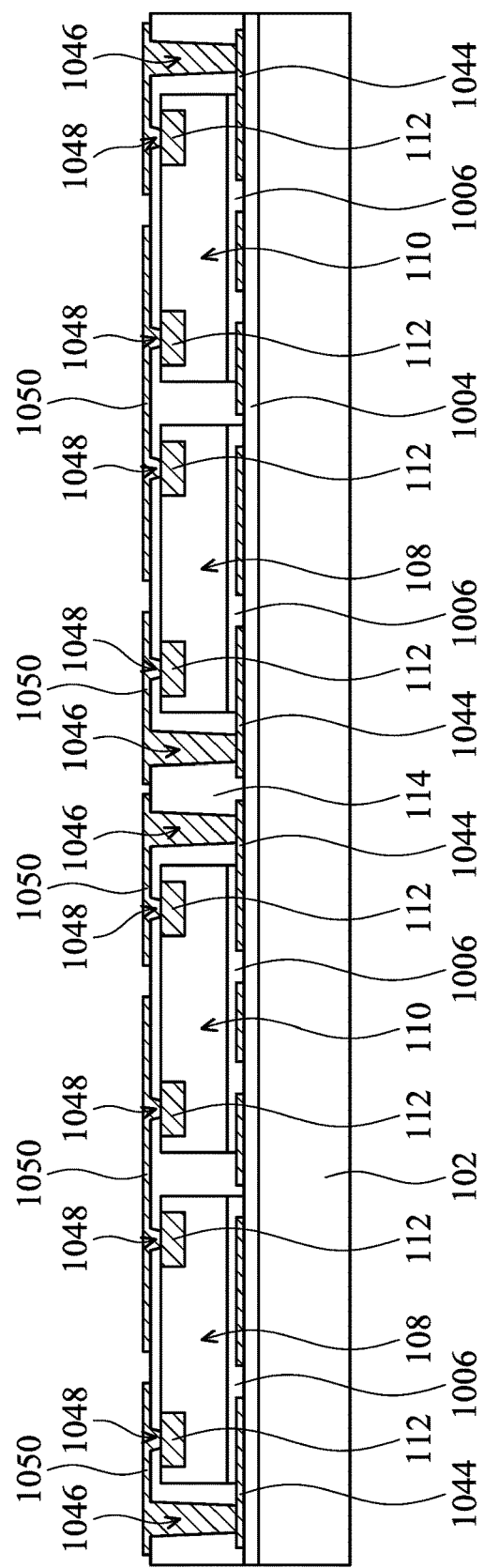

Next, microvias 1048 are formed in the openings 1045 to connect with the conductive pads 112 in the chips 108 and 110, and conductive pillars 1046 are formed in the trenches 1047 to connect with the redistribution layer 1044, as shown in FIG. 10D in accordance with some embodiments. In addition, the redistribution layer 1050 is formed over the photosensitive layer 114 and is connected with the microvias 1048 and the conductive pillars 1046.

Figure 10E:
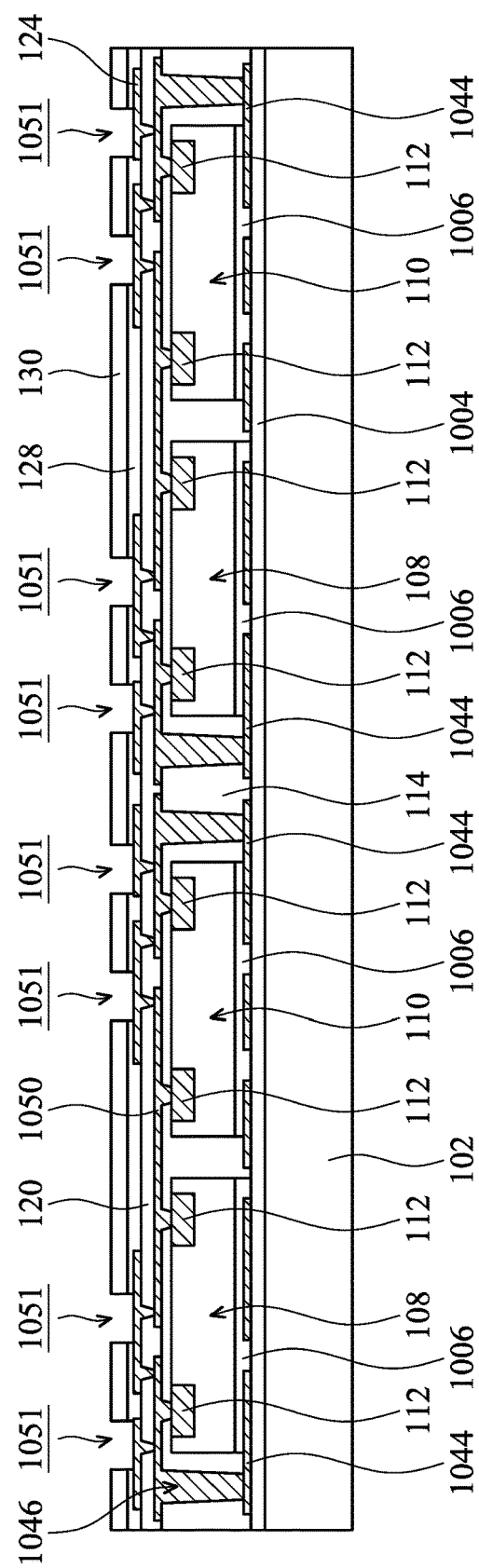
Figure 10:
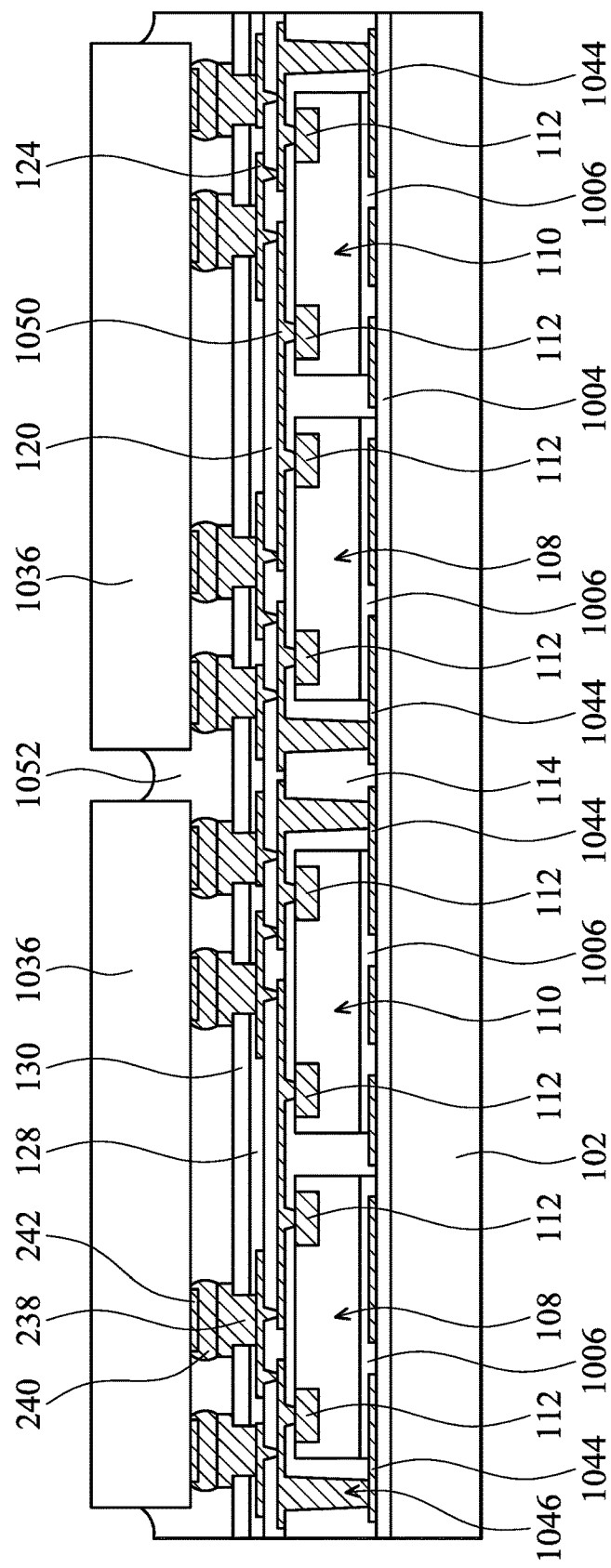

After the redistribution layer 1050 is formed, processes similar to, or the same as, those shown in FIGS. 1F to 11 may be performed. More specifically, the dielectric layer 120 and the redistribution layer 124, the adhesive layer 128, and the second protection layer 130 are formed, as shown in FIG. 10E in accordance with some embodiments. In addition, openings 1051 are formed through the adhesive layer 128 and the second protection layer 130 to expose some portions of the redistribution layer 124.

Next, top package structures 1036 are disposed over the second protection layer 130, as shown in FIG. 10F in accordance with some embodiments. The top package structures 1036 may be similar to the chip package structures described previously. In some embodiments, the top package structures 1036 include package substrates and chips bonded to the package substrates. The top package structures 1036 are bonded to the redistribution layer 124 through the UBMs 238, the solder balls 240, and conductive pads 242. In some embodiments, one top package structure 1036 is bonded to two chips (e.g. one chip 108 and one chip 110) through the UBMs 238, the solder balls 240, and conductive pads 242. In addition, a material layer 1052, such as an adhesive, is used to fill in the gaps between the elements described above.

Figure 10G:
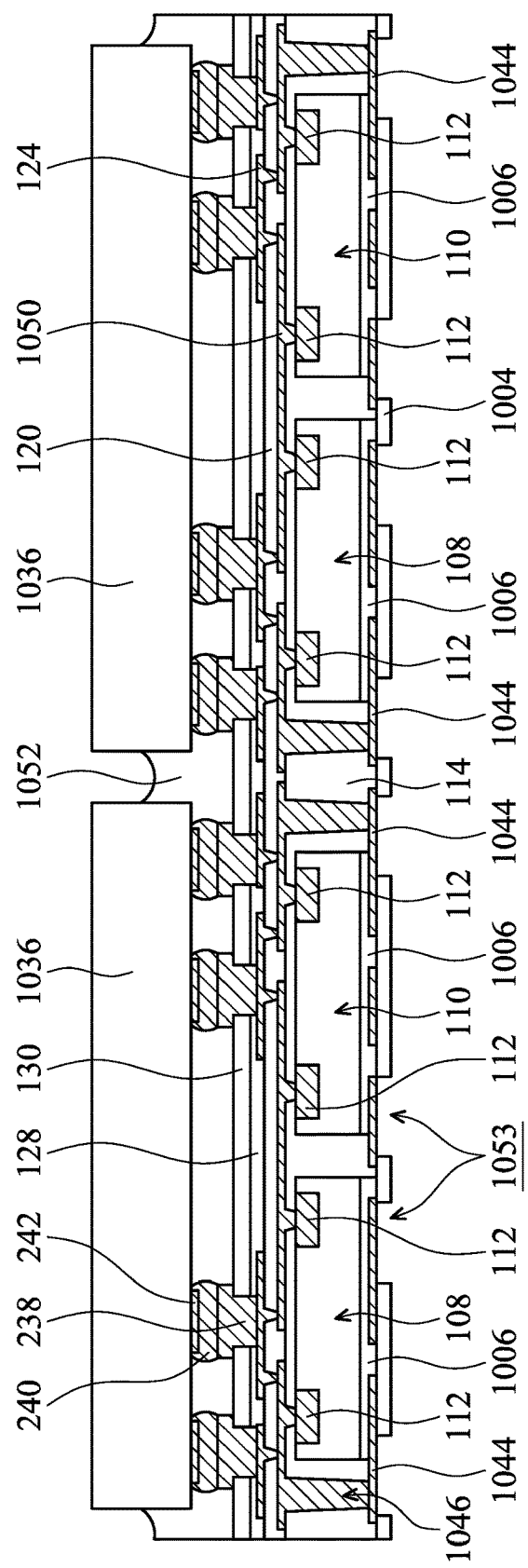
Figure 10H:
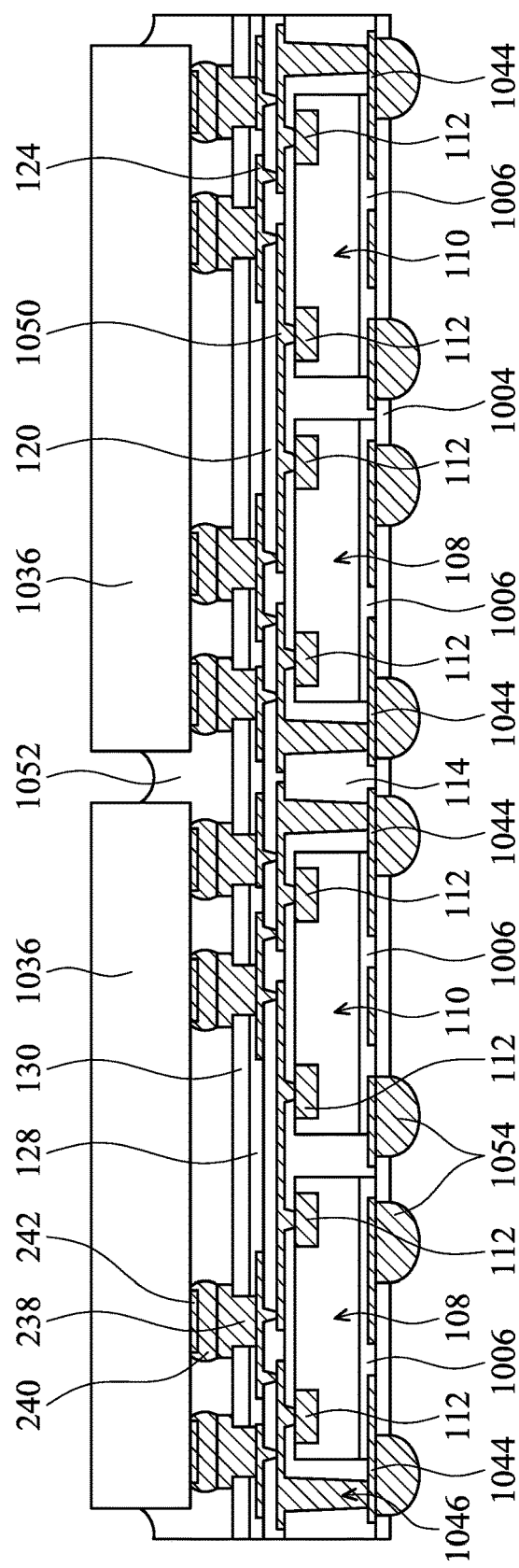
Figure 10:
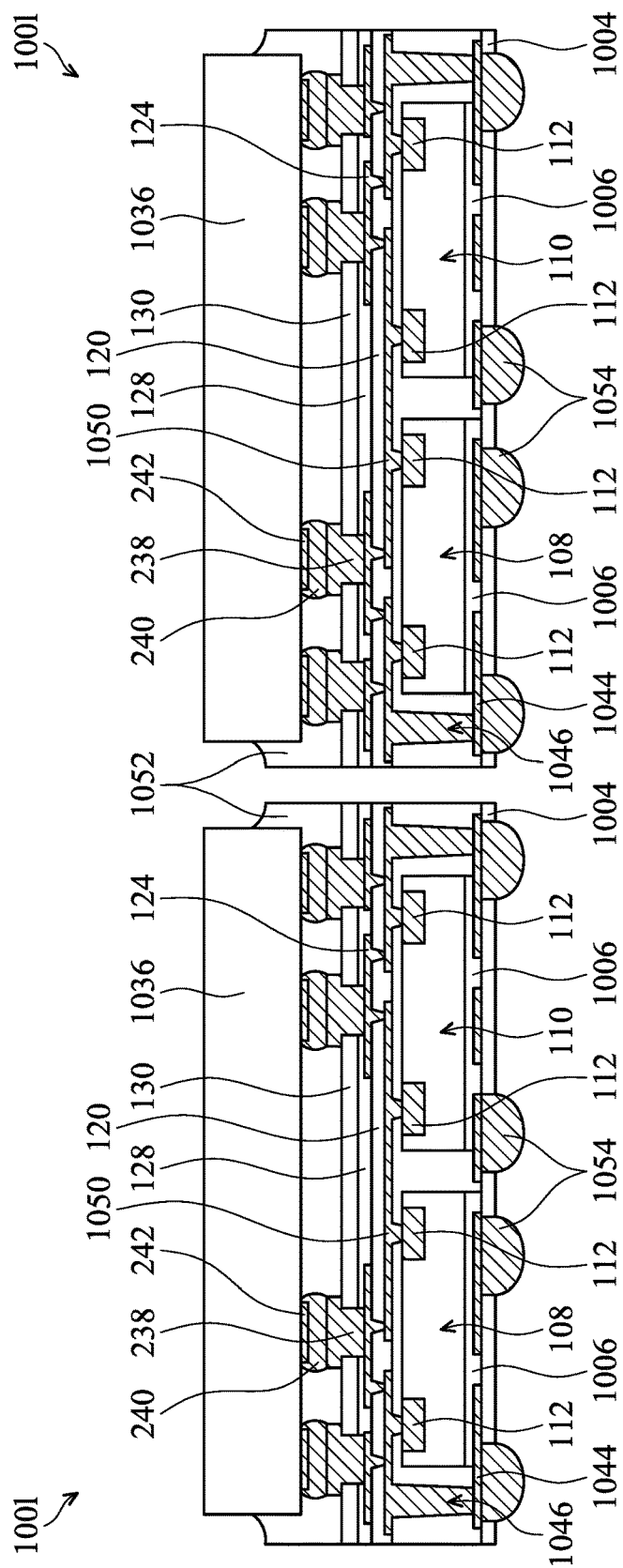

After the top package structures 1036 are bonded to the redistribution layer 124, the carrier substrate 102 is removed, as shown in FIG. 10G in accordance with some embodiments. In addition, openings 1053 are formed in the first protection layer 1004 to expose some portions of the redistribution layer 1044 in accordance with some embodiments. Next, solder balls 1054 are formed in the openings 1053 to connect with the redistribution layer 1044, as shown in FIG. 10H in accordance with some embodiments.

After the solder balls 1054 are formed, a sawing process is performed to form individual chip packages structure 100*l*, as shown in FIG. 10I in accordance with some embodiments. Each chip packages structure 100*l* may include the chips 108 and 110 encapsulated in the photosensitive layer 114 and protected by the first protection layer 1004 and the second protection layer 130. As described previously, since the chips 108 and 110 are encapsulated by the photosensitive layer 114 instead of a molding compound, the resulting chip packages structure 100*l* may be thinner and easier and cheaper to be formed.

Figure 11:
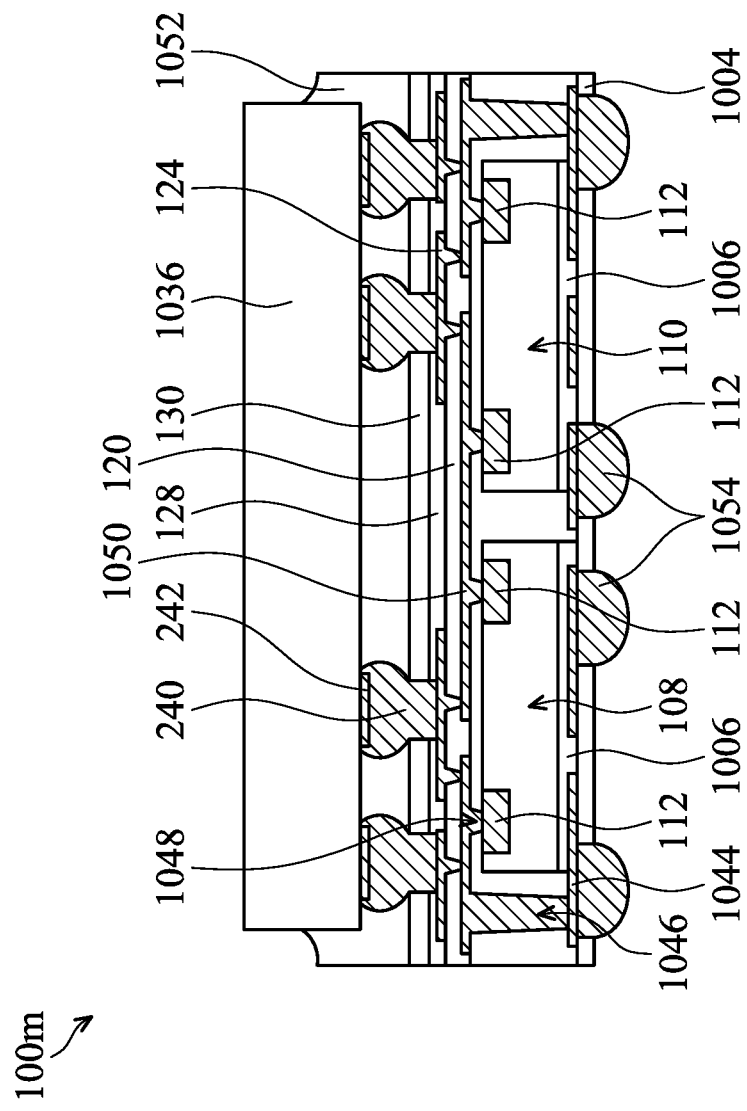
FIG. 11 is a cross-sectional representation of a chip package structure in accordance with some embodiments.

FIG. 11 is a cross-sectional representation of a chip package structure 100*m* in accordance with some embodiments. The chip package structure 100*m* is similar to, or the same as, the chip package structure 100*l* described previously, except no UBMs are used. Other processes and materials used to form the chip package structure 100*m* are similar to, or the same as, those used to form the chip package structures 100*l* shown in FIGS. 10A to 10I and are not repeated herein.

Figure 12A:
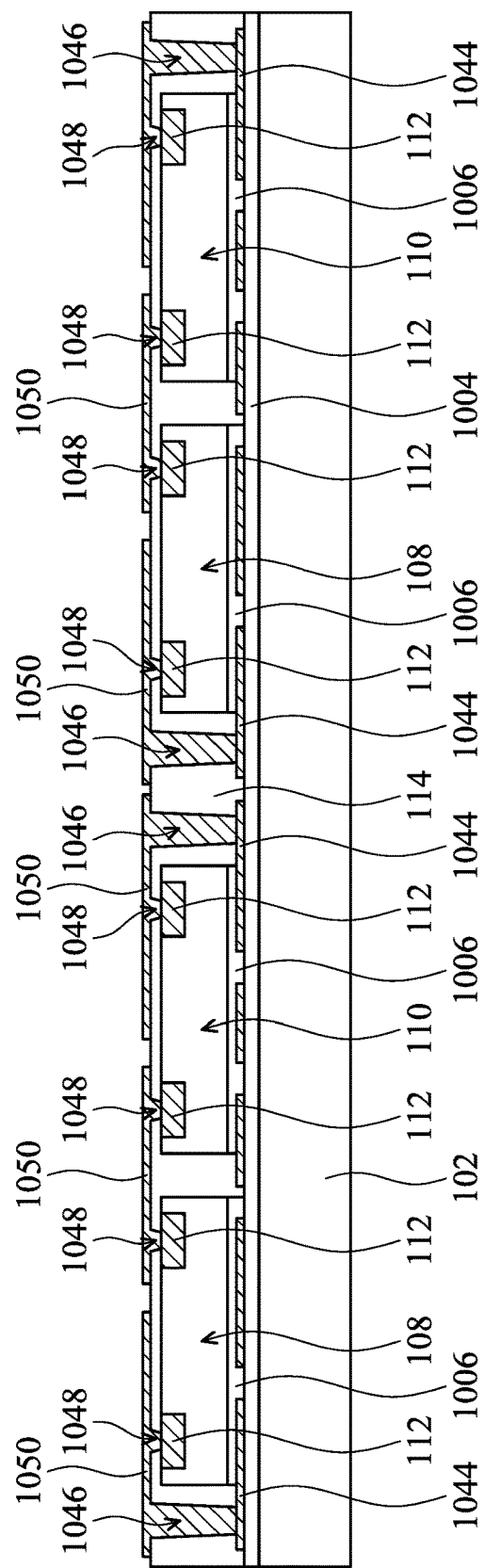
FIGS. 12A to 12C are cross-sectional representations of various stages of forming a chip package structure in accordance with some embodiments.
Figure 12B:
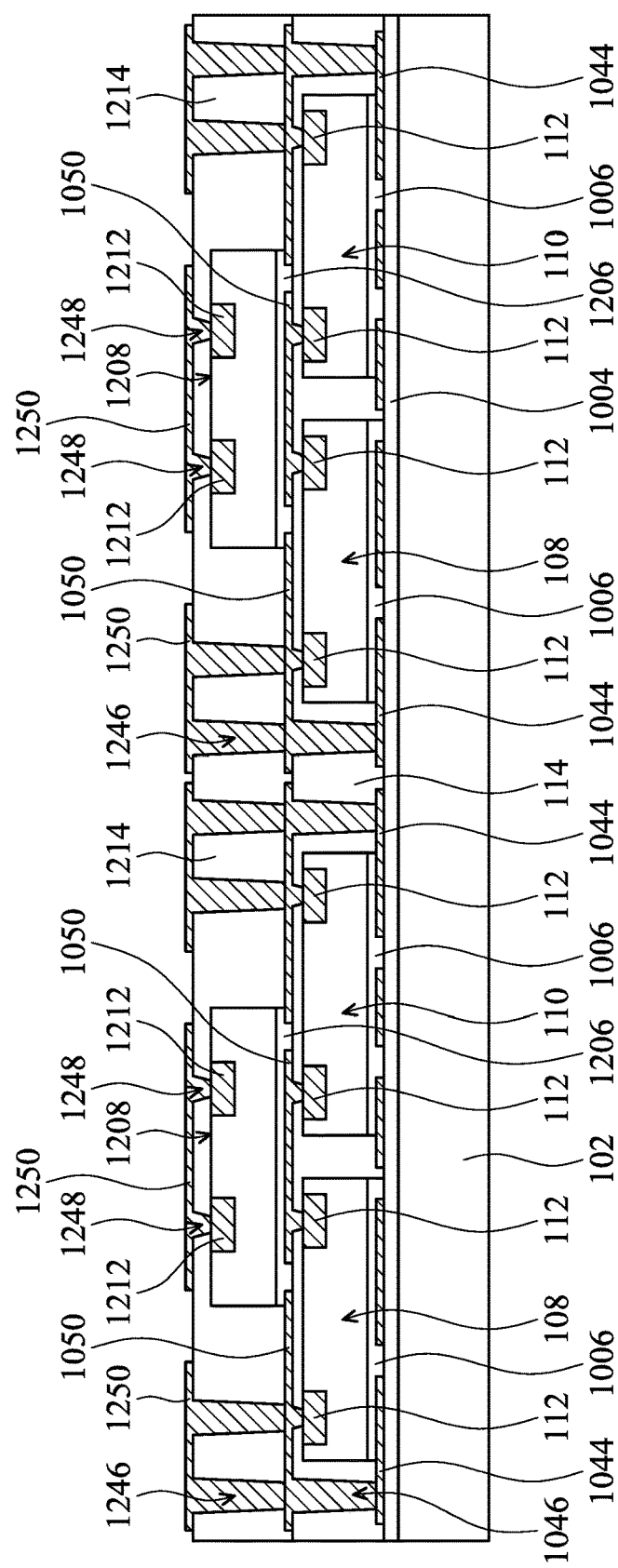
Figure 12C:
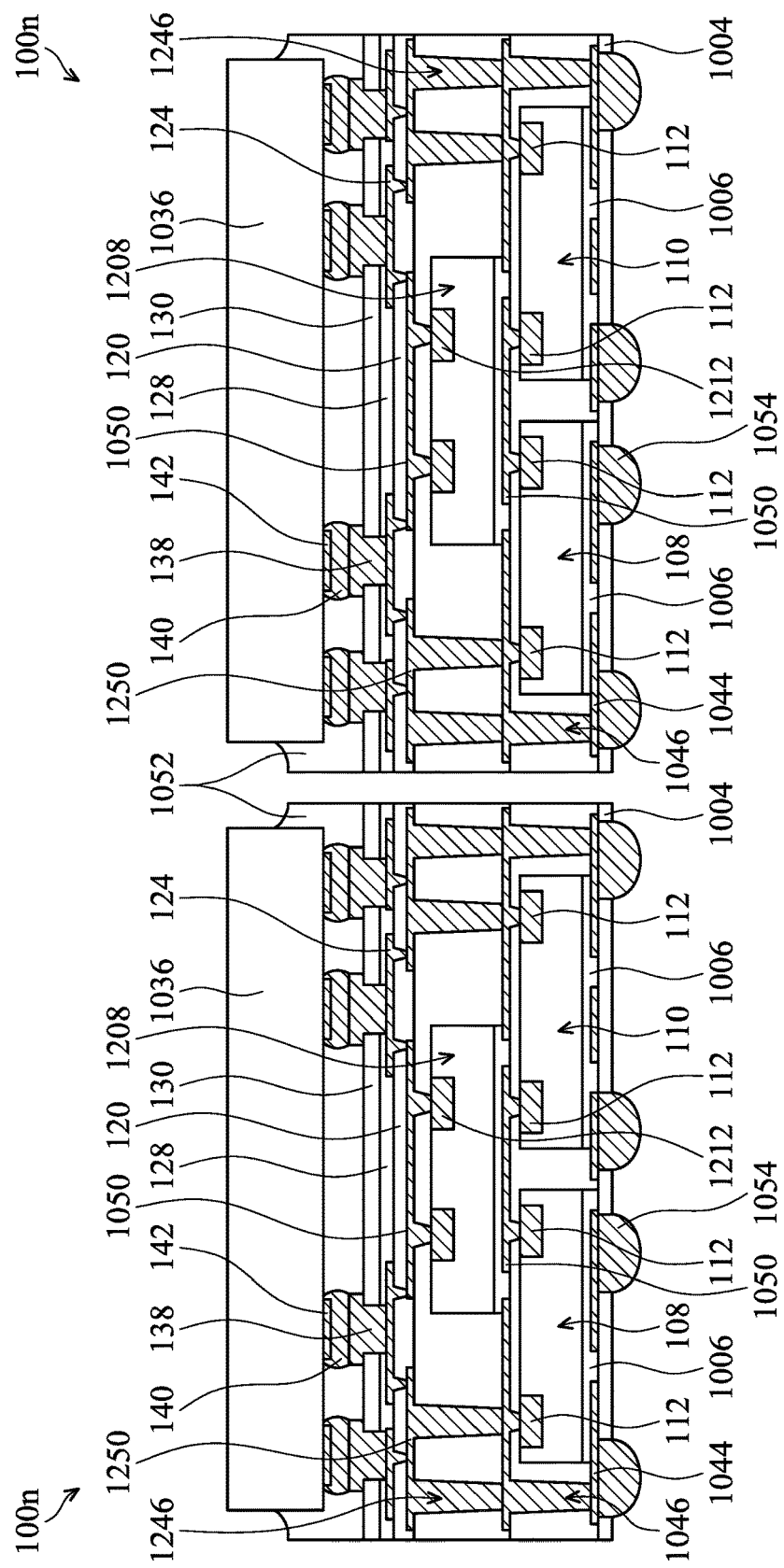

FIGS. 12A to 12C are cross-sectional representations of various stages of forming a chip package structure 100*n* in accordance with some embodiments. Some processes and materials used to form the chip package structure 100*n* are similar to, or the same as, those used to form the chip package structure 100*m* and are not repeated herein.

Processes similar to, or the same as, those shown in FIGS. 10A to 10D may be performed to form the structure shown in FIG. 12A in accordance with some embodiments. As shown in FIG. 12A, the chips 108 and 110 are disposed over the redistribution layer 1044, and the photosensitive layer 114 covers the chips 108 and 110. In addition, the redistribution layer 1050 is formed over the photosensitive layer 114, and microvias 1048 and conductive pillars 1046 are electrically connected to the conductive pads 112 in the chips 108 and 110 and the redistribution layer 1044 respectively.

Next, processes similar to, or the same as, those shown in FIGS. 5B to 5E may be performed to form the structure shown in FIG. 12B. More specifically, a chip 1208 is disposed to the photosensitive layer 114 through an adhesive layer 1206. In addition, the chip 1208 is also disposed over the redistribution layer 1050 and is electrically connected to the redistribution layer 1050 in accordance with some embodiments. A photosensitive layer 1214 is formed over the chip 1208 and over the redistribution layer 1050 to encapsulate the chip 1208.

Furthermore, conductive pillars 1246, microvias 1248, and redistribution layer 1250 are formed, as shown in FIG. 12B in accordance with some embodiments. The conductive pillars 1246 are formed through the photosensitive layer 1214 and are electrically connected to the redistribution layer 1050. The microvias 1248 are formed through the photosensitive layer 1214 and are electrically connected to conductive pads 1212 in the chip 1208. The redistribution layer 1250 is formed on the photosensitive layer 1214 and is connected with the conductive pillars 1246 and the microvias 1248.

Processes similar to, or the same as, those shown in FIGS. 10E to 10I may be performed to form the chip package structure 100*n*, as shown in FIG. 12C in accordance with some embodiments. More specifically, the dielectric layer 120, the redistribution layer 124, the adhesive layer 128, and the second protection layer 130 are formed, and the top package structure 1036 are bonded to the redistribution layer 124 through the UBMs 138, solder balls 140, and conductive pads 142. In addition, the material layer 1052 is formed to fill in the gaps between the elements.

After the material layer 1052 is formed, the carrier substrate 102 is removed, and the solder balls 1054 are formed through the first protection layer 1004 to electrically connect with the redistribution layer 1004. Furthermore, a sawing process is performed to form individual chip packages structure 100*n*, as shown in FIG. 12C in accordance with some embodiments.

Figure 13:
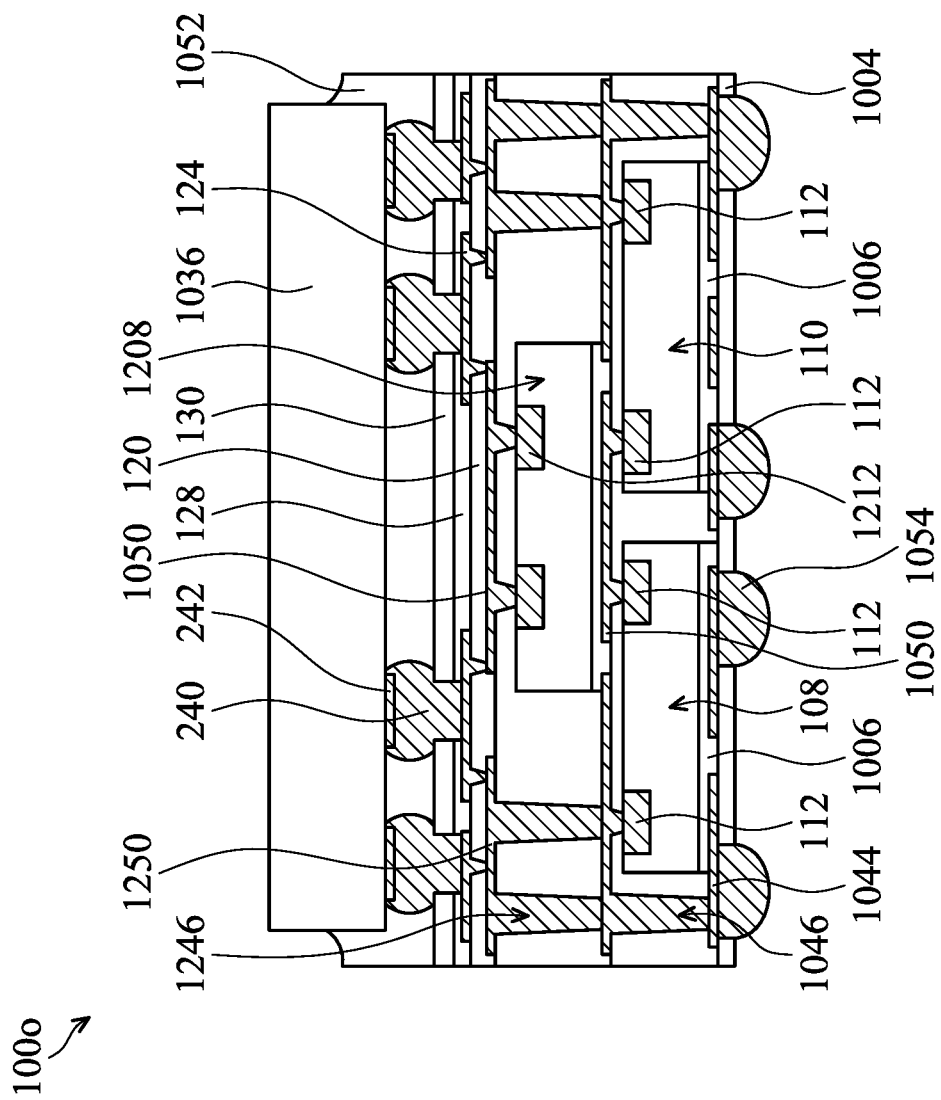
FIG. 13 is a cross-sectional representation of chip package structures in accordance with some embodiments.

FIG. 13 is a cross-sectional representation of a chip package structure 100*o* in accordance with some embodiments. The chip package structure 100*o* is similar to, or the same as, the chip package structure 100*n* described previously, except no UBMs are used. Other processes and materials used to form the chip package structure 100*o* are similar to, or the same as, those used to form the chip package structures 100*n* shown in FIGS. 12A to 12C and are not repeated herein.

Figure 14:
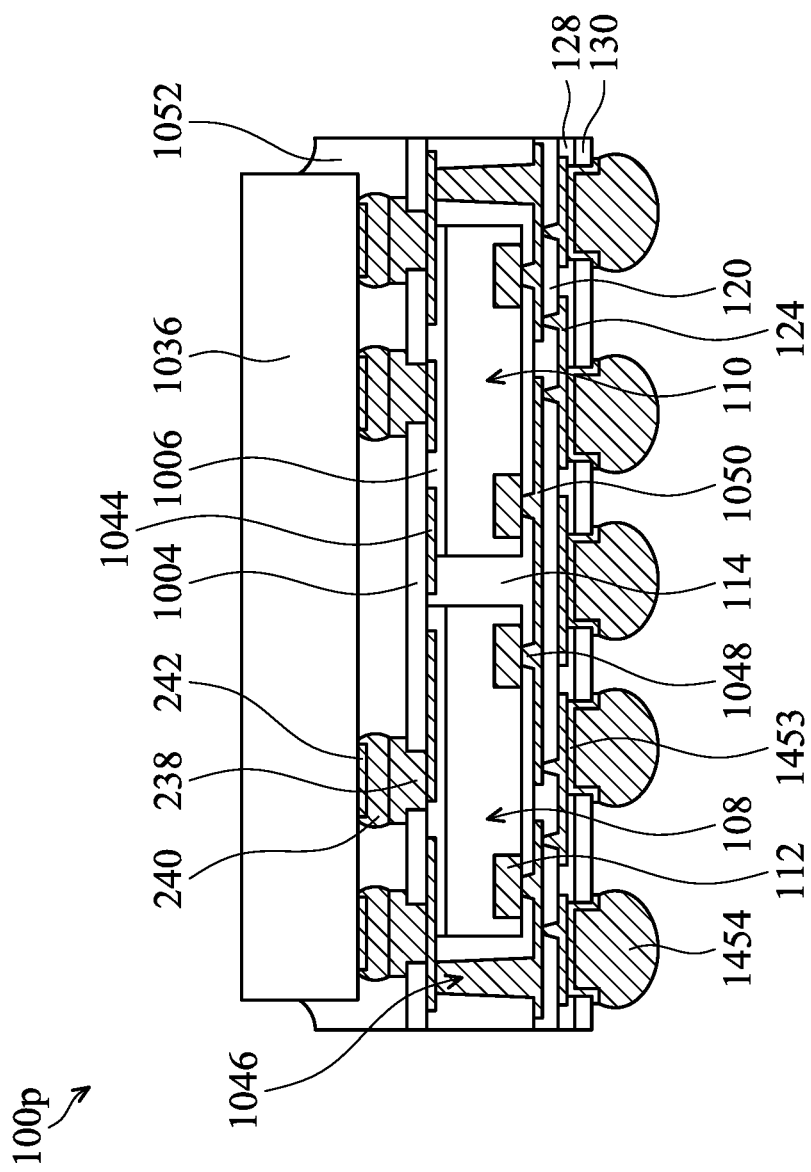
FIG. 14 is a cross-sectional representation of chip package structures in accordance with some embodiments.

FIG. 14 is a cross-sectional representation of a chip package structure 100*p* in accordance with some embodiments. The chip package structure 100*p* is similar to the chip package structure 100*l* described previously, except the top package 1036 is attached to the backside of the structure. Some processes and materials used to form the chip package structure 100*p* are similar to, or the same as, those used to form the chip package structures 100*l* and are not repeated herein.

Similar to the chip package 100*l*, the chip package structure 100*p* includes the redistribution layer 1044 formed over the first protection layer 1004 and the chips 108 and 110 disposed over the redistribution layer 1044 and over the first protection layer 1004 through the adhesive layer 1006, as shown in FIG. 14 in accordance with some embodiments. Afterwards, the photosensitive layer 114 is formed to cover the chips 108 and 110, and the microvias 1048, the redistribution layer 1050, the dielectric layer 120 and the redistribution layer 124, the adhesive layer 128, and the second protection layer 130 are formed, as shown in FIG. 14 in accordance with some embodiments.

Next, the top package structure 1036 is attached to the first protection layer 1004 through the UBMs 238, the solder balls 240, and conductive pads 242. The top package structure 1036 may be a flexible package structure. In some embodiments, the top package structure 1036 is bonded to the redistribution layer 1044 over the chips 108 and 110. In addition, the material layer 1052, such as an adhesive, is used to fill in the gaps between the elements described above. Furthermore, UBMs 1453 and solder balls 1454 are formed through the adhesive layer 128 and the second protection layer 130 to connect with the redistribution layer 124, as shown in FIG. 14 in accordance with some embodiments.

As described previously, since the chips 108 and 110 are encapsulated by the photosensitive layer 114 instead of a molding compound, the resulting chip packages structure 100*l* may be thinner and easier and cheaper to be formed.

Figure 15:
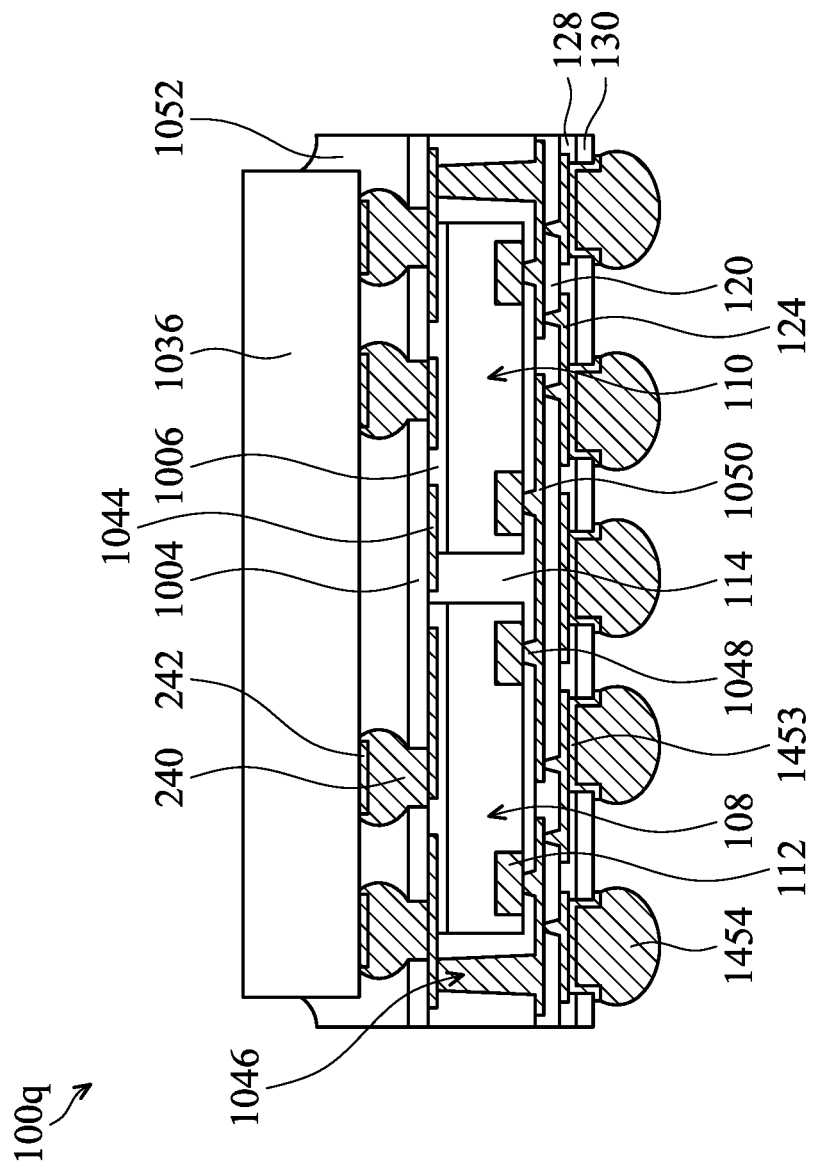
FIG. 15 is a cross-sectional representation of chip package structures in accordance with some embodiments.

FIG. 15 is a cross-sectional representation of a chip package structure 100*q* in accordance with some embodiments. The chip package structure 100*q* is similar to, or the same as, the chip package structure 100*p* described previously, except the UBMs 238 are not formed. Other processes and materials used to form the chip package structure 100*q* are similar to, or the same as, those used to form the chip package structures 100*p* described previously and are not repeated herein.

Figure 16:
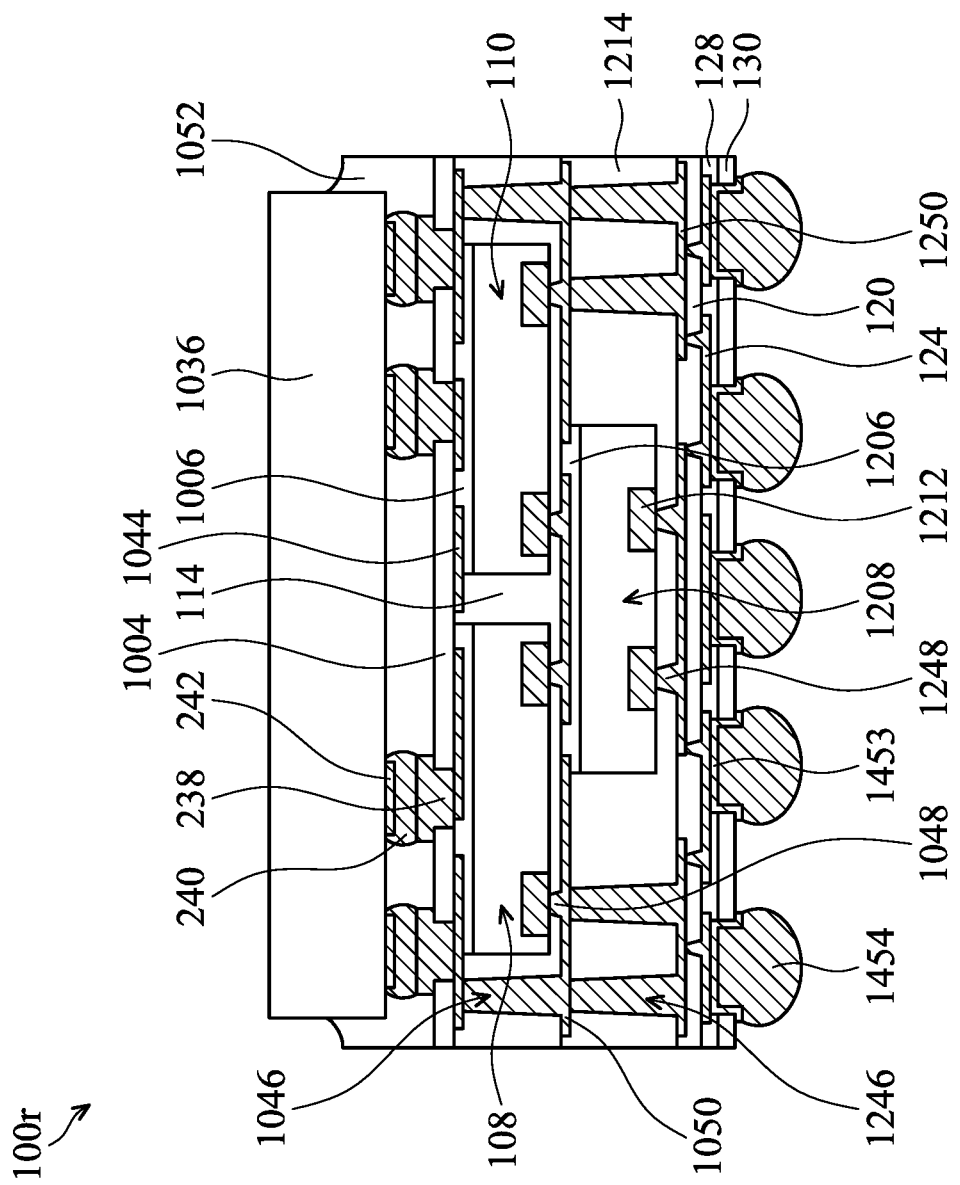
FIG. 16 is a cross-sectional representation of chip package structures in accordance with some embodiments.

FIG. 16 is a cross-sectional representation of a chip package structure 100*r* in accordance with some embodiments. The chip package structure 100*r* is similar to the chip package structure 100*n* described previously, except the top package 1036 is attached to the backside of the structure. Some processes and materials used to form the chip package structure 100*r* are similar to, or the same as, those used to form the chip package structures 100*n* and are not repeated herein.

Similar to the chip package 100*n*, the chip package structure 100*r* includes the chips 108 and 110 disposed over the redistribution layer 1044 over the first protection layer 1004, and the photosensitive layer 114 covers the chips 108 and 110. In addition, the redistribution layer 1050, the microvias 1048, the conductive pillars 1046 are formed. Next, the chip 1208 is disposed on the photosensitive layer 114 through the adhesive layer 1206, and the photosensitive layer 1214 is formed to encapsulate the chip 1208. Furthermore, the conductive pillars 1246, the microvias 1248, the redistribution layer 1250, the dielectric layer 120, the redistribution layer 124, the adhesive layer 128, and the second protection layer 130 are formed, as shown in FIG. 16 in accordance with some embodiments.

After the first protection layer 1004 and the second protection layer 130 are formed, the top package structure 1036 is attached to the first protection layer 1004 through the UBMs 238, the solder balls 240, and conductive pads 242. In addition, the material layer 1052 is used to fill in the gaps between the elements described above. Furthermore, UBMs 1453 and solder balls 1454 are formed through the adhesive layer 128 and the second protection layer 130 to connect with the redistribution layer 124, as shown in FIG. 16 in accordance with some embodiments.

As described previously, since the chips 108 and 110 are encapsulated by the photosensitive layer 114 instead of a molding compound, the resulting chip packages structure 100r may be thinner, and easier to make at a lower cost.

Figure 17:
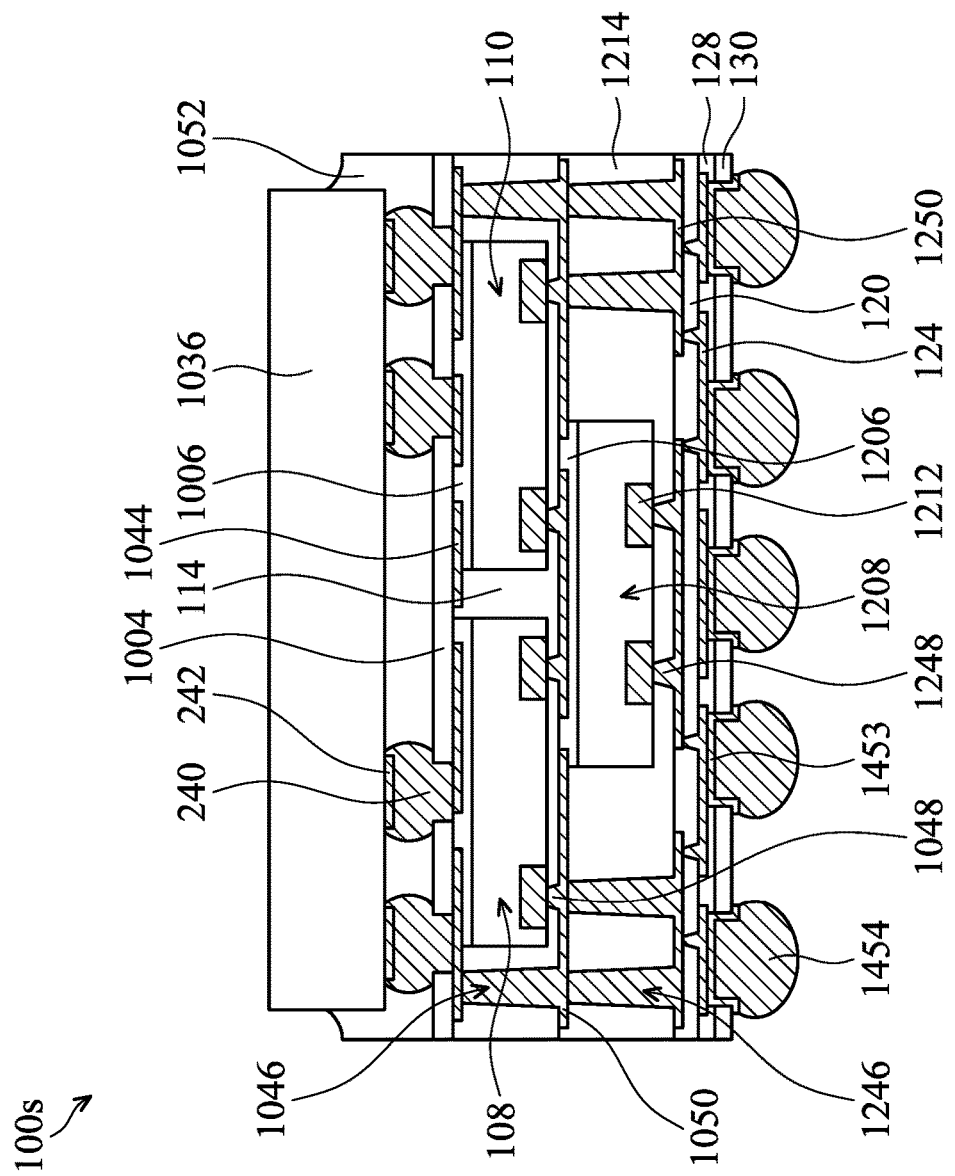
FIG. 17 is a cross-sectional representation of chip package structures in accordance with some embodiments.

FIG. 17 is a cross-sectional representation of a chip package structure 100s in accordance with some embodiments. The chip package structure 100s is similar to, or the same as, the chip package structure 100q described previously, except the UBMs 238 are not formed. Other processes and materials used to form the chip package structure 100s are similar to, or the same as, those used to form the chip package structures 100r described previously and are not repeated herein.

As described previously, in a chip package structure (e.g. the chip package structures 100a to 100o), a first protection layer (e.g. the first protection layer 104) and a second protection layer (the second protection layer 130) are formed at two sides of the chip package structure to protect the chips (e.g. the chips 108, 110, 508, etc.) disposed between them. In some embodiments, the first protection layer and the second protection layer are made of a material with a relatively large elongation rate, such as larger than 30%, so that the first protection layer and the second protection layer are flexible. In addition, the chips disposed in the chip package structure may be thin enough so it will not be broken when the chip package structure is used as a flexible device.

Moreover, the chips are encapsulated by a photosensitive layer (e.g. the photosensitive layers 114, 114e, 514, etc.) instead of a molding compound in accordance with some embodiments. The photosensitive layer may be easily patterned and conductive structures, such as a redistribution layer (e.g. the redistribution layer 118, 518, etc.) and/or a pillar (e.g. the conductive pillar 519, the composite pillar 625, etc.), can be directly formed through and formed over the redistribution layer. In some embodiments, the photosensitive layer is made of a photoresist material which does not include filler and has a relatively high flexibility. Accordingly, the flexibility of the resulting chip package structure may be improved.

In addition, the photosensitive layer is formed before the conductive structures are formed, and therefore the photosensitive layer does not need to be filled in some small spaces (while the molding compound is formed afterwards and therefore need to be filled in some small spaces between other elements). Therefore, the formations of the photosensitive layer and the conductive structures become easier.

In some embodiments, chips are encapsulated in different layers of photosensitive layers. For example, as shown in FIGS. 5A to 9 and 12A to 13, top chips (e.g. the chip 508) may be disposed over the photosensitive layer, in which bottom chips (e.g. the chips 108e and 110e) are encapsulated, such that a portion of the photosensitive layer is located between the top chips and the bottom chips. That is, the top chip is disposed over the photosensitive layer instead of directly disposed over another chip, and the photosensitive layer can be used as a buffer layer, so that the chip can be disposed over a relatively flat top surface. Accordingly, the chips used in the chip may be multi-functional chips with various heights.

Embodiments of chip package structures and methods for forming the same are provided. The chip package structure may include protection layers formed at two sides of the chip package structure and chips disposed between the protection layers. A photosensitive layer is used to encapsulate the chips in the chip package structure and can be easily patterned afterwards. In addition, the protection layers and the photosensitive layer may be made of flexible materials, so that the resulting chip package structure may be used in a flexible device.

In some embodiments, a chip package structure is provided. The chip package structure includes a first protection layer and a first chip disposed over the first protection layer. The chip package structure further includes a first photosensitive layer surrounding the first chip and covering the first chip and a redistribution layer formed over the first photosensitive layer.

In some embodiments, a chip package structure is provided. The chip package structure includes a first protection layer and a first chip disposed over the first protection layer. The chip package structure further includes a first layer encapsulating the first chip and a first redistribution layer formed over the first layer. The chip package structure further includes a second protection layer attached to the first redistribution layer through an adhesive layer. In addition, the first protection layer, the first layer, and the second protection layer are made of flexible materials In some embodiments, a method for forming a chip package structure is provided. The method for forming a chip package structure includes disposing a first chip over a first protection layer and forming a first photosensitive layer covering the first chip. The method further includes forming a redistribution layer over the first photosensitive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a chip package structure, comprising:
    forming a supporting structure over a first protection layer;
    disposing a first chip in a first opening of the supporting structure over the first protection layer;
    forming a first photosensitive layer covering a top surface of the first chip and a top surface of the supporting structure; and
    forming a redistribution layer over the first photosensitive layer,
    wherein the supporting structure is made of a photosensitive material different from a photosensitive material which the first photosensitive layer is made of.

2. The method for forming a chip package structure as claimed in claim 1, further comprising:
forming a second opening in the first photoresist layer by performing an exposure process and a development process; and
forming a conductive pillar in the second opening.

3. The method for forming a chip package structure as claimed in claim 1, further comprising:
forming a second opening in the first photoresist layer by performing an exposure process and a development process;
forming a conductive portion that substantially covering bottom portion and sidewalls of the second opening to form a hollow pillar structure that enables electrical connection to the first chip; and
filling the hollow pillar structure by a dielectric material to form a composite pillar.

4. The method for forming a chip package structure as claimed in claim 1, further comprising:
laminating an adhesive layer and a second protection layer over the distribution layer, wherein the adhesive layer is in direct contact with the second protection layer and the redistribution layer.

5. The method for forming a chip package structure as claimed in claim 4, further comprising:
forming a third opening through the adhesive layer and the second protection layer;
forming an anisotropic conductive paste in the third opening to connect with the redistribution layer;
disposing a printed circuit board on the anisotropic conductive paste; and
pressing the printed circuit board toward the redistribution layer, so that the printed circuit board is electrically connected with the redistribution layer through the anisotropic conductive paste.

6. The method for forming a chip package structure as claimed in claim 1, further comprising:
disposing a second chip over the first protection layer, wherein the second chip is covered by the first photosensitive layer;
disposing a third chip over the first photosensitive layer; and
forming a second photosensitive layer over the first photosensitive layer to cover a top surface and sidewalls of the third chip.

7. The method for forming a chip package structure as claimed in claim 6, wherein the first chip and the second chip have different heights, and portions of the first photosensitive layer formed over the first chip and the second chip have different thicknesses.

8. The method for forming a chip package structure as claimed in claim 5, wherein the printed circuit board is arranged with no projective overlap with the first chip.

9. The method for forming a chip package structure as claimed in claim 1, further comprising:
disposing a third chip over the first photosensitive layer, wherein the first chip and the third chip are separated by the first photosensitive layer.

10. The method for forming a chip package structure as claimed in claim 9, wherein the third chip overlaps with the first chip.

11. A method for forming a chip package structure, comprising:
forming a first protection layer over a substrate;
disposing a first chip and a second chip over the first protection layer, wherein the first chip and the second chip have different heights;
forming a first photosensitive layer covering the first chip and the second chip, wherein a thickness of a first portion of the first photosensitive layer over the first chip is different from a thickness of a second portion of the first photosensitive layer over the second chip, and the first photosensitive layer comprises a third portion between sidewalls of the first chip and the second chip;
forming an opening in the first portion of first photosensitive layer;
disposing a third chip over the first portion, the second portion and the third portion of the first photosensitive layer; and
forming a conductive structure in the opening in the first portion of the first photosensitive layer and over a top surface of the first photosensitive layer.

12. The method for forming a chip package structure as claimed in claim 11, further comprising:
forming a dielectric layer over the conductive structure and the first photosensitive layer.

13. The method for forming a chip package structure as claimed in claim 11, wherein the third chip is separated from the first chip and the second chip by the first photosensitive layer.

14. The method for forming a chip package structure as claimed in claim 11, further comprising:
a supporting structure formed over the first protection layer before the first photosensitive layer is formed.

15. A method for forming a chip package structure, comprising:
disposing a first chip and a second chip over a substrate;
forming a first photosensitive layer covering the first chip and the second chip;
exposing and developing a portion of the first photosensitive layer to form a first opening in the first photosensitive layer;
disposing a third chip over the first photosensitive layer, wherein the third chip overlaps with the first chip and the second chip; and
forming a second photosensitive layer covering the third chip and the first photosensitive layer,
wherein the first photosensitive layer covers a sidewall of the first chip and continuously extends onto a top surface of the first chip to separate the top surface of the first chip from a bottom surface of the third chip.

16. The method for forming a chip package structure as claimed in claim 15, further comprising:
exposing and developing the second photosensitive layer to form a second opening; and
forming a conductive structure in the second opening.

17. The method for forming a chip package structure as claimed in claim 15, further comprising:
forming a supporting structure having a third opening over the substrate before the first chip and the second chip are disposed,
wherein the first chip and the second chip are disposed in the third opening of the supporting structure.

18. The method for forming a chip package structure as claimed in claim 17, wherein the supporting structure is made of a photosensitive material which is different from that which the first photosensitive layer is made of.

19. The method for forming a chip package structure as claimed in claim 15, further comprising:
forming a redistribution layer over the first photosensitive layer so that the third chip is disposed over the redistribution layer.

20. The method for forming a chip package structure as claimed in claim 15, wherein the first photosensitive layer is in direct contact with the sidewall and the top surface of the first chip.

* * * * *